United States Patent
Sharon et al.

(10) Patent No.: US 11,301,321 B2
(45) Date of Patent: Apr. 12, 2022

(54) DATA SHAPING FOR INTEGRATED MEMORY ASSEMBLY

(71) Applicant: WESTERN DIGITAL TECHNOLOGIES, INC., San Jose, CA (US)

(72) Inventors: Eran Sharon, Rishon Lezion (IL); Idan Alrod, Herzliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 84 days.

(21) Appl. No.: 16/886,679

(22) Filed: May 28, 2020

(65) Prior Publication Data
US 2021/0373993 A1    Dec. 2, 2021

(51) Int. Cl.
*G06F 11/10* (2006.01)
*G11C 16/04* (2006.01)
*G11C 16/26* (2006.01)
*G11C 11/56* (2006.01)
*G11C 16/10* (2006.01)

(52) U.S. Cl.
CPC ...... *G06F 11/1068* (2013.01); *G11C 11/5628* (2013.01); *G11C 11/5671* (2013.01); *G11C 16/0483* (2013.01); *G11C 16/10* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 5,838,832 A | 11/1998 | Barnsley | |
| 7,226,026 B2 | 9/2007 | Gongwer | |
| 7,409,473 B2 | 8/2008 | Conley | |
| 7,446,575 B2 | 12/2008 | Shalvi | |
| 7,849,381 B2 | 12/2010 | Tomlin | |
| 8,111,548 B2 | 2/2012 | Mokhlesi | |
| 8,144,512 B2 | 3/2012 | Huang | |
| 8,301,912 B2 | 10/2012 | Lin | |
| 8,341,501 B2 | 12/2012 | Franceschini | |
| 8,756,365 B2 | 6/2014 | Sharon | |
| 8,799,559 B2 | 8/2014 | Sharon | |
| 8,874,994 B2* | 10/2014 | Sharon | G11C 11/5628 714/766 |
| 9,142,261 B2* | 9/2015 | D'Abreu | G06F 11/1068 |

(Continued)

OTHER PUBLICATIONS

Schmier, et al., "Non-Volatile Storage System With Reduced Program Transfers," U.S. Appl. No. 16/223,716, filed Dec. 18, 2018.

*Primary Examiner* — Guerrier Merant
(74) *Attorney, Agent, or Firm* — Vierra Magen Marcus LLP

(57) ABSTRACT

A non-volatile memory system comprises an integrated memory assembly in communication with a memory controller. The integrated memory assembly comprises a memory die bonded to a control die with bond pads. The control die includes one or more control circuits for controlling the operation of the memory die. The one or more control circuits are configured to receive data to be programmed into the memory die, select a number of parity bits, encode the data to add error correction information and form a codeword that includes the number of parity bits, shape the codeword, and program the shaped codeword into the memory die.

23 Claims, 33 Drawing Sheets

(56) References Cited

U.S. PATENT DOCUMENTS

| | | | |
|---|---|---|---|
| 9,165,649 B2 | 10/2015 | Sharon | |
| 9,575,683 B2 | 2/2017 | Achtenberg | |
| 10,387,303 B2 | 8/2019 | Mehra | |
| 10,459,644 B2 | 10/2019 | Mehra | |
| 10,565,123 B2 | 2/2020 | Song | |
| 2013/0024746 A1* | 1/2013 | Sharon | G06F 11/1044 714/766 |
| 2013/0103891 A1 | 4/2013 | Sharon | |
| 2013/0297986 A1* | 11/2013 | Cohen | G11C 29/52 714/763 |
| 2014/0136761 A1 | 5/2014 | Li | |
| 2014/0157086 A1* | 6/2014 | Sharon | G06F 12/00 714/773 |
| 2014/0218996 A1* | 8/2014 | D'Abreu | G11C 5/02 365/51 |
| 2017/0148510 A1 | 5/2017 | Bazarsky | |
| 2017/0269839 A1* | 9/2017 | Alrod | G06F 3/0679 |
| 2018/0059944 A1* | 3/2018 | Helmick | G11C 29/52 |
| 2019/0179568 A1 | 6/2019 | Hsu | |
| 2019/0341375 A1 | 11/2019 | Hirano | |

* cited by examiner

Sparse parity check matrix H

N=33 variable nodes

|  | v1 | v2 | v3 | v4 | v5 | v6 | v7 | v8 | v9 | v10 | v13 | v12 | v13 |
|---|---|---|---|---|---|---|---|---|---|---|---|---|---|
| cn1 |  | 1 |  | 1 |  |  |  |  |  |  | 1 |  | 1 |
| cn2 | 1 |  |  |  |  | 1 |  |  |  |  | 1 |  |  |
| cn3 |  |  | 1 |  | 1 | 1 |  |  | 1 | 1 |  |  |  |
| cn4 |  | 1 |  |  |  |  |  | 1 |  | 1 |  |  |  |
| cn5 |  |  | 1 |  |  | 1 |  |  |  |  |  | 1 |  |
| cn6 | 1 |  |  | 1 | 1 |  | 1 |  |  |  |  |  |  |
| cn7 |  | 1 |  |  |  |  | 1 |  | 1 |  |  |  | 1 |
| cn8 |  |  | 1 |  |  | 1 |  |  |  | 1 | 1 |  |  |
| cn9 | 1 |  | 1 | 1 |  |  |  |  |  |  |  |  | 1 |
| cn10 |  |  |  |  |  |  | 1 | 1 | 1 | 1 |  |  |  |

M=10 check nodes

Sparse bipartite graph, 392

| | | | |
|---|---|---|---|
| $S_1 = 1$ | $TS_1 = 111$ | $size(SS_1) = 1$ | $size(TS_1) = 3$ |
| $SS_2 = 011$ | $TS_2 = 110$ | $size(SS_2) = 3$ | $size(TS_2) = 3$ |
| $SS_3 = 010$ | $TS_3 = 101$ | $size(SS_3) = 3$ | $size(TS_3) = 3$ |
| $SS_4 = 001$ | $TS_4 = 011$ | $size(SS_4) = 3$ | $size(TS_4) = 3$ |
| $SS_5 = 00011$ | $TS_5 = 100$ | $size(SS_5) = 5$ | $size(TS_5) = 3$ |
| $SS_6 = 00010$ | $TS_6 = 010$ | $size(SS_6) = 5$ | $size(TS_6) = 3$ |
| $SS_7 = 00001$ | $TS_7 = 001$ | $size(SS_7) = 5$ | $size(TS_7) = 3$ |
| $SS_8 = 00000$ | $TS_8 = 000$ | $size(SS_8) = 5$ | $size(TS_8) = 3$ |

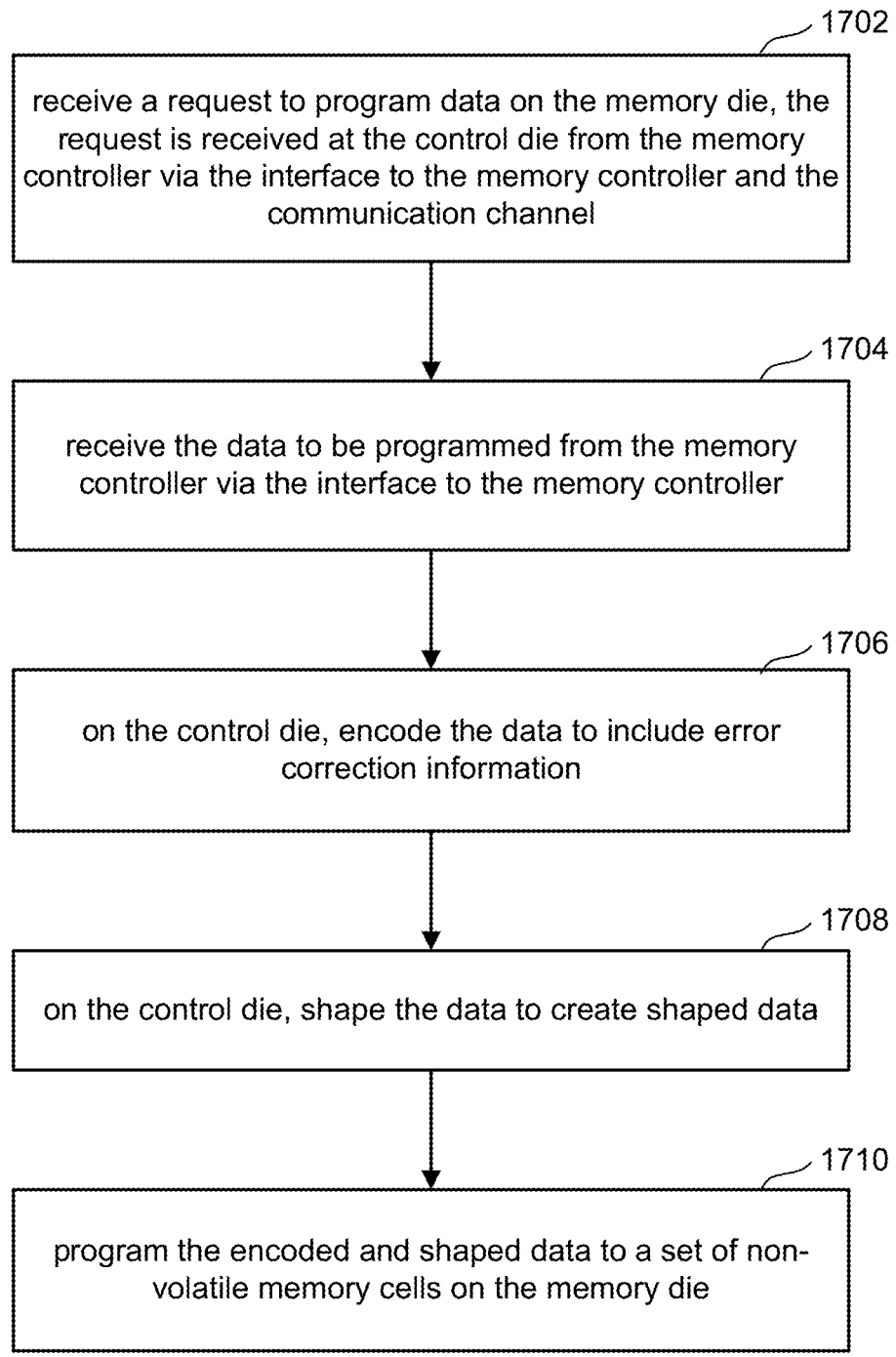

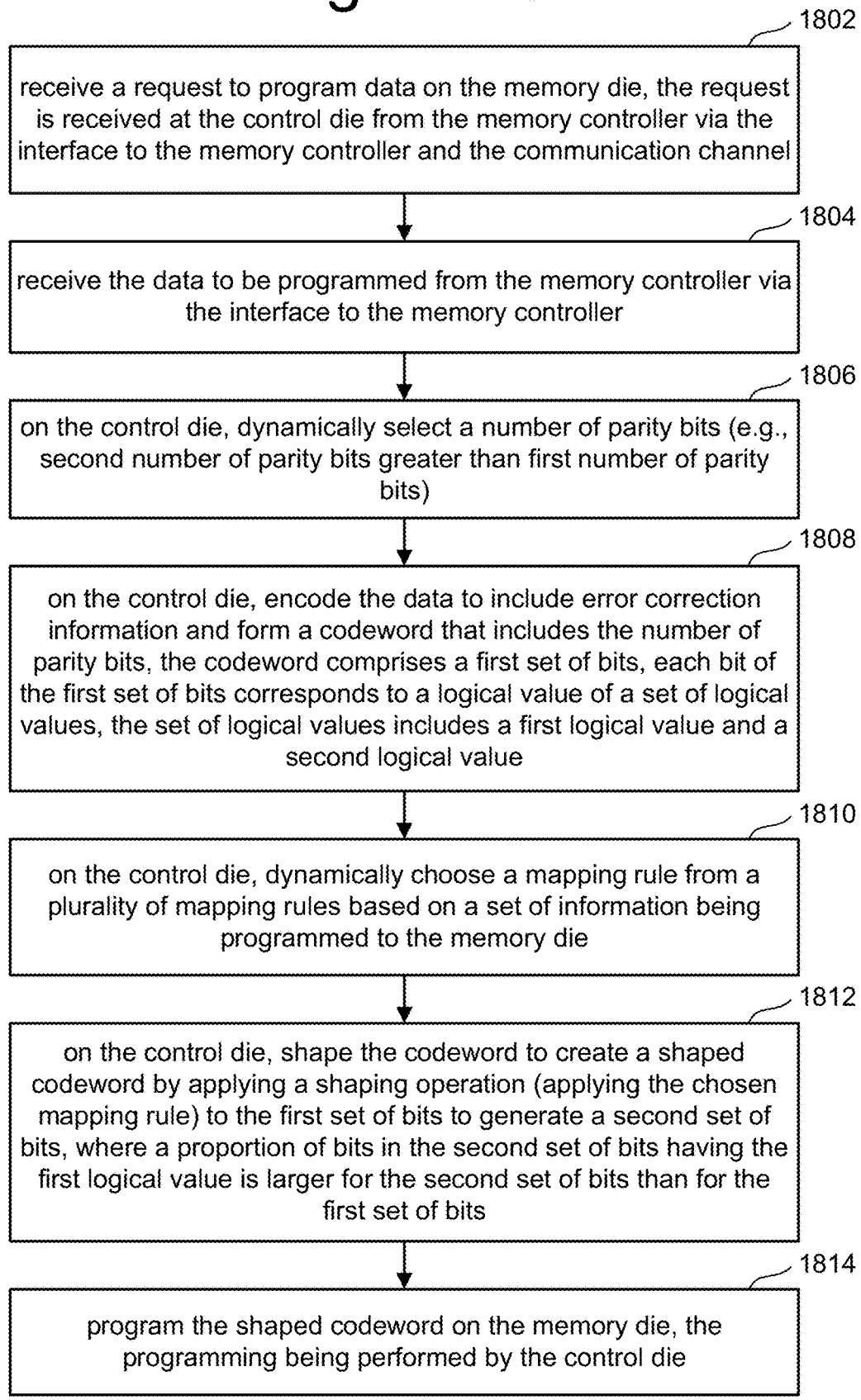

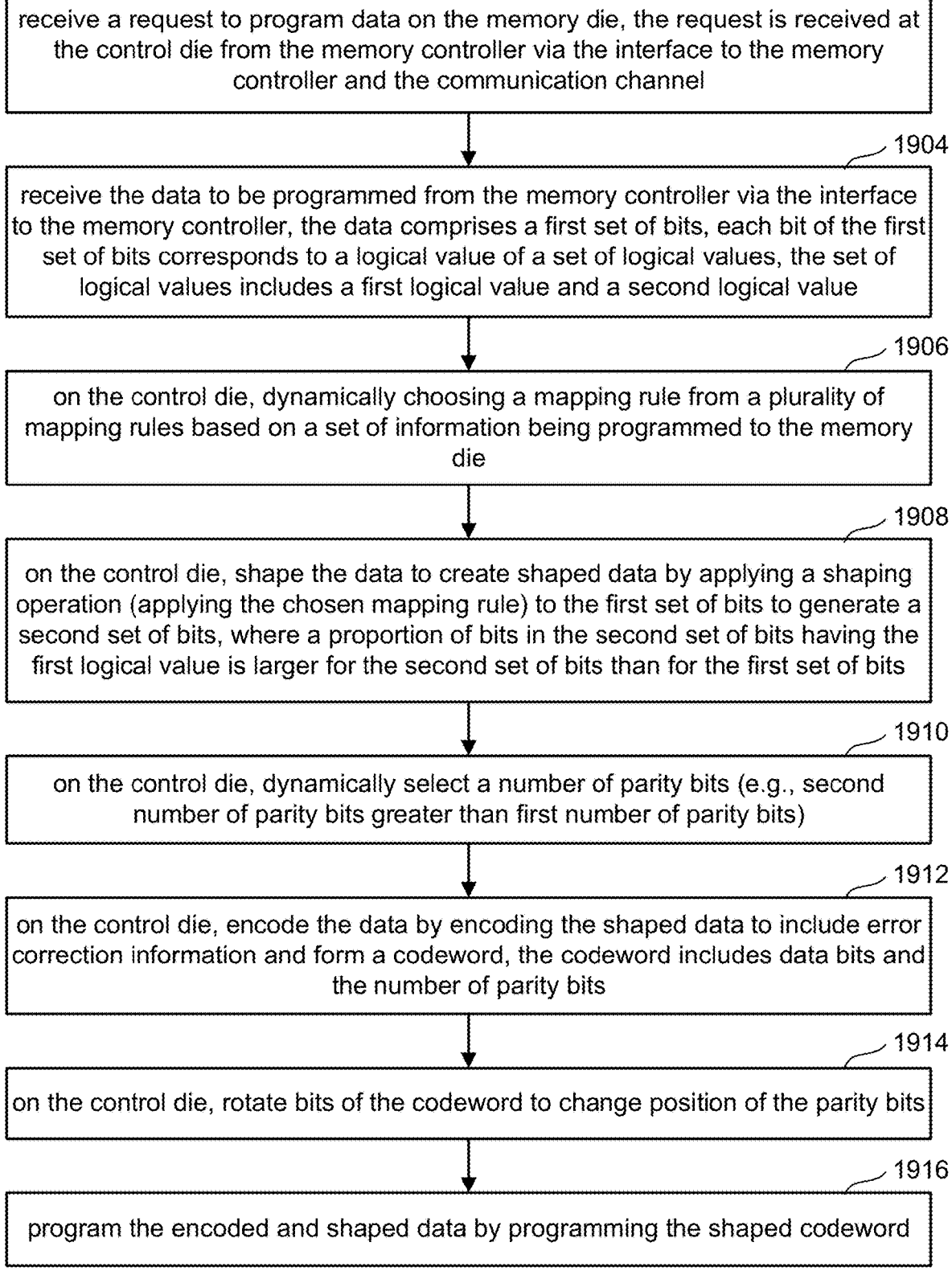

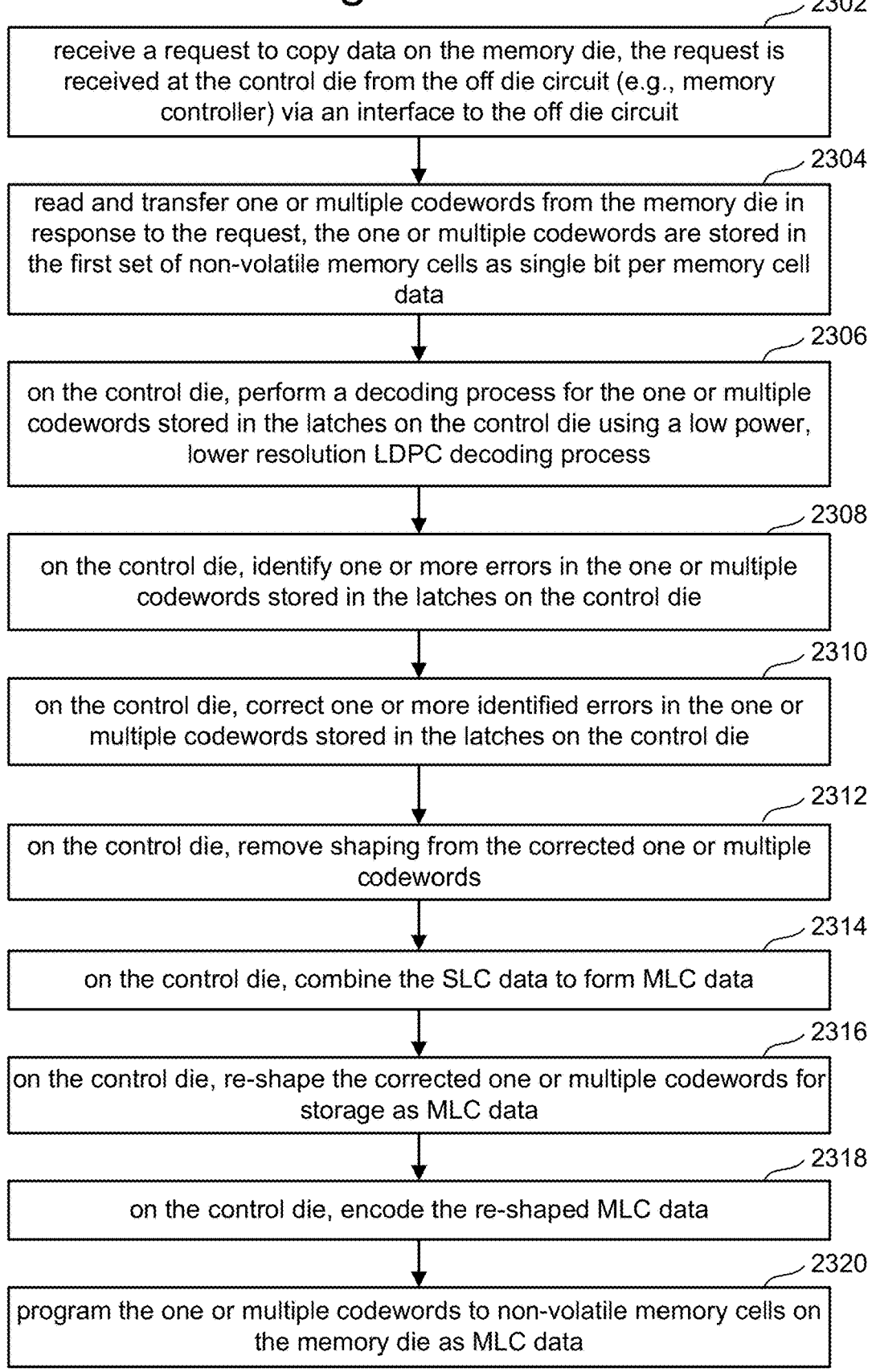

DATA SHAPING FOR INTEGRATED MEMORY ASSEMBLY

BACKGROUND

The strong growth in demand for portable consumer electronic devices is driving the need for high-capacity storage devices. Non-volatile semiconductor memory devices, such as flash memory, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones, laptops and servers.

Non-volatile semiconductor memory devices typically include a memory controller connected to one or more memory die by a communication path (e.g., bus). Each memory die typically includes an array of memory cells, wherein the memory cell is the basic unit of storage. In some embodiments, a memory cell stores one bit of data. In other embodiments, a memory cell stores multiple bits of data. In many embodiments, memory cells store data by adjusting the threshold voltage of the memory cell.

Memory controllers typically add error correction information to data being stored in the memory cells. The error correction information is appended to the user data to form a codeword and the memory controller will transmit the codeword to the memory die for programming on the memory die. Later, when reading back the data, if there is an error, the memory controller can use the error correction information to recover the original user data. The greater the amount of error correction information added to the user data, the greater the ability of the memory controller to recover more errors. However, the greater the amount of error correction information added to the user data, the larger the codewords. Large codewords will take longer to transmit on the communication path to the memory die, thereby slowing down the programming process and increasing power consumption.

An important aspect of memory devices is endurance; that is, the number of times a memory cell or cells may be written to before they fail. Thus, reducing the number of times a memory cell is programmed to either "0" or "1" can reduce wear. To mitigate unnecessary wearing of the memory, the data may be changed in a predictable and repeatable manner prior to storage to generate shaped data that causes less memory wear. This process is referred to as data shaping. For purposes of this document, data shaping is encoding or mapping of data from input values to output values such that the output values have a desired property. Data shaping may be beneficial to endurance, for example, because shaping data can result in a non-uniform distribution of "1" values and "0" values in the resulting shaped data. This non-uniform distribution may reduce wear by reducing the number of write operations to a highest state and/or to a lowest state of memory cells.

Adding more error correction information to user data may increase the efficiency of the data shaping. However, as noted above, increasing the amount of error correction information added to user data will slow down the programming process and increase power consumption.

DESCRIPTION OF THE DRAWINGS

FIG. 25 is a flowchart describing one embodiment of a process for performing a programming process.

FIG. 26 is a flowchart describing one embodiment of a process for performing a programming process.

FIG. 27 is a flowchart describing one embodiment of a process for performing a programming process.

FIG. 35 is a flowchart describing one embodiment of a process for performing an on-chip-copy process.

DETAILED DESCRIPTION

Figure 1:
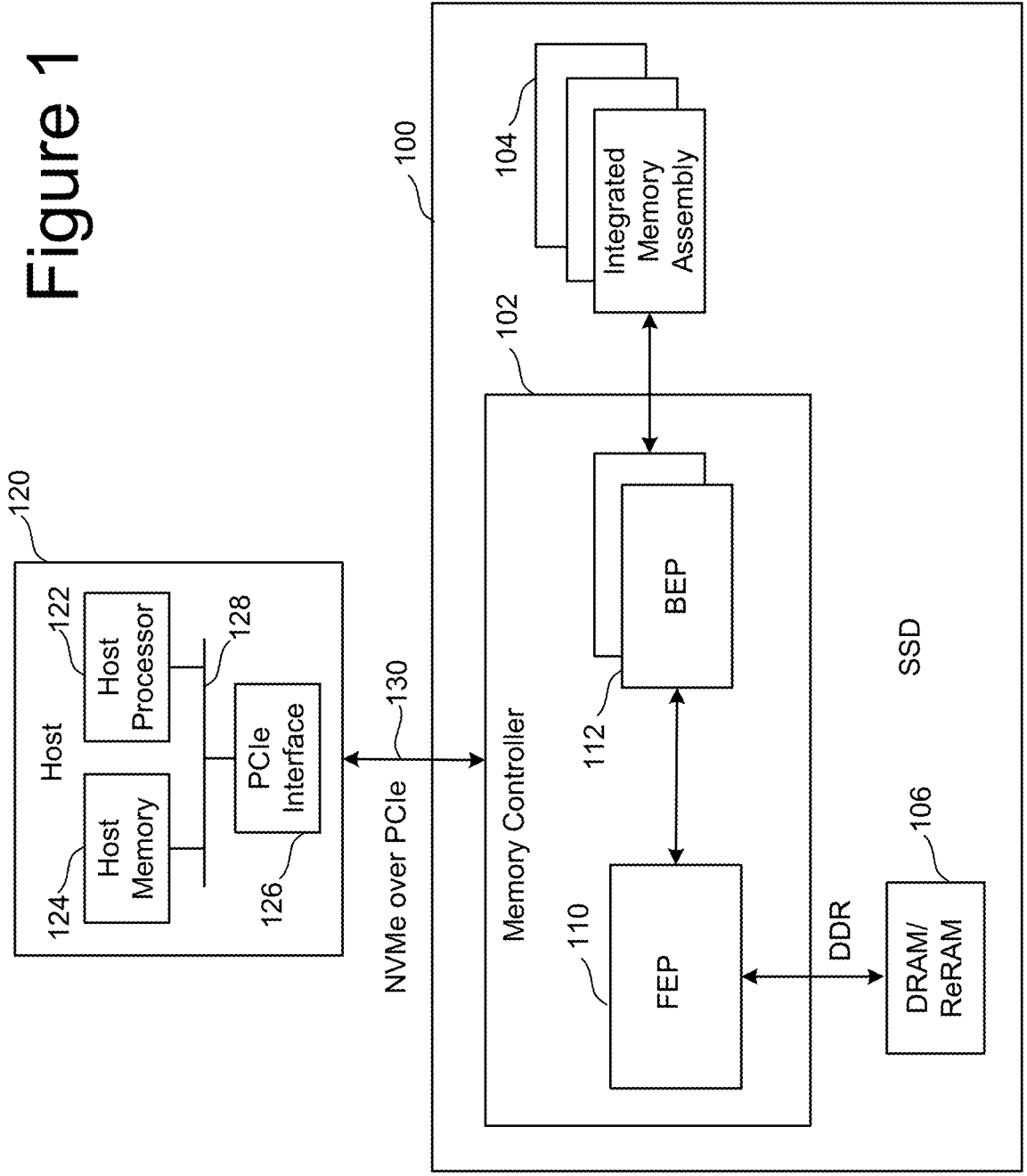
FIG. 1 is a block diagram of one embodiment of a memory system connected to a host.

A data shaping process is disclosed that includes adding the error correction information and performing the data shaping at the memory die rather than at the memory controller. Because the shaped data (including the user data and the error correction information) is formed at the memory die, there is no need to transfer the shaped data from the memory controller to the memory die. As such, the system can use more error correction information, which increases the effectiveness of the shaping to mitigate wear, without suffering from the decrease in programming performance or the increase in power consumption.

The disclosed data shaping process is implemented on a memory device that includes an integrated memory assembly having one or more control die and one or more memory die. In some embodiments, the control die and the memory die are die bonded together. The memory die includes non-volatile memory cells. The control die controls various operations on the memory die, such as read, write, erase, and various maintenance operations. In one embodiment, the control die has the ability to encode data bits to form codewords that contain the data bits and parity bits (e.g., for error correction). The control die then stores the codewords in the non-volatile memory cells. In one embodiment, the control die has the ability to decode the codewords that were stored in the non-volatile memory cells. In some embodiments, the integrated memory assembly has multiple control dies and multiple memory dies such that each control die controls operation of one of the memory dies. For purposes of this document, the phrase "at the memory die" refers to being in the integrated memory assembly that includes the memory die.

One embodiment includes a memory system having a memory controller in communication with the integrated memory assembly. The memory controller may comprise an Application Specific Integrated Circuit (ASIC), which is separate from the integrated memory assembly. The memory controller may send data to the control die, which the control die may encode into a codeword and store in the memory die. Similarly, the memory controller may send read requests to the control die, wherein the control die reads the codewords from the memory die, decodes the codewords, and returns the requested data to the memory controller. For purposes of this document, encode or encoding can include adding parity bits without changing data bits, adding parity bits with changing data bits, and adding parity by changing data bits.

In one embodiment, codewords are stored in the memory die. Each codeword may contain data bits and parity bits. In one embodiment, the codewords are decoded at the control die based on the parity bits. For example, a parity bit decoder may be used to decode the codewords. In some embodiments, the memory controller is able to decode codewords using the parity bits in the event that a control die failed to decode the codeword. In some embodiments, the memory controller uses a different technique to decode the codewords than the control die. For example, the memory controller may use a soft bit decoder, whereas the control die may each use a hard bit decoder.

In one embodiment, if the control die successfully decodes a codeword, the control die sends the data bits but not the parity bits to the memory controller. The number of parity bits per data bits may vary depending on the coding scheme. However, as one example, the parity bits may be about ten percent of the codeword. By not sending the parity bits to the memory controller, substantial bandwidth is saved on the communication pathway between the memory controller and the control die. Also, substantial power may be saved. For example, the interface between the control die and the memory controller could be a high speed interface.

In some embodiments, the control die and the memory die are bonded together with many bond pads that permit communication between the control die and the memory die. In one embodiment, the control die is able to access data from the memory die through the bond pads. In one embodiment, each data bit and each parity bit of a codeword is read via a different bond pad. This, in effect, provides an interface that is much wider than a data bus between the integrated memory assembly and the memory controller. Therefore, transferring the codewords from the memory die to the control die is very efficient. A net effect is that having decoding on the control die can be more efficient use of communication bandwidth than decoding on the memory controller.

In one embodiment, if the control die is not successful at decoding a codeword, then the control die sends the codeword to the memory controller. The memory controller also is able to decode the codewords. The memory controller may thus decode codewords that the control die was unable to decode. In one embodiment, the memory controller is able to decode codewords that have a higher bit error rate (BER) than the control die is able to decode. In other words, the control die and the memory controller may use different techniques to decode the codewords. In one embodiment, a technique used by the control die may use less power than a technique used by the memory controller. Hence, decoding on the control die may consume less power than decoding on the memory controller.

Codewords may be decoded according to variety of techniques. Some techniques may have a relatively high throughput and low power consumption but may provide relatively low error correction capability, while other techniques may provide relatively high error correction capability but may have lower throughput and increased power consumption. In one embodiment, the control die uses a relatively high throughput and low power consumption technique, which may provide relatively low error correction capability. In one embodiment, the memory controller uses one or more relatively low throughput and higher power consumption techniques, which may provide relatively high error correction capability.

In one embodiment, the control die is able to make fast decisions based on an estimated BER of a codeword. In one embodiment, the control die calculates a syndrome weight of a codeword. The control die may estimate a BER based on the syndrome weight. The control die may make a variety of decoding decisions based on the estimated BER. For example, the control die may change voltage levels that are used to sense the memory cells based on the estimated BER. Significantly, the control die can make such decisions without the need to transfer data to the memory controller. Hence, considerable bandwidth and power may be saved.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements such a memory cells. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuitry on the control die has transistors that are a different size (e.g., smaller) than memory cell transistors on the memory die. The different (e.g., smaller) size of the transistors on the control die may improve performance of the control circuitry on the control die. For example, smaller transistors may use less power than larger transistors. Also, using smaller transistors allows one embodiment of a control die to have more transistors for control circuitry on the control die.

As mentioned above, a data shaping process is disclosed that includes adding error correction information (e.g., parity bits) and performing the data shaping at the integrated memory assembly rather than at the memory controller. This technology takes advantage of having the control die at the memory die (both are part of the integrated memory assembly) to encode more parity bits and more efficiently shape the data. Thus, one embodiment of the disclosed technology includes the control die configured to receive a request to program data from the memory controller (or other off die circuit), encode the data to include error correction information, shape the data to create shaped data, and program the encoded and shaped data to a set of non-volatile memory cells on the memory die. More details are provided below.

FIGS. 1-5 describe one example of a memory system that can be used to implement the technology disclosed herein for shaping data. FIG. 1 is a block diagram of one embodiment of a memory system 100 connected to a host 120. Memory system (e.g., non-volatile memory system) 100 can implement the technology disclosed herein. Many different types of memory systems can be used with the technology disclosed herein. One example memory system is a solid state drive ("SSD"); however, other types of memory systems can also be used including removable memory cards and USB memory devices. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. Ion one embodiment, the ASICs for each of the BEP circuits 112 and the FEP circuit 110 are implemented on the same semiconductor such that memory controller 102 is manufactured as a System on a Chip ("SoC"). FEP 110 and BEP 112 both include their own processors. In one embodiment, FEP110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, there are a plurality of integrated memory assemblies 104. In an embodiment, each integrated memory assembly 104 includes one or more memory die and one or more control die. Each memory die may include one or more memory structures. A control die may control operations on a memory die. For example, a control die may control and perform read, write, and erase operations on a memory die. In one embodiment, memory controller 102 communicates with a control die in order to instruct the control die to perform read, write, or erase operations on one or more non-volatile memory die or one or more memory structures. In one embodiment, each memory die in the integrated memory assembly 104 utilizes NAND flash memory (including two dimensional NAND flash memory and/or three dimensional NAND flash memory). In other embodiments, the integrated memory assembly 104 can include other types of memory; for example, PCM memory and MRAM.

Memory controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
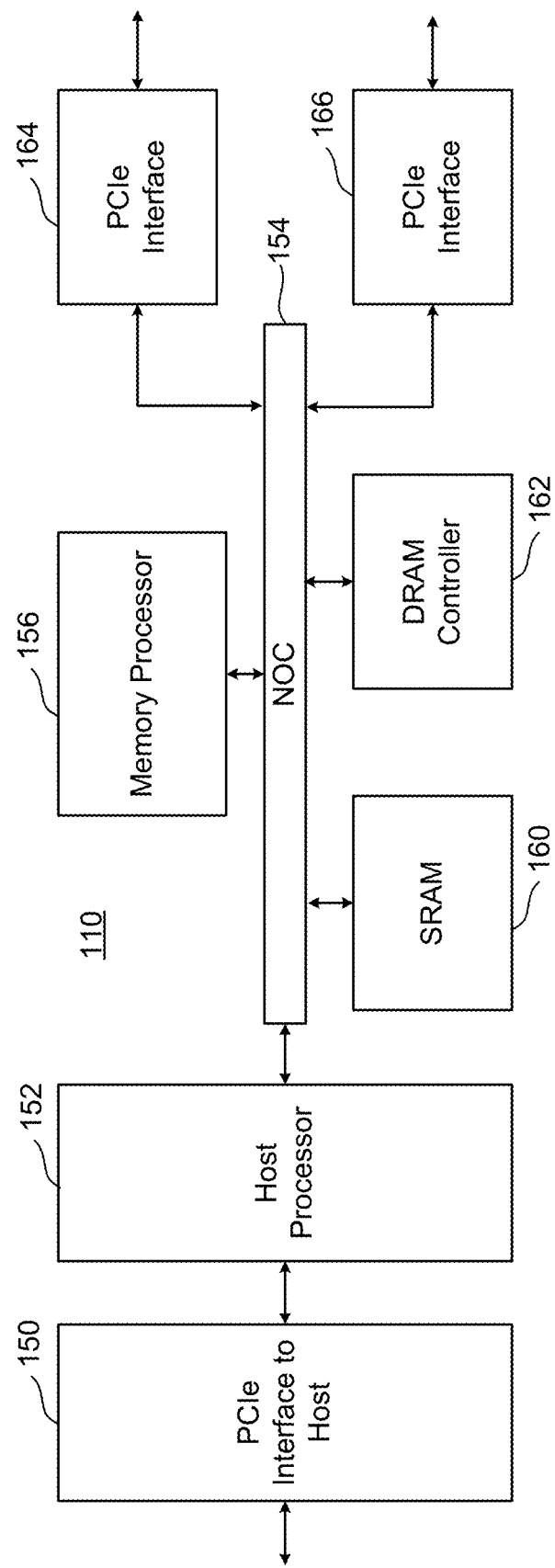
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
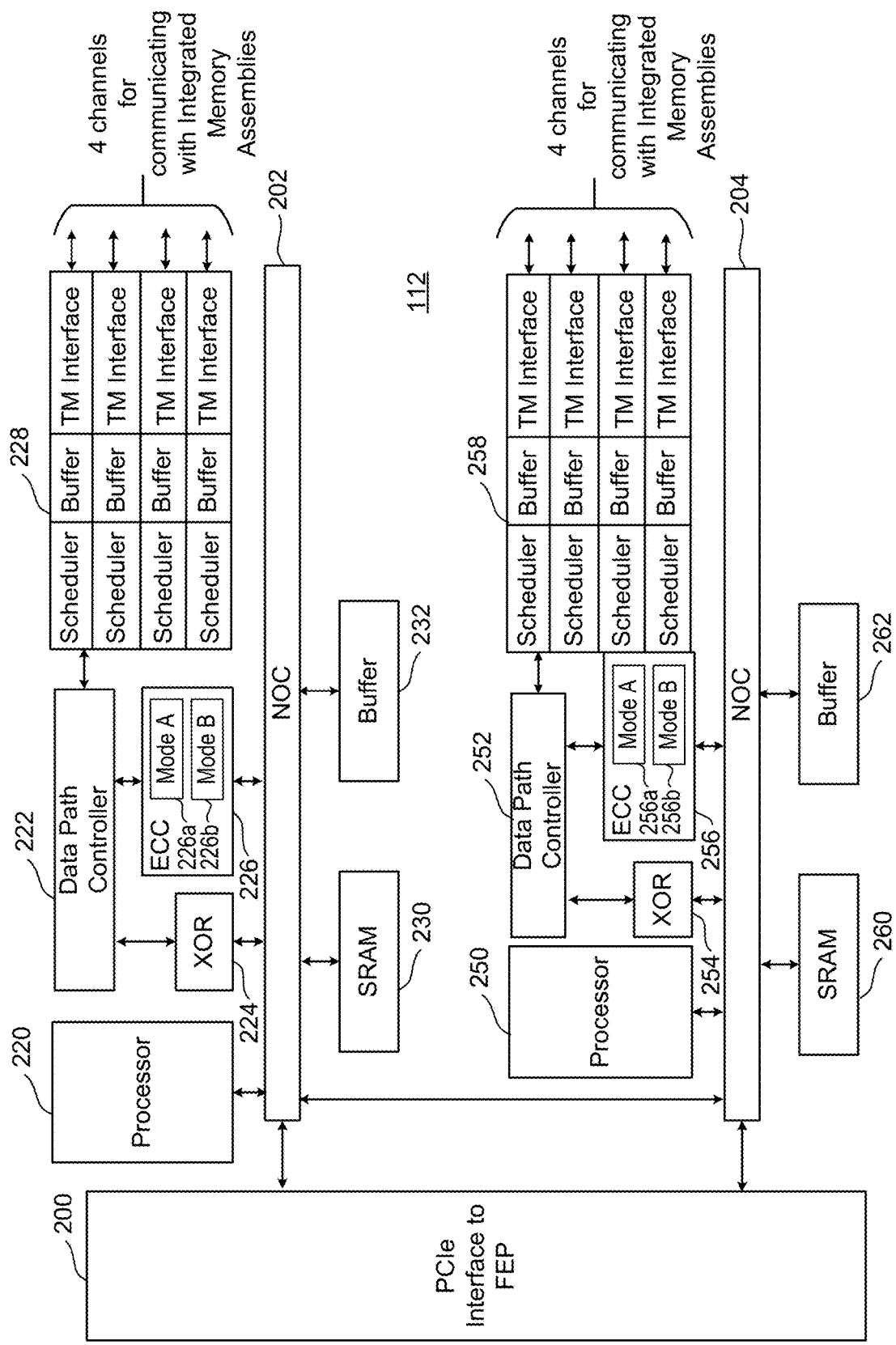
FIG. 3 is a block diagram of one embodiment of a Back End Processor Circuit.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256). The ECC engines 226/256 are used to perform error correction, as known in the art. Herein, the ECC engines 226/256 may be referred to as controller ECC engines.

The ECC engines 226/256 may encode data bytes received from the host, and may decode and error correct the data bytes read from the control die 304. In some embodiments, the ECC engines 226/256 calculate parity bits for each unit of data (e.g., page) that is being stored at one time. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

In some embodiments, memory controller 102 does not send the entire codeword to an integrated memory assembly 104. Instead, memory controller 102 sends only the data bits, with a control die on the integrated memory assembly 104 generating the parity bits. Optionally, memory controller 102 could send the entire codeword. In some cases, a control die of the integrated memory assembly 104 does not send an entire codeword to memory controller 102. Instead, the control die decodes the codeword, and sends back only the data bits to memory controller 102. However, in some cases, the control die may be unable to successfully decode a codeword. In this case, the control die may send the entire codeword to memory controller 102, which uses ECC engines 226/256 to decode the codeword.

In some embodiments, the ECC engines have different modes, such as ECC mode A 226a/256a and ECC mode B 226b/256b. The two modes may differ in their resolution. In general, a higher resolution decoder is able to correct a higher number of bit errors. In one embodiment, the resolution refers to the number of bits in messages that are passed in an iterative message passing decoder. For example, the messages in ECC Mode B 226b/256b may have 6 bits, whereas the messages in ECC Mode A 226a/256a may have 3 bits. In some embodiments, using fewer bits in the messages (corresponding to a lower resolution) results in faster decoding. Using fewer bits in the messages may also consume less power. Further details of decoders having different resolutions are described in U.S. Pat. No. 10,218,384, entitled "ECC Decoder with Multiple Decode Modes," which is incorporated herein by reference.

The XOR engines 224/254 may be used to form redundancy information that is based on information from each codeword in a set of codewords. The redundancy information may be stored in one of the memory dies. This redundancy information may be used to recover the data bits for each of the codewords in the set. As one example, each codeword could be 4 kilobytes, each codeword may be for one page of data, and redundancy information may be formed from a bitwise XOR of each of the codewords. In one embodiment, the bitwise XOR has the same number of bits of each codeword.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 3. Additionally, memory controllers with structures different than FIGS. 2 and 3 can also be used with the technology described herein.

Figure 4:
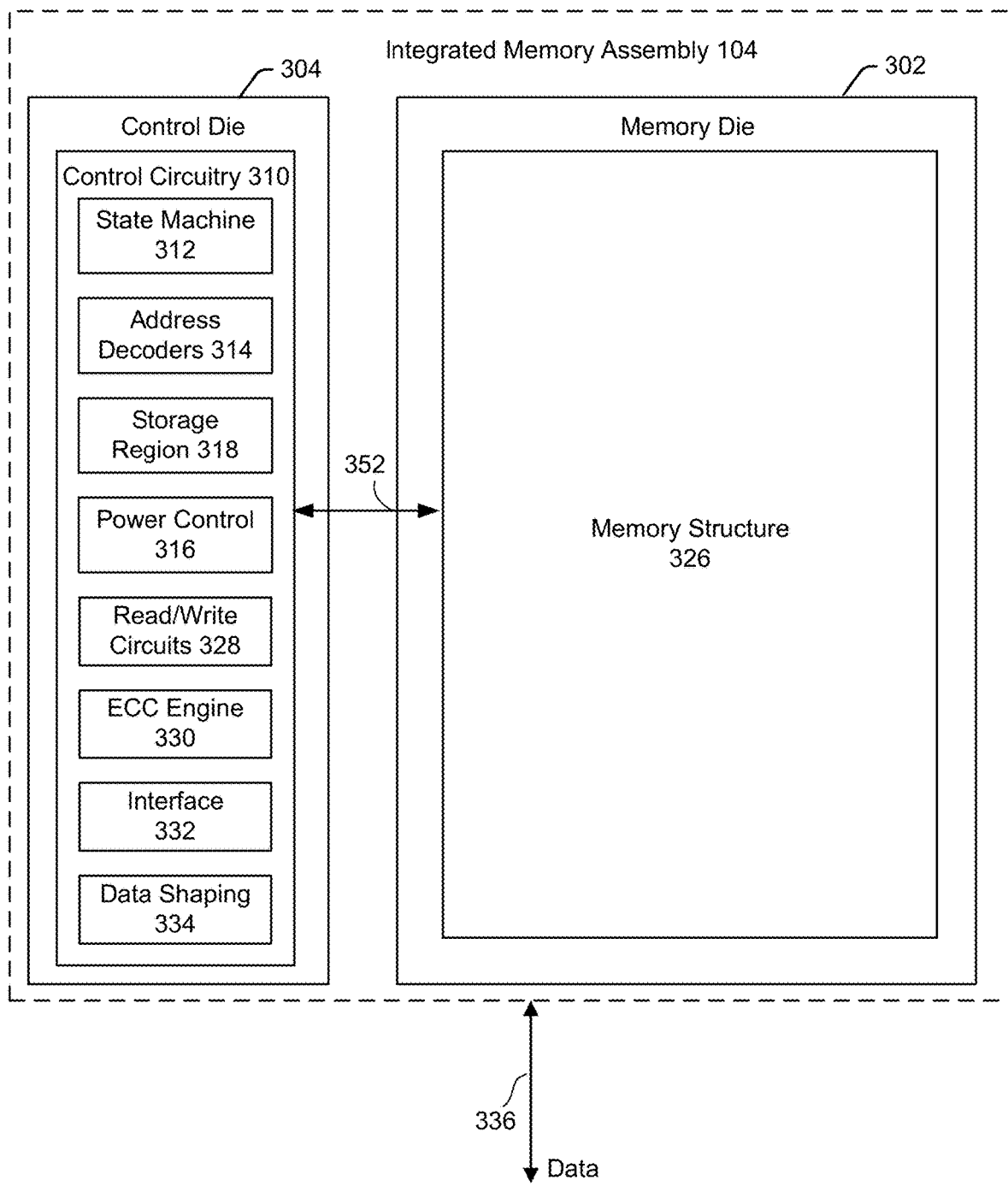
FIG. 4 is a functional block diagram of an integrated memory assembly.

FIG. 4 is a functional block diagram of one embodiment of an integrated memory assembly 104. In one embodiment, the integrated memory assembly 104 includes two semiconductor die (or more succinctly, "die"): memory die 302 and control die 304. Memory die 302 includes include memory structure 326. Memory structure 326 may contain non-volatile memory cells. Control die 304 includes control circuitry 310. In some embodiments, the memory die 302 and the control die 304 are bonded together, as will be described in more detail below.

Control circuitry 310 comprises a set of electrical circuits that perform memory operations (e.g., write, read, erase and others) on memory structure 326. Control circuitry 310 includes state machine 312, an on-chip address decoder 314, a power control circuit 316, storage region 318, read/write circuits 328, ECC engine 330, memory controller interface 332 and data shaping circuit 334. In another embodiment, a portion of the read/write circuits 328 are located on control die 304 and a portion of the read/write circuits 328 are located on memory die 302. For example, the read/write circuits 328 may contain sense amplifiers. In one embodiment, the sense amplifiers are located on the control die 304. In one embodiment, the sense amplifiers are located on the memory die 302.

Herein, the term, "memory die," "memory semiconductor die," or the like, means a semiconductor die that contains non-volatile memory cells for storage of data. Herein, the term, "control die," "control semiconductor die," or the like, means a semiconductor die that contains control circuitry for performing memory operations on non-volatile memory cells on a memory die. Typically, numerous semiconductor die are formed from a single semiconductor (e.g., silicon) wafer.

State machine 312 is an electrical circuit that controls the operations performed by control die 304.

The on-chip address decoder 314 provides an address interface between addresses used by host 120 or memory controller 102 to the hardware address used by row decoders and column decoders (not expressly depicted in FIG. 4). Power control circuit 316 controls the power and voltages supplied to the word lines, bit lines, and select lines during memory operations. The power control circuit 316 includes voltage circuitry, in one embodiment. Power control circuit 316 may include charge pumps or other voltage sources for creating voltages. The power control circuit 316 executes under control of the state machine 312.

The read/write circuits 328 includes sense blocks (which may contain sense amplifies (SA), in some embodiments. The sense amplifies include bit line drivers, in some embodiments. The read/write circuits 328 executes under control of the state machine 312, in one embodiment. Each memory structure 326 is addressable by word lines via a row decoder (not depicted in FIG. 3A) and by bit lines via a column decoder (not depicted in FIG. 3A), in some embodiments.

The error correction code (ECC) engine 330 is a circuit configured to decode and error correct codewords. Herein, ECC engine 330 may be referred to as an on-die ECC engine. In one embodiment, the on-die ECC engine 330 is configured to encode data bits from memory controller 102 into codewords that contain the data bits and parity bits. The control circuitry stores the codewords in the memory structure 326. In one embodiment, the on-die ECC engine 330 is also configured to decode the codewords which are read from the memory structure 326. In some embodiments, if the on-die ECC engine 330 is successful at decoding a codeword, then the control die 304 only sends back the data bits to the memory controller 102. In some embodiments, if the on-die ECC engine 330 is not successful at decoding a codeword, then the memory controller ECC engine 226/256 may be used to decode the codeword.

In some embodiments, first the control die 304 attempts to decode a codeword using ECC engine 330. If decoding fails, the memory controller 102 may attempt to decode that codeword. In some embodiments, the memory controller 102 has multiple ECC modes. For example, ECC mode A 226A (see FIG. 3) may be used to attempt to decode a codeword that the control die 304 could not decode. If ECC Mode A 226a fails to decode the codeword, then ECC mode B 226b may be used by the memory controller 102. For example, the on-die ECC engine 330 may use a hard bit decoder to attempt to decode a codeword. Under typical conditions, hard bit decoding may be successful most of the time. In the event that the on-die ECC engine 330 fails to successfully decode the codeword, the codeword may be passed to memory controller 102. In one embodiment, memory controller 102 first attempts to decode using a soft bit decoder at one level of resolution. This first attempt may be made by ECC Mode A 226a. If the first attempt by memory controller 102 fails, then the memory controller may use a soft bit decoder at higher level of resolution. This second attempt may be made by ECC Mode B 226b. Note that the aforementioned hard bit decoder may use less power than the soft bit decoders. Hence, most of the time the decoding may be achieved using a low power decoder on the control die 304. None of the on-die ECC engine 330, ECC Mode A 226A, nor ECC Mode B 226b are limited to the foregoing examples.

Data shaping circuit 334 is an electrical circuit used to perform the data shaping operation disclosed herein, and described in more detail below. In some embodiments, the technology for performing the data shaping operation is included in state machine 312. In some embodiments, the technology for performing the data shaping operation is included in software for state machine 312 or another type of processor.

State machine 312, on-die ECC engine 330, data shaping circuit 334 and/or controller 102 (or equivalently functioned circuits), in combination with all or a subset of the circuits of control circuitry 310, can be considered one or more control circuits. The one or more control circuits can include hardware only (e.g., electrical circuits) or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), microcontroller, integrated circuit or other type of circuit.

Pathways 352 are pathways between one or more components in the control circuitry 310 and the memory structure on memory die 302. A portion of each pathway resides in memory die 302 and a portion of each pathway resides in control die 304. The term pathway may be used for a portion of pathways 352 that is entirely within one of the die. Thus, it may be stated that the memory die 302 has a first plurality of pathways and that the control die 304 has a second plurality of pathways. In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. In one embodiment, pathways 352 allow the control circuitry 310 to provide voltages to word lines, select lines, and bit lines on memory die 302. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

Memory controller interface 332 is an electrical interface for communicating with memory controller 102. For example, memory controller interface 332 may implement a Toggle Mode Interface that connects to the Toggle Mode interfaces of memory interface 228/258 for memory controller 102. In one embodiment, memory controller interface 332 includes a set of input and/or output (I/O) pins that connect to communication channel 336 (also refers to herein as a data bus). In one embodiment, communication channel 336 connects to the memory controller 102 as part of the Toggle Mode Interface. In one embodiment, a communication channel 336 of one integrated memory assembly 104 connects to another integrated memory assembly 104.

Communication channel 336 is depicted as being connected to integrated memory assembly 104 for generality. Communication channel 336 may connect to either or both of die 302 and/or 304. In one embodiment, communication channel 336 connects memory controller 102 directly to control die 304. In one embodiment, communication channel 336 connects memory controller 102 directly to memory die 302. If communication channel 336 connects memory controller 102 directly to memory die 302, then pathway 352 may be used to allow communication between memory controller 102 and control circuitry 310.

In one embodiment, memory structure 326 comprises a monolithic three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments disclosed herein. Other examples of suitable technologies for memory cells of the memory structure 326 include phase change memory ("PCM"), Magnetoresistive Random-Access Memory ("MRAM"), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 4 depicts one control die 304 and one memory die 302 in an integrated memory assembly 104, there may be more than one control die 304 and more than one memory die 302 in an integrated memory assembly 104.

Figure 5:
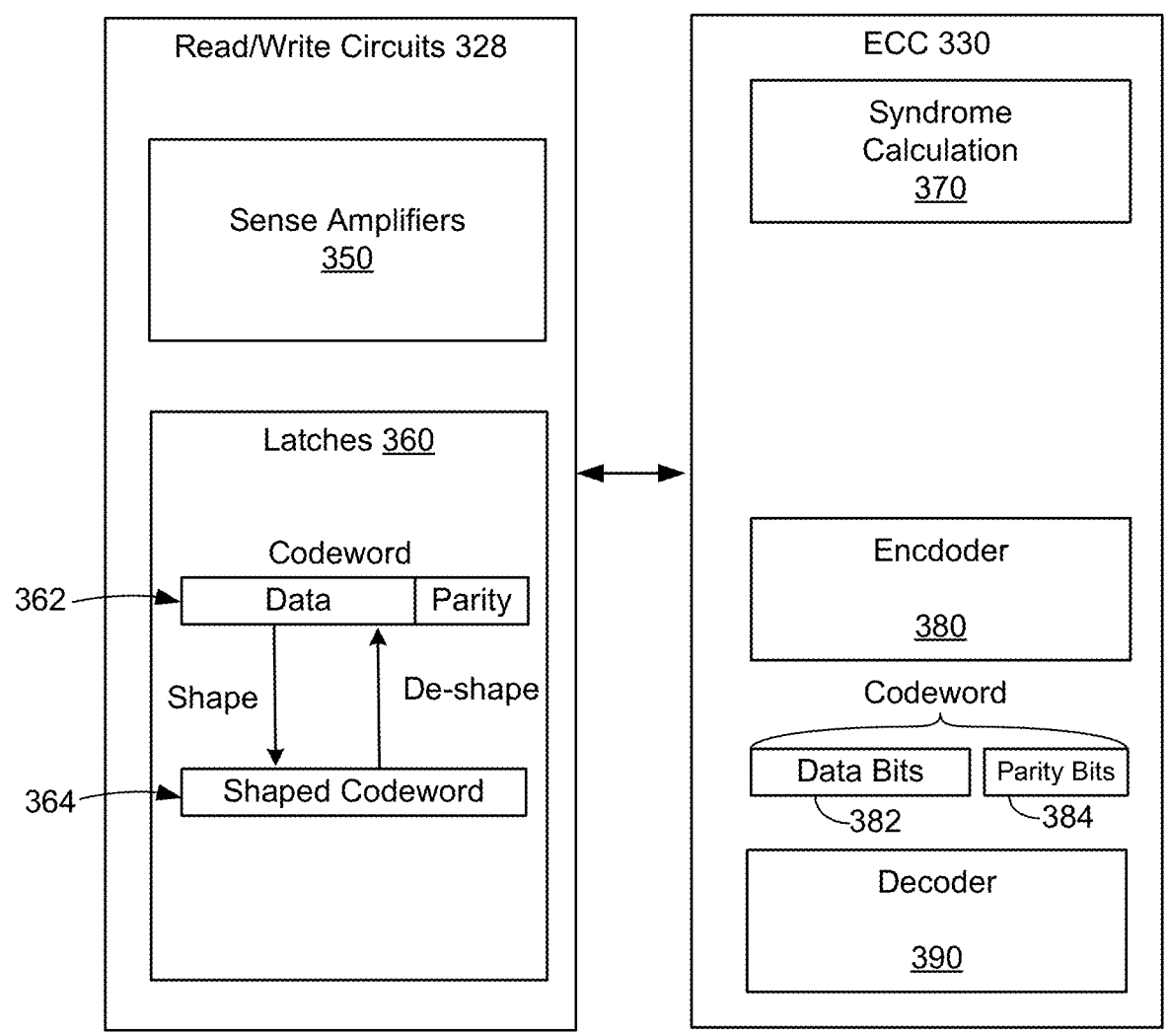
FIG. 5 is a block diagram of one embodiment of a read/write circuits and ECC circuit of an integrated memory assembly.

FIG. 5 is a block diagram of one embodiment of the read/write circuits 328 and ECC engine 330 of the control die 304. The read/write circuits 328 have sense amplifiers 350 and latches 360. In one embodiment, the data latches 360 store data bits of the codeword and parity bits of the codeword. In one embodiment, there are four sets of data latches and each set may be used to store a codeword for a different page of data. In an embodiment in which four bits are stored per memory cell, four pages are stored in a set of memory cells. The four pages may be referred to as a lower page (LP), lower-middle page (LMP), upper-middle page (UMP), and an upper page (UP). In an embodiment in which three bits are stored per memory cell, three pages are stored in a set of memory cells and the four pages may be referred to as a lower page (LP), middle page (MP), and an upper page (UP). In another embodiment, the sense amplifiers 350 are on the memory die 302, but the latches 360 remain on the control die 304.

While a codeword is stored in latches 360, control die 304 (e.g., data shaping circuit 334 and/or state machine 312) may perform data shaping on the codeword to create a shaped codeword (as depicted in FIG. 5). The shaped codeword is then programmed into memory 326. When a shaped codeword is read from memory 326, it is stored in latches 360, and then control die 304 (e.g., data shaping circuit 334 and/or state machine 312) may perform de-shaping on the codeword to transform the shaped codeword to an unshaped codeword (as depicted in FIG. 5). In another embodiment, the shaping can be performed prior to encoding the data with error correction information.

The on-die ECC engine 330 is able to encode data bits received from memory controller 102. In one embodiment, the on-die ECC engine 330 forms codewords that each contain data bits and parity bits. In one embodiment, memory controller 102 provides the codewords to the control die 304. Control circuitry 310 stores the codewords into non-volatile memory cells in the memory structure 326. Upon a request from memory controller 102 to read data, control circuitry 310 reads codewords from memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code or error correction information) may be stored with the unit of data (e.g., page). The combination of the unit of data and its associated parity bits are referred to as a codeword. In one embodiment, the parity bits are stored remotely from the unit of data (e.g., page).

In an embodiment, upon successfully decoding a codeword, the control die 304 sends only the data bits, but not the parity bits, to memory controller 102. Therefore, bandwidth over communication lines between memory controller 102 and the integrated memory assembly 104 is saved. Also, substantial power may be saved. For example, the interface between the control die and the controller could be a high speed interface.

The on die ECC engine 330 includes syndrome calculation logic 370, an encoder 380, and a decoder 390. The encoder 380 is configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof. The encoder 380 may form a codeword, which contains data bits 382 and parity bits 384. The data bits may be provided by memory controller 102.

Based on the bits in the latches 360, the sense amplifiers 350 may control bit line voltages in the memory structure 326 when the non-volatile memory cells are being programmed. In this manner, the codewords may be programmed into non-volatile memory cells in the memory structure 326. It will be appreciated that other voltages may also be applied to the memory structure 326, such applying a program voltage to memory cells that are selected for programming by a voltage generator on control die 304 applying the program voltage and boosting voltages to various word lines of memory structure 326.

Decoder 390 is configured to decode the codewords that were stored in the memory die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword. In one embodiment, the decoder 390 is a relatively low power decoder, as compared to a decoder on memory controller 102. In one embodiment, the decoder on memory controller 102 is able to correct more bit errors in the codeword than can typically be corrected by decoder 390. Thus, decoder 390 may provide a power versus error correction capability tradeoff. For example, decoder 390 may be very efficient with respect to power consumption, but at the expense of possibly not being able to correct a high number of errors in a codeword.

In one embodiment, the decoder 390 implements a hard bit decoder. In another embodiment, the decoder 390 implements a soft bit decoder. Alternatively, decoder 390 may implement both a hard bit decoder and a soft bit decoder. For example, the control die 304 may first attempt to decode a codeword with the hard bit decoder. If that fails, then the control die 304 may attempt to decode using the soft bit decoder.

In some embodiments, the decoder 390 is based on a sparse bipartite graph having bit (or variable) nodes and check nodes. The decoder 390 may pass messages between the bit nodes and the check nodes. Passing a message between a bit node and a check node is accomplished by performing a message passing computation. The message passing computation may be based on belief propagation.

Syndrome calculation logic 370 (e.g., an electrical circuit and/or software) is able to determine a syndrome weight for codewords. The syndrome weight refers to the number of parity check equations that are unsatisfied. The initial syndrome weight of a codeword may correlate with the bit error rate (BER) of that codeword. Thus, the control die 304 may estimate a BER for a codeword based on the initial syndrome weight. In one embodiment, the syndrome logic is implemented in hardware. The syndrome weight can be determined without fully decoding a codeword. Hence, the initial syndrome weight can be calculated in less time and with less power than for decoding a codeword. In some embodiments, the control die 304 makes management decisions based on the estimated BER. For example, the control die 304 may determine what technique should be used to decode a codeword, what read reference voltages should be used to read memory cells, etc. based on the estimated BER.

Figures 6A, 6B:
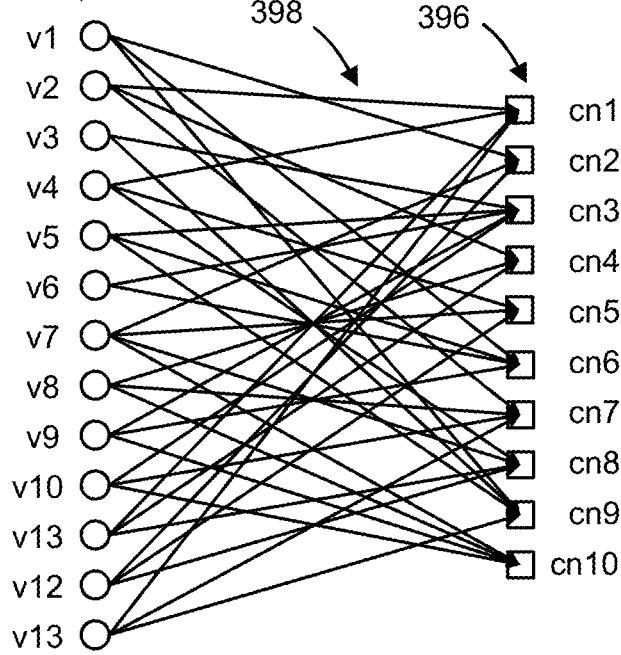
FIG. 6A depicts an example of a sparse parity check matrix H.
FIG. 6B depicts a sparse bipartite graph which corresponds to the sparse parity check matrix of FIG. 6A.

In one embodiment, on-die ECC engine 330 uses a sparse parity check matrix. FIG. 6A depicts an example of a sparse parity check matrix H (which may also be represented as a sparse bipartite graph). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 6B depicts a sparse bipartite graph 392 which corresponds to the sparse parity check matrix of FIG. 6A. Specifically, the code can be defined by a sparse bipartite graph G=(V,C,E) with a set V of N bit nodes 394 (N=13 in this example), a set C of M check nodes 396 (M=10 in this example) and a set E (E=38 in this example) of edges 398 connecting bit nodes 394 to check nodes 396. The bit nodes correspond to the codeword bits and the check nodes correspond to parity-check constraints on the bits. A bit node 394 is connected by edges 398 to the check nodes 396 it participates in.

During decoding, one embodiment of the decoder 390 attempts to satisfy the parity checks. In this example, there are ten parity checks, as indicated by the check nodes cn1 through cn10. The first parity check at cn1 determines if $v2 \oplus v4 \oplus v11 \oplus v13=0$, where "$\oplus$" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12=0$, the third parity check at cn3 determines if $v3 \oplus v5 \oplus v6 \oplus v9 \oplus v10=0$, the fourth parity check at cn4 determines if $v2 \oplus v8 \oplus v11=0$, the fifth parity check at cn5 determines if $v4 \oplus v7 \oplus v12=0$, the sixth parity check at cn6 determines if $v1 \oplus v5 \oplus v6 \oplus v9=0$, the seventh parity check at cn7 determines if $v2 \oplus v8 \oplus v10 v13=0$, the eighth parity check at cn8 determines if $v4 \oplus v7 \oplus v11 \oplus v12=0$, the ninth parity check at cn9 determines if $v1 \oplus v3 \oplus v5 \oplus v13=0$ and the tenth parity check at cn10 determines if $v7 \oplus v8 \oplus v9 \oplus v10=0$.

In one embodiment, the decoder 390 uses an iterative probabilistic decoding process involving iterative message passing decoding algorithms. These algorithms operate by exchanging messages between bit nodes and check nodes over the edges of the underlying bipartite graph representing the code.

The decoder 390 may be provided with initial estimates of the codeword bits (based on the content that is read from the memory structure 326). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

Figure 7:
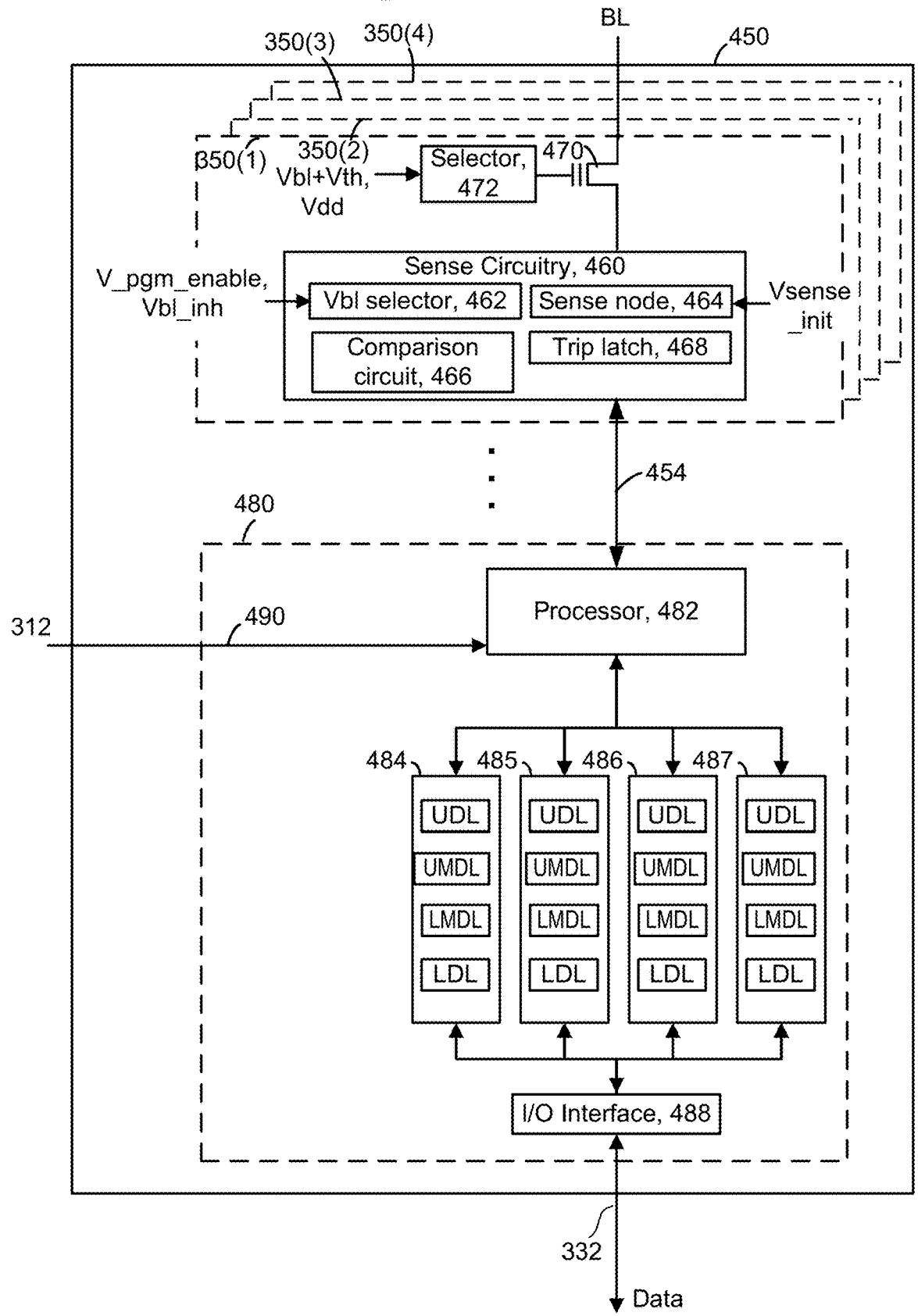
FIG. 7 is a block diagram depicting one embodiment of a sense block.

FIG. 7 is a block diagram depicting one embodiment of a sense block 450. The sense block is part of the read/write circuits 328. An individual sense block 450 is partitioned into one or more core portions, referred to as sense circuits or sense amplifiers 350(1)-350(4), and a common portion, referred to as a managing circuit 480. In one embodiment, there will be a separate sense circuit for each bit line/NAND string and one common managing circuit 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation (e.g., write operation).

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. The Vbl selector 462 can also be used during sensing operations. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line. The bit lines are part of memory structure 326 on memory die 302.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

The managing circuit 480 comprises a processor 482, four example sets of data latches 484, 485, 486, 487 and an I/O Interface 488 coupled between the sets of data latches and data bus 332 (data bus may connect to memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell and, therefore, only three latches (LDL, MDL, UDL) per sense amplifier.

The processor 482 performs computations, such as to determine the data stored in the sensed memory cell and store the determined data in the set of data latches. Each set of data latches 484-487 is used to store data bits determined by processor 482 during a read operation, and to store data bits imported from the data bus 332 during a program operation which represent write data meant to be programmed into the memory. I/O interface 488 provides an interface between data latches 484-487 and the data bus 332.

The processor 482 may also be used to determine what voltage to apply to the bit line, based on the state of the latches.

During reading, the operation of the system is under the control of state machine 312 that controls the supply of different control gate voltages to the addressed memory cell (e.g., by applying voltages from power control 316 to word lines on the memory structure 326 via the pathways between control die 304 and memory die 302 discussed herein). As it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine via input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because (in one embodiment) each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a process referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 8:
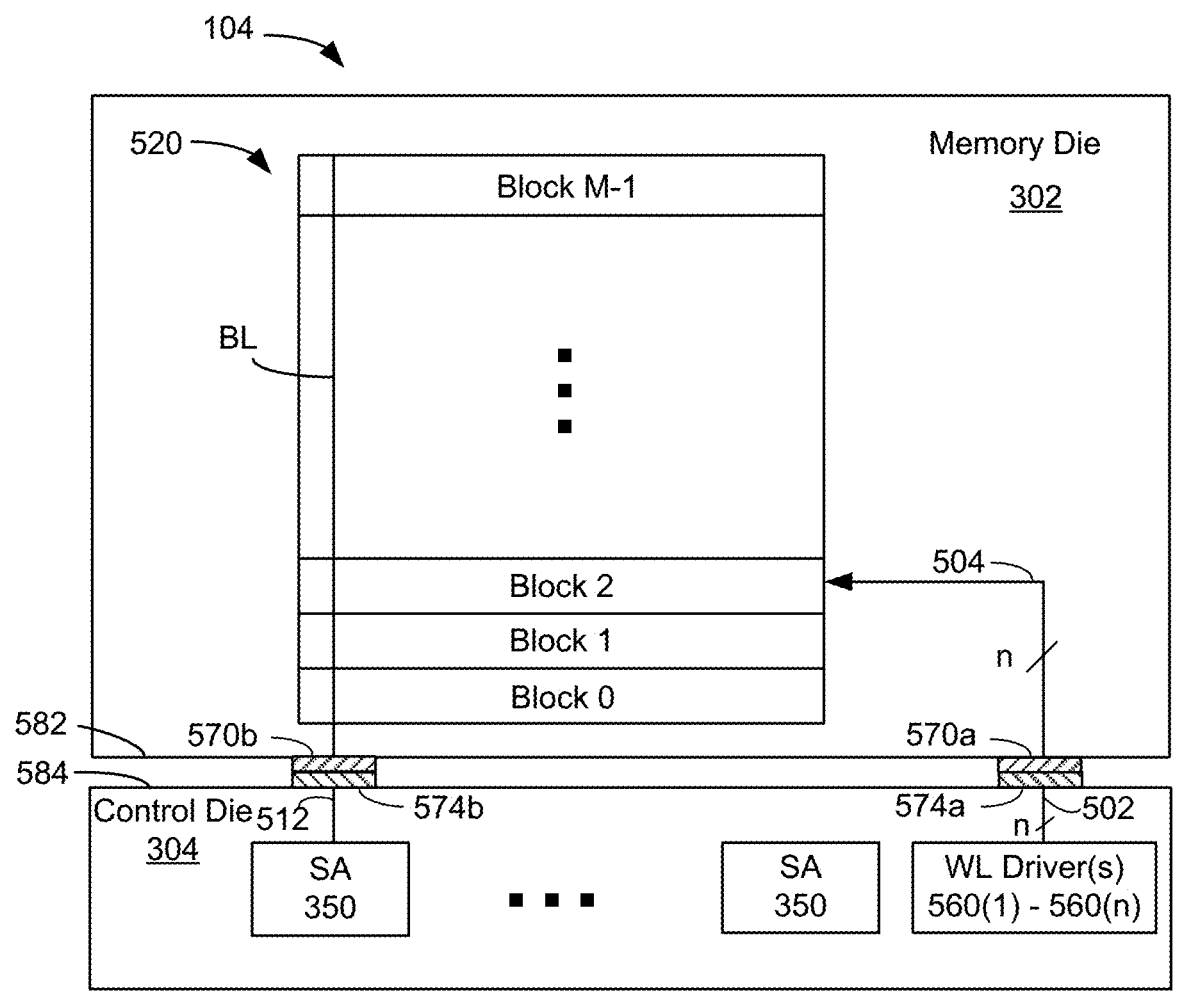
FIG. 8 is a block diagram of one embodiment of an integrated memory assembly.

FIG. 8 is a block diagram of one embodiment of an integrated memory assembly 104. FIG. 8 depicts further details of one embodiment of the integrated memory assembly 104 of FIGS. 1 and 4. Memory die 302 contains a plane 520 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 8, Block 0 and Block M-1 of plane 520 are at the edges of the memory structure (or otherwise referred to as being located in an edge region/section of the memory structure).

Control die 304 includes a number of sense amplifiers (SA) 350. Each sense amplifier 350 is connected to one bit line. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 560(1)-560(n). The word line drivers 560 are configured to provide voltages to word lines. In this example, there are "n" word lines per block of memory cells. In one embodiment, one of the blocks in the plane 520 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 560 (e.g. part of Power Control 316) provide voltages to the word lines in a first selected block (e.g., Block 2) in memory die 302. The control die 304 may also include charge pumps, voltage generators, and the like, which may be used to provide voltages for the word line drivers 560 and/or the bit line drivers.

The memory die 302 has a number of bond pads 570a, 570b on a first major surface 582 of memory die 302. There may be "n" bond pads 570a, to receive voltages from a corresponding "n" word line drivers 560(1)-560(n). There may be one bond pad 570b for each bit line associated with plane 520. The reference numeral 570 will be used to refer in general to bond pads on major surface 582.

In some embodiments, each data bit and each parity bit of a codeword are transferred through a different bond pad pair 570b, 574b. The bits of the codeword may be transferred in parallel over the bond pad pairs 570b, 574b. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 574a, 574b on a first major surface 584 of control die 304. There may be "n" bond pads 574a, to deliver voltages from a corresponding "n" word line drivers 560(1)-560(n) to memory die 302a. There may be one bond pad 574b for each bit line associated with plane 520. The reference numeral 574 will be used to refer in general to bond pads on major surface 582. Note that there may be bond pad pairs 570a/574a and bond pad pairs 570b/574b. In some embodiments, bond pads 570 and/or 574 are flip-chip bond pads.

In one embodiment, the pattern of bond pads 570 matches the pattern of bond pads 574. Bond pads 570 are bonded (e.g., flip chip bonded) to bond pads 574. Thus, the bond pads 570, 574 electrically and physically couple the memory die 302 to the control die 304. Also, the bond pads 570, 574 permit internal signal transfer between the memory die 302 and the control die 304. Thus, the memory die 302 and the control die 304 are bonded together with bond pads. Although FIG. 5A depicts one control die 304 bonded to one memory die 302, in another embodiment one control die 304 is bonded to multiple memory dies 302.

Herein, "internal signal transfer" means signal transfer between the control die 304 and the memory die 302. The internal signal transfer permits the circuitry on the control die 304 to control memory operations in the memory die 302. Therefore, the bond pads 570, 574 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 570, 574 may be formed for example of copper, aluminum and alloys thereof. There may be a liner between the bond pads 570, 574 and the major surfaces (582, 584). The liner may be formed for example of a titanium/titanium nitride stack. The bond pads 570, 574 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 570, 574. Several conductive pathways, which may be implemented with metal interconnects and/or vias are depicted. For example, a sense amplifier 350 may be electrically connected to bond pad 574b by pathway 512. There may be thousands of such sense amplifiers, pathways, and bond pads. Note that the BL does not necessarily make direct connection to bond pad 570b. The word line drivers 560 may be electrically connected to bond pads 574a by pathways 502. Note that pathways 502 may comprise a separate conductive pathway for each word line driver 560(1)-560(n). Likewise, there may be a separate bond pad 574a for each word line driver 560(1)-560(n). The word lines in block 2 of the memory die 302 may be electrically connected to bond pads 570a by pathways 504. In FIG. 8, there are "n" pathways 504, for a corresponding "n" word lines in a block. There may be a separate pair of bond pads 570a, 574a for each pathway 504.

Figure 9:
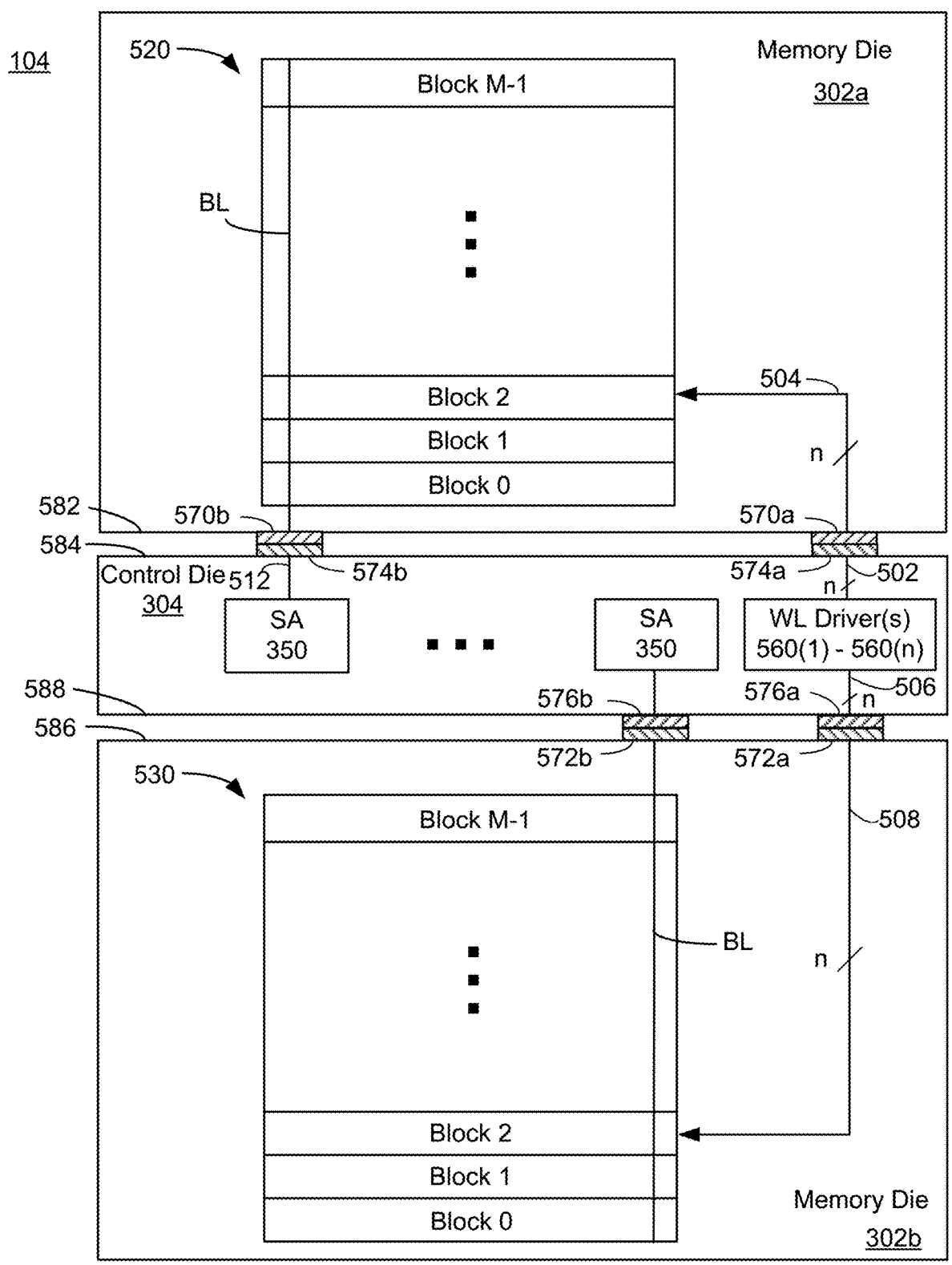
FIG. 9 is a block diagram of one embodiment of an integrated memory assembly in which a control die controls two memory dies.

FIG. 9 depicts another embodiment of an integrated memory assembly 104 in which one control die 304 may be used to control two memory die 302a, 302b. The control die 304 has a number of a number of bond pads 574(a), 574(b) on a first major surface 584, as discussed in connection with FIG. 8. The control die 304 has a number of a number of bond pads 576(a), 576(b) on a second major surface 588. There may be "n" bond pads 576(a) to deliver voltages from a corresponding "n" word line drivers 560(1)-560(n) to memory die 302b. The word line drivers 560 may be electrically connected to bond pads 576a by pathways 506. There may be one bond pad 576b for each bit line associated with plane 530 on memory die 302b. The reference numeral 576 will be used to refer in general to bond pads on major surface 588.

The second memory die 302b has a number of bond pads 572(a), 572(b) on a first major surface 586 of second memory die 302b. There may be "n" bond pads 572(a), to receive voltages from a corresponding "n" word line drivers 560(1)-560(n). The word lines in plane 530 may be electrically connected to bond pads 572a by pathways 508. There may be one bond pad 572(b) for each bit line associated with plane 530. The reference numeral 572 will be used to refer in general to bond pads on major surface 586. Note that there may be bond pad pairs 572(a)/576(a) and bond pad pairs 572(b)/576(b). In some embodiments, bond pads 572 and/or 576 are flip-chip bond pads.

In an embodiment, the "n" word line drivers 560(1)-560(n) are shared between the two memory die 302a, 302b. For example, a single word line driver may be used to provide a voltage to a word line in memory die 302a and to a word line in memory die 302b. However, it is not required that the word line drivers 560 are shared between the memory dies 302a, 302b.

Figure 10A:
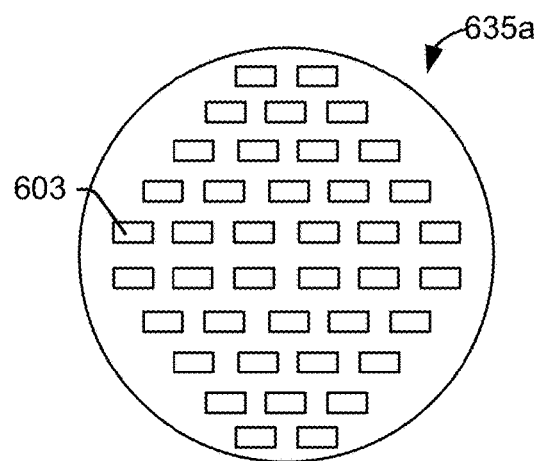
FIGS. 10A and 10B are top views of semiconductor wafers.

FIG. 10A is a top view of a semiconductor wafer 635a from which multiple control die 304 may be formed. The wafer 635a has numerous copies of integrated circuits 603. Each of the integrated circuits 603 contains the control circuitry 310 (see FIG. 4). Wafer 635a is diced into semiconductor dies, each containing one of the copies of the integrated circuits 603. Therefore, numerous control semiconductor dies 304 may be formed from the wafer 635a. Also note that even before the wafer 635a is diced, as the term "control semiconductor die" is used herein, each region in which an integrated circuit 603 resides may be referred to as a control semiconductor die 304.

Figure 10B:
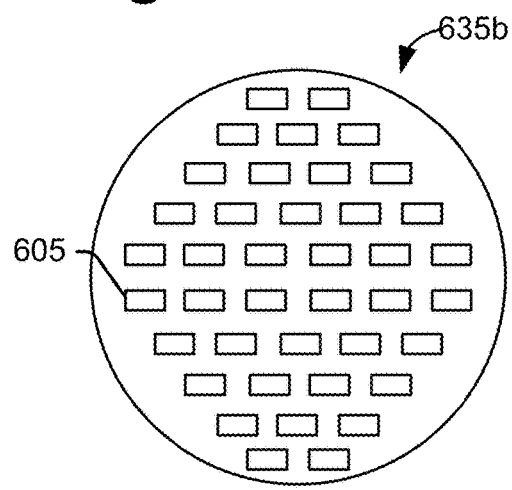

FIG. 10B is a top view of a semiconductor wafer 635b from which multiple memory die 302 may be formed. The wafer 635b has numerous copies of integrated circuits 605. Each of the integrated circuits 605 contains memory structure 326 (see FIG. 4), in one embodiment. The wafer 635b is diced into semiconductor dies, each containing one of the copies of the integrated circuits 605, in some embodiments. Therefore, numerous memory semiconductor dies 302 may be formed from the wafer 635b. Also note that even before the wafer 635b is diced, as the term "memory semiconductor die" is used herein, each region in which an integrated circuit 605 resides may be referred to as a memory semiconductor die 302.

The semiconductor wafers 635 may start as an ingot of monocrystalline silicon grown according to either a CZ, FZ or other process. The semiconductor wafers 635 may be cut and polished on major surfaces to provide smooth surfaces. The integrated circuits 603, 605 may be formed on and/or in the major surfaces. Note that forming the integrated circuits 603, 605 on different wafers 635a, 635b facilitates use of different semiconductor fabrication processes on the different wafers 635a, 635b. For example, semiconductor fabrication processes may involve high temperature anneals. Such high temperature anneals may be needed for formation of some circuit elements, or may be useful for improving properties of circuit elements. For example, a high temperature anneal can desirably reduce the resistance of polysilicon on the memory dies 302. However, the high temperature anneal could be damaging to other circuit elements. For example, a high temperature anneal can potentially be damaging to CMOS transistors, such as the transistors that may be used on the semiconductor dies 304. In one embodiment, a high temperature anneal that is used when fabricating the integrated circuits 605 on wafer 635b is not used when fabricating the integrated circuits 603 on wafer 635a. For example, in one embodiment, a high temperature anneal that is used when fabricating the memory dies is not used when fabricating the control dies.

The dicing of the wafers 635 into semiconductor dies may occur before or after bonding. In one embodiment, the two wafers 635, 635b are bonded together. After bonding the two wafers together, dicing is performed. Therefore, numerous integrated memory assemblies 104 may be formed from the two wafers 635. In another embodiment, the two wafers 635a, 635b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304 and a memory semiconductor die 302 bonded together.

Figure 10C:
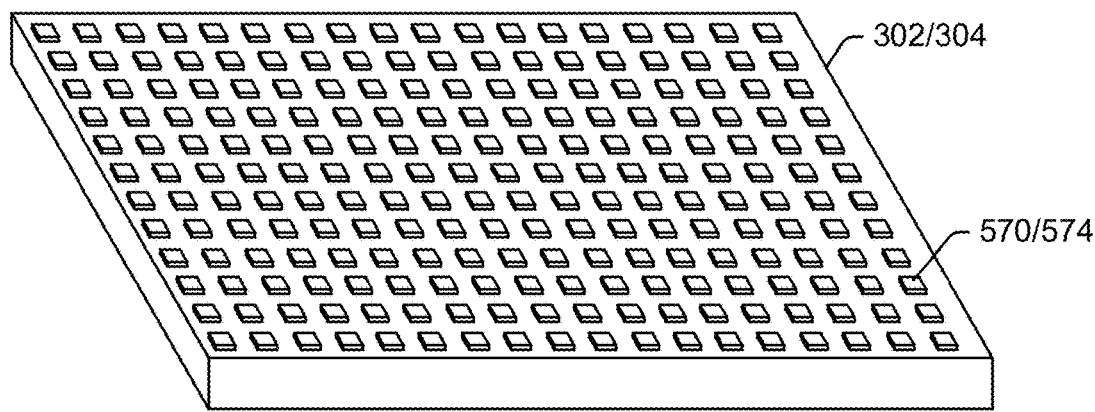
FIG. 10C depicts an example pattern of bond pads on a planar surface of a semiconductor die.

As has been discussed above, the control die 304 and the memory die 302 may be bonded together. Bond pads on each die 302, 304 may be used to bond the two dies together. FIG. 10C depicts an example pattern of bond pads on a planar surface of a semiconductor die. The semiconductor die could be memory die 302 or control die 304. The bond pads could be any of bond pads 570 or 574, as appropriate for the semiconductor die. There may be many more bond pads than are depicted in FIG. 10C. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 570, 574 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302 and 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 11:
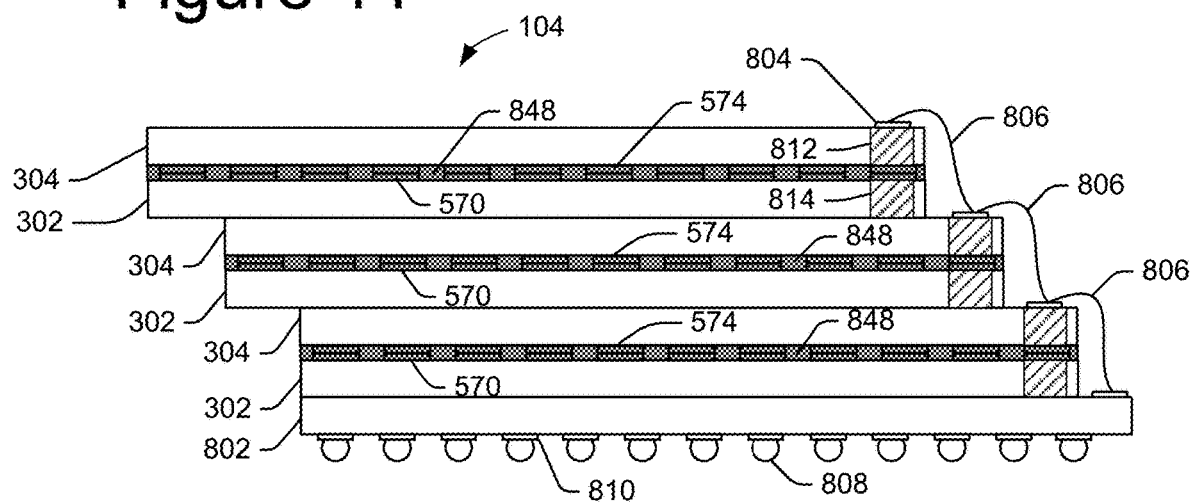
FIG. 11 depicts a side view of an embodiment of an integrated memory assembly stacked on a substrate.

As noted herein, there may be more than one control die 304 and more than one memory die 302 in an integrated memory assembly 104. In some embodiments, the integrated memory assembly 104 includes a stack of multiple control die 304 and multiple memory die 302. FIG. 11 depicts a side view of an embodiment of an integrated memory assembly 104 stacked on a substrate 802. The integrated memory assembly 104 has three control die 304 and three memory die 302. Each control die 304 is bonded to one of the memory die 302. Some of the bond pads 570, 574, are depicted. There may be many more bond pads. A space between two dies 302, 304 that are bonded together is filled with a solid layer 848, which may be formed from epoxy or other resin or polymer. This solid layer 848 protects the electrical connections between the dies 302, 304, and further secures the dies together. Various materials may be used as solid layer 848, but in embodiments, it may be Hysol epoxy resin from Henkel Corp., having offices in California, USA.

The integrated memory assembly 104 may for example be stacked with a stepped offset, leaving the bond pads 804 at each level uncovered and accessible from above. Wire bonds 806 connected to the bond pads 804 connect the control die 304 to the substrate 802. A number of such wire bonds may be formed across the width of each control die 304 (i.e., into the page of FIG. 8A).

A through silicon via (TSV) 812 may be used to route signals through a control die 304. A through silicon via (TSV) 814 may be used to route signals through a memory die 302. The TSVs 812, 814 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package. The solder balls 808 may form a part of the interface between the integrated memory assembly 104 and memory controller 102.

In the embodiment of FIG. 11, the memory dies 302 and the control dies 304 are arranged as pairs. That is, each memory die 302 is bonded to and in communication with a corresponding/matching/paired control die.

Figure 12:
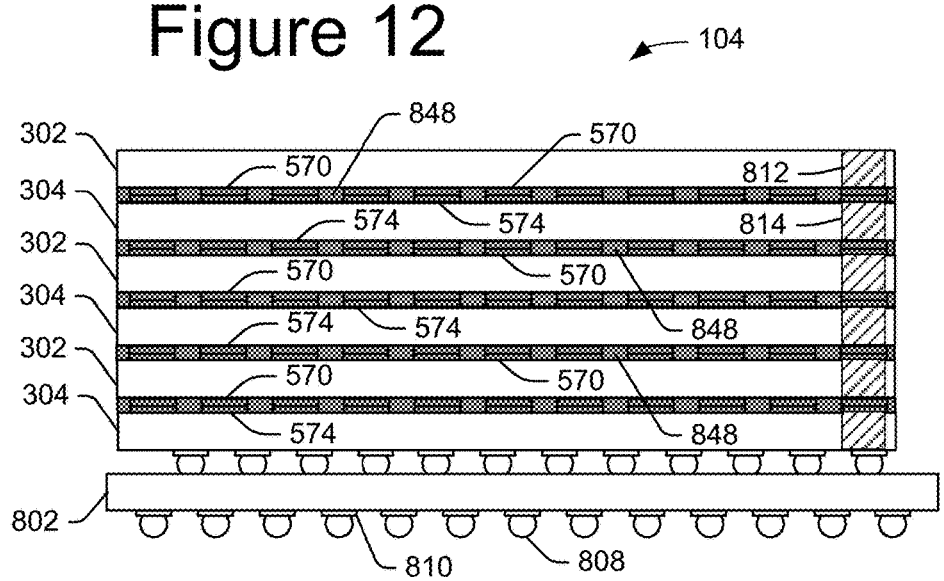
FIG. 12 depicts a side view of an embodiment of an integrated memory assembly stacked on a substrate.

FIG. 12 depicts a side view of an embodiment of an integrated memory assembly 104 stacked on a substrate 802. The integrated memory assembly 104 has three control die 304 and three memory die 302. In this example, each control die 304 is bonded to at least one memory die 302. Optionally, a control die 304 may be bonded to two memory die 302. For example, two of the control die 304 are bonded to a memory die 302 above the control die 304 and a memory die 302 below the control die 304.

Some of the bond pads 570, 574 are depicted. There may be many more bond pads. A space between two dies 302, 304 that are bonded together is filled with a solid layer 848, which may be formed from epoxy or other resin or polymer. In contrast to the example in FIG. 11, the integrated memory assembly 104 in FIG. 12 does not have a stepped offset. A through silicon via (TSV) 812 may be used to route signals through a memory die 302. A through silicon via (TSV) 814 may be used to route signals through a control die 304.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package.

Figure 13:
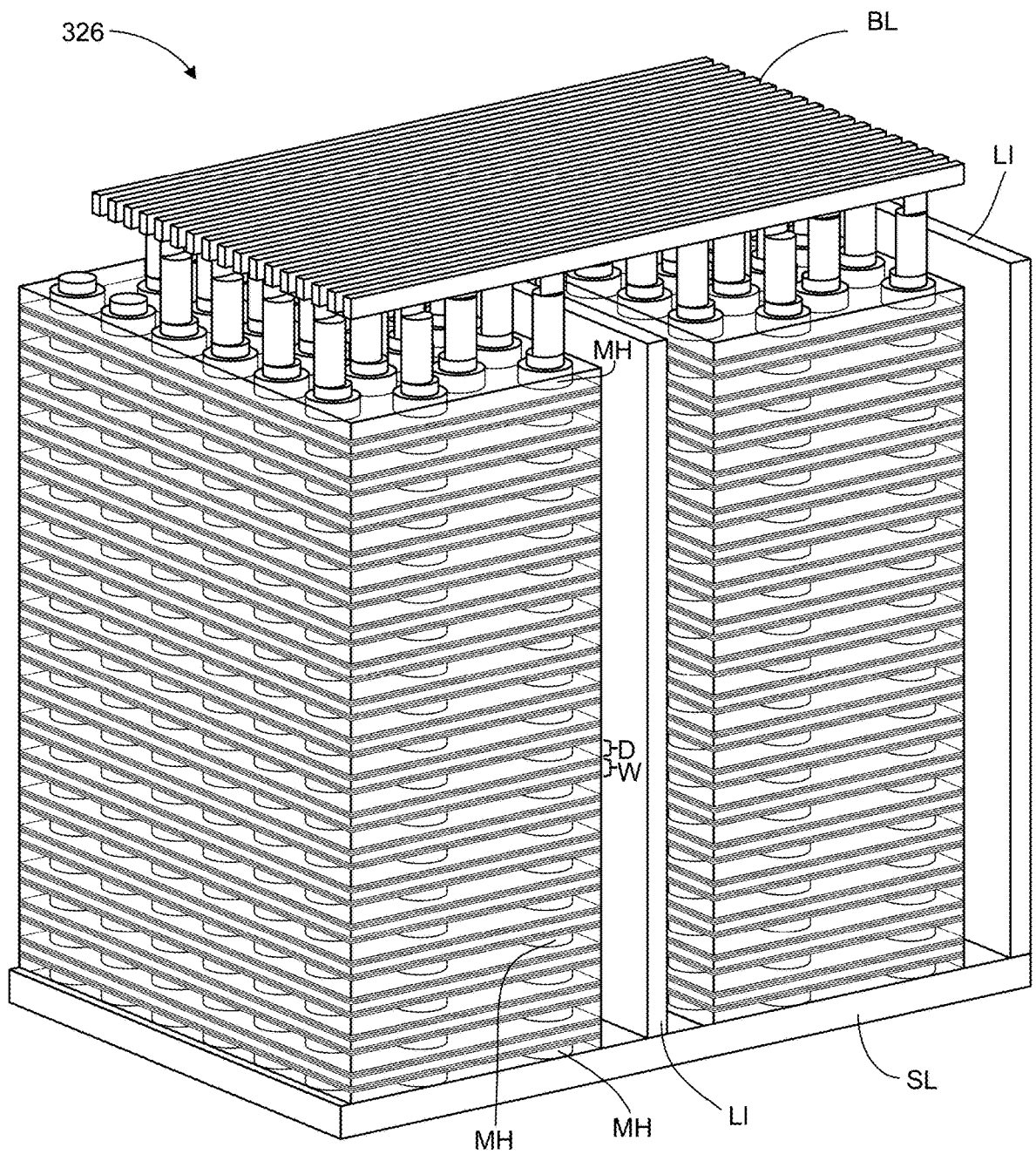
FIG. 13 is a perspective view of a portion of one example embodiment of a monolithic three dimensional memory array.

FIG. 13 is a perspective view of a portion of one example embodiment of a monolithic three dimensional memory array that can comprise memory structure 326, which includes a plurality non-volatile memory cells. For example, FIG. 13 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 913, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. One example of a suitable memory structure 326 is described in U.S. Pat. No. 10,553,298, incorporated herein by reference in its entirety.

Figure 14:
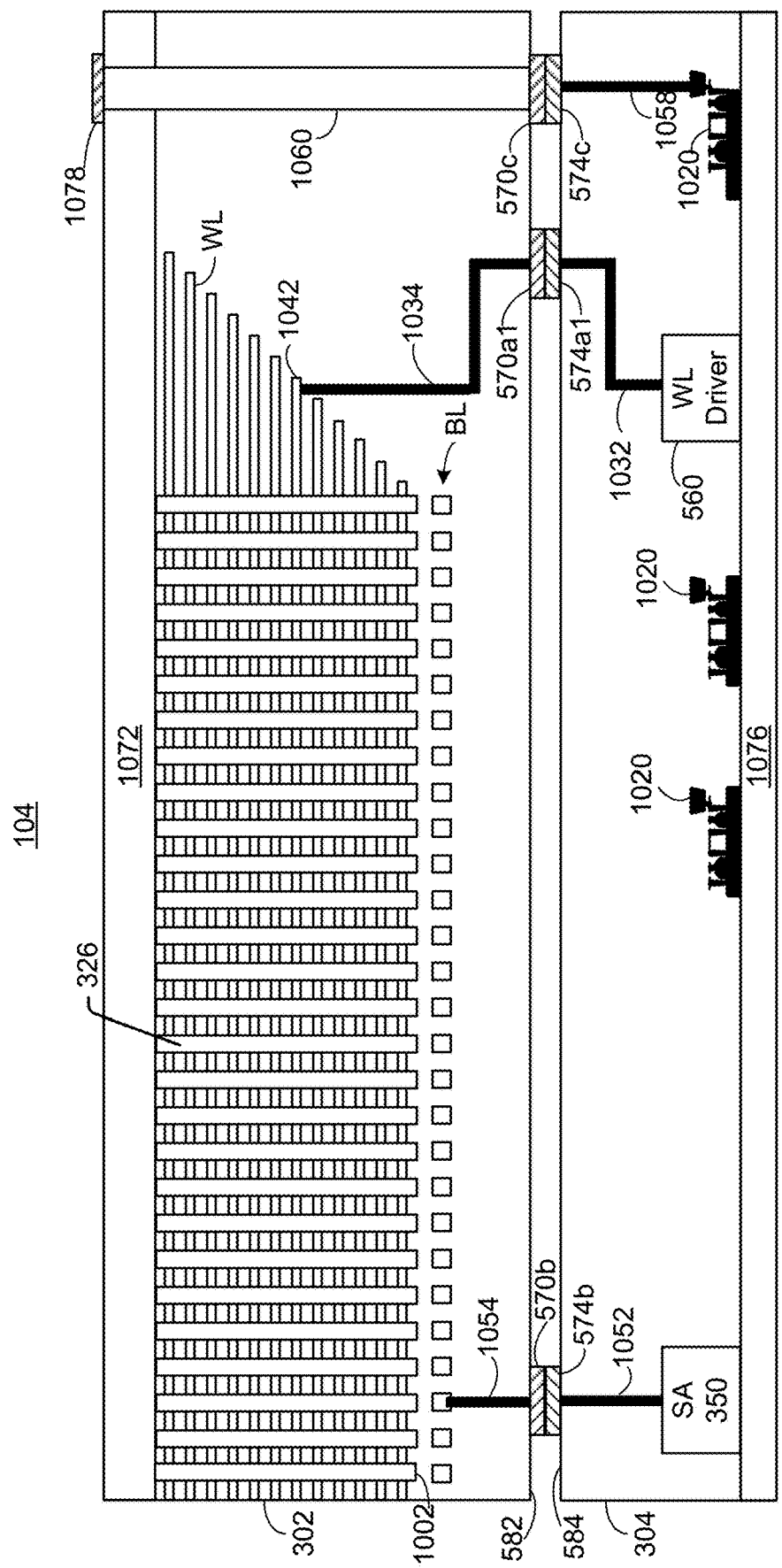
FIG. 14 depicts one embodiment of an integrated memory assembly.

FIG. 14 is a diagram of one embodiment of an integrated memory assembly 104. In an embodiment depicted in FIG. 14, memory die 302 is bonded to control die 304. This bonding configuration is similar to an embodiment depicted in FIG. 8. Note that although a gap is depicted between the pairs of adjacent dies, such a gap may be filled with an epoxy or other resin or polymer. FIG. 14 shows additional details of one embodiment of pathways 352.

The memory die includes a memory structure 326. Memory structure 326 is adjacent to substrate 1072 of memory die 302. In some embodiments, substrate 1072 is formed from a portion of a silicon wafer. In this example, the memory structure 326 include a three-dimensional memory array. The memory structure 326 has a similar structure as the example depicted in FIG. 13. There are a number of word line layers (WL), which are separated by dielectric layers. The dielectric layers are represented by gaps between the word line layers. Thus, the word line layers and dielectric layers form a stack. There may be many more word line layers than are depicted in FIG. 14. As with the example of FIG. 13, there are a number of columns that extend through the stack. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The pathway from the word line driver 560 to the word line 1042 includes conductive pathway 1032, bond pad 574a1, bond pad 570a1, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 10A) provide voltages to other word lines. Thus, there are additional bond pad 574a, 570a in addition to bond pads 574a1, 570a1. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310. In some embodiments, sense amplifiers 350, word line driver(s) 560, and/or other circuitry 1020 comprise CMOS circuits.

There is an external signal path that allows circuitry on the control die 304 to communicate with an entity external to the integrated memory assembly 104, such as memory controller 102. Therefore, circuitry 1020 on the control die 304 may communicate with, for example, memory controller 102. Optionally, circuitry on the control die 304 may communicate with, for example, host 120. The external pathway includes via 1058 in control die 304, bond pad 574c, bond pad 570c, through silicon via (TSV) 1060, and external pad 1078. The TSV 1060 extends through substrate 1072.

The TSV 1060, may be formed before, during or after formation of the integrated circuits in the semiconductor dies 302, 304. The TSV may be formed by etching holes through the wafers. For example, holes may be etched through substrate 1072. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to the embodiment depicted in FIG. 14 are possible. One modification is for sense amplifiers 350 to be located on memory die 302.

Figure 15:
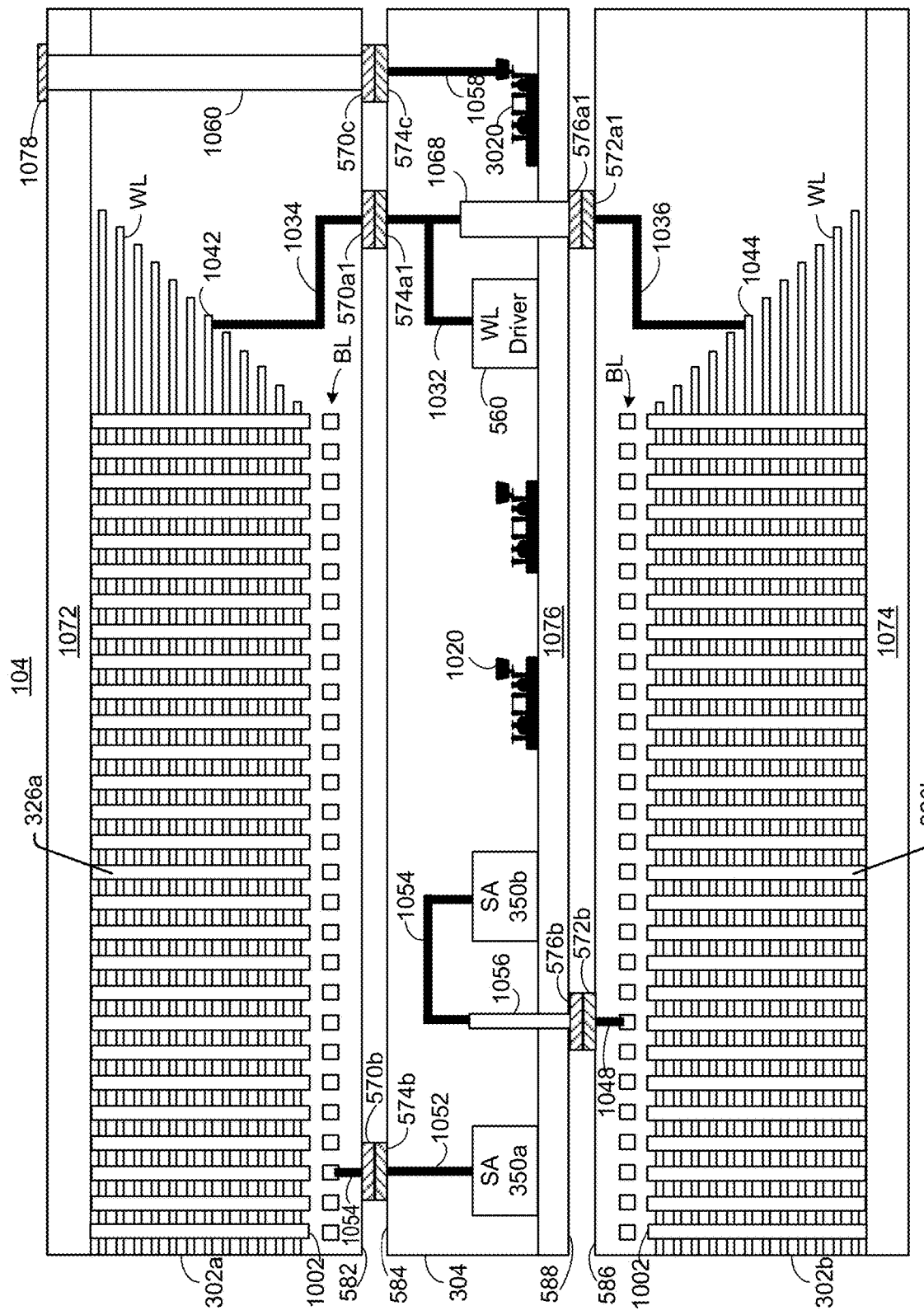
FIG. 15 depicts one embodiment of an integrated memory assembly in which one control die controls two memory die.

FIG. 15 depicts one embodiment of an integrated memory assembly 104. This bonding configuration is similar to an embodiment depicted in FIG. 8. The configuration in FIG. 15 adds an extra memory die relative to the configuration in FIG. 14. Hence, similar reference numerals are used for memory die 302a in FIG. 15, as were used for memory die 302 in FIG. 14. In an embodiment depicted in FIG. 15, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1072 of memory die 302a. Memory structure 326b is adjacent to substrate 1074 of memory die 302b. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302a and a second word line 1044 in memory die 302b. The pathway from the word line driver 560 to the second word line 1044 includes conductive pathway 1032, through silicon via (TSV) 1068, bond pad 576a1, bond pad 572a1, and conductive pathway 1036. Other word line drivers (not depicted in FIG. 10B) provide voltages to other word lines.

Sense amplifier 350a is in communication with a bit line in memory die 302a. The pathway from the sense amplifier 350a to the bit line includes conductive pathway 1052, bond pad 574b, bond pad 570b, and conductive pathway 1054. Sense amplifier 350b is in communication with a bit line in memory die 302b. The pathway from the sense amplifier 350b to the bit line includes conductive pathway 1054, TSV 1056, bond pad 576b, bond pad 572b, and conductive pathway 1048.

Numerous modifications to the embodiment depicted in FIG. 10B are possible. One modification is for sense amplifiers 350a to be located on first memory die 302a, and for sense amplifiers 350b to be located on second memory die 302b.

Figure 16:
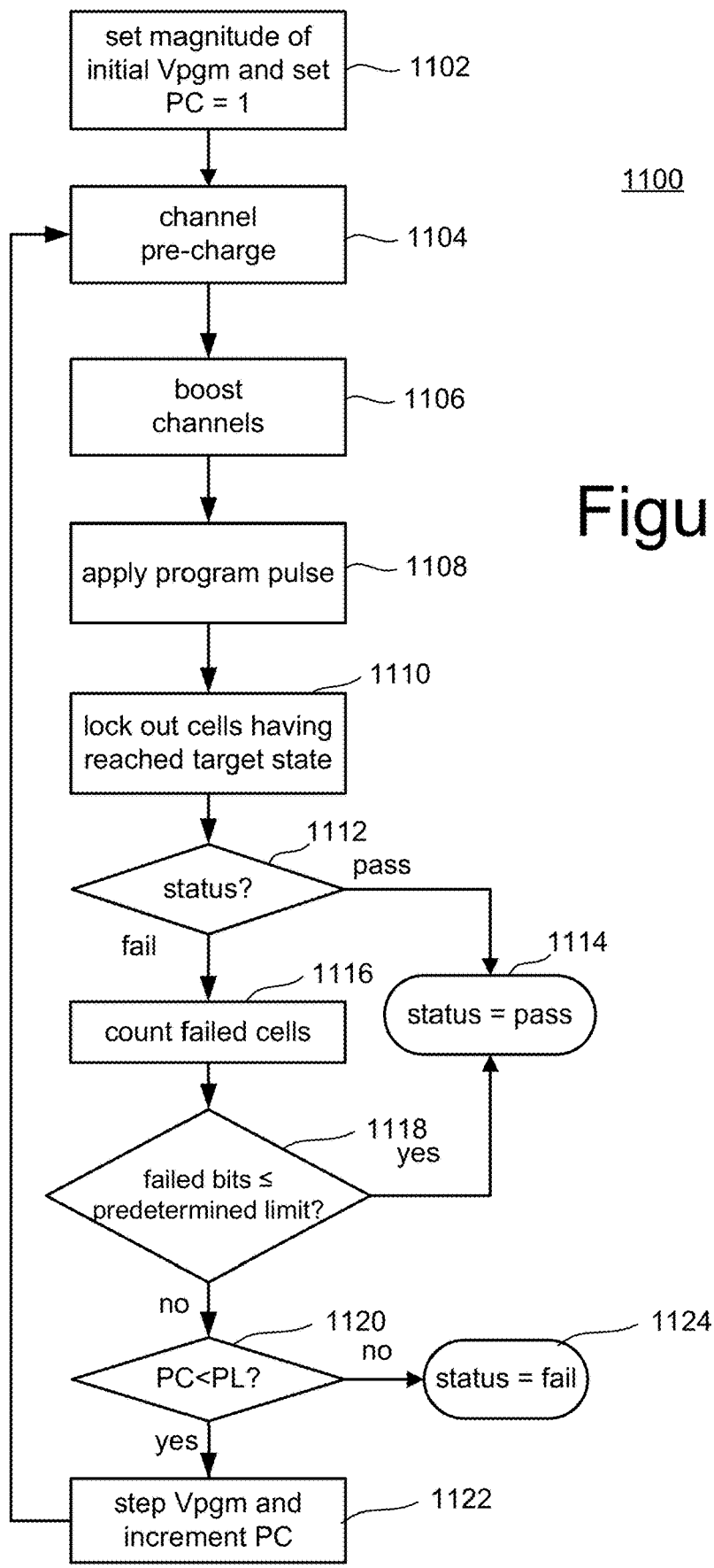
FIG. 16 is a flowchart describing one embodiment of a process for programming non-volatile memory cells organized into a memory array on a memory die.

FIG. 16 is a flowchart describing one embodiment of a process 1100 for programming NAND strings of memory cells. For purposes of this document, the term program and programming are synonymous with write and writing. In one example embodiment, the process of FIG. 16 is performed on integrated memory assembly 104 using the control circuitry 310 discussed above. For example, the process of FIG. 16 can be performed at the direction of state machine 312. In one embodiment, process 1100 is used to program a codeword into memory structure 326. The process of FIG. 16 is performed by control die 104 to program memory cells on the memory die. In one embodiment, the process of FIG. 16 is performed at the direction of state machine 312.

In many implementations, the magnitude of the program pulses is increased with each successive pulse by a predetermined step size. In step 1102 of FIG. 11, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1104 the control die will pre-charge channels of NAND strings that include memory cells connected to the selected word line that are to be inhibited from programming.

In step 1106, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1108, a program pulse of the program signal Vpgm is applied to the selected word line (the word line selected for programming) by the control die. If a memory cell on a NAND string should be programmed, then the corresponding bit line is biased at a program enable voltage, in one embodiment. Herein, such a NAND string is referred to as a "selected NAND string."

In step 1108, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1110, memory cells that have reached their target states are locked out from further programming by the control die. Step 1110 may include performing verifying at one or more verify reference levels. In one embodiment, the verification process is performed by testing whether the threshold voltages of the memory cells selected for programming have reached the appropriate verify reference voltage. In step 1110, a memory cell may be locked out after the memory cell has been verified (by a test of the Vt) that the memory cell has reached its target state.

If, in step 1112, it is determined that all of the memory cells have reached their target threshold voltages (pass), the programming process is complete and successful because all selected memory cells were programmed and verified to their target states. A status of "PASS" is reported in step 1114. Otherwise if, in step 1112, it is determined that not all of the memory cells have reached their target threshold voltages (fail), then the programming process continues to step 1116.

In step 1116, the memory system counts the number of memory cells that have not yet reached their respective target threshold voltage distribution. That is, the system counts the number of memory cells that have, so far, failed to reach their target state. This counting can be done by state machine 312, memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1118, it is determined whether the count from step 1116 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1114. In this situation, enough memory cells programmed correctly such that the few remaining memory cells that have not been completely programmed can be corrected using ECC during the read process. In some embodiments, the predetermined limit used in step 1118 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1120 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1124. If the program counter PC is less than the program limit value PL, then the process continues at step 1122 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1122, the process loops back to step 1104 and another program pulse is applied to the selected word line (by the control die) so that another iteration (steps 1104-1122) of the programming process of FIG. 16 is performed.

Figure 17:
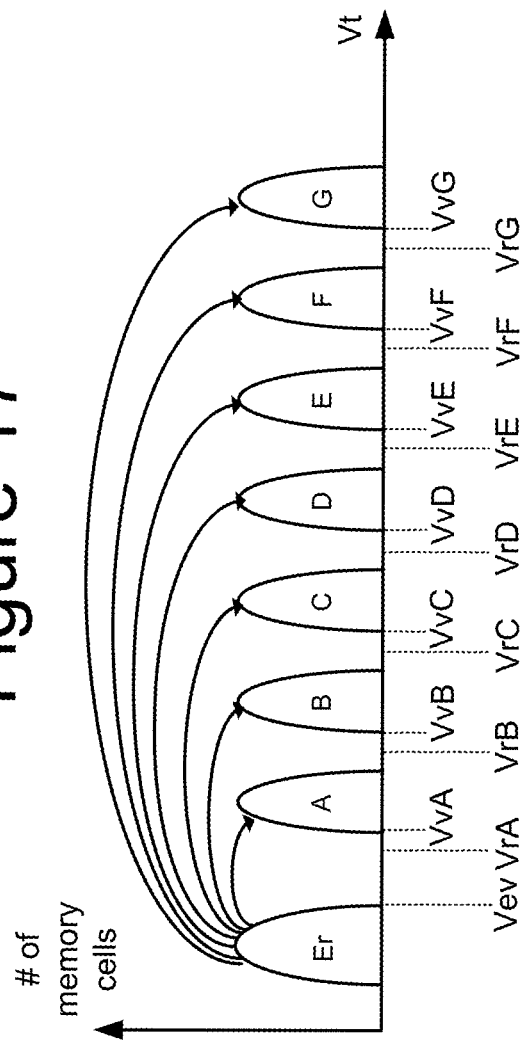
FIG. 17 illustrates example threshold voltage distributions for a population of non-volatile memory cells when each memory cell stores three bits of data.

At the end of a successful programming process, the threshold voltages of the memory cells should be within one or more distributions of threshold voltages for programmed memory cells or within a distribution of threshold voltages for erased memory cells, as appropriate. Memory cells that store one bit of data per memory cell data are referred to as single level cells ("SLC"). Memory cells that store multiple bits of data per memory cell data are referred to as multiple level cells ("SLC"). FIG. 17 illustrates example threshold voltage distributions for the memory array when each memory cell stores three bits of data. Other embodiments, however, may use other data capacities per memory cell (e.g., such as one, two, four, or five bits of data per memory cell). FIG. 17 shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 17 shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 17 also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 17 also shows Vev, which is a voltage level to test whether a memory cell has been properly erased.

In one embodiment, known as full sequence programming, memory cells can be programmed from the erased data state Er directly to any of the programmed data states A-G using the process of FIG. 16. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 17 represent the full sequence programming. In some embodiments, data states A-G can overlap, with control die 304 and/or memory controller 102 relying on error correction to identify the correct data being stored.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 17) or verify operation (e.g. see verify target levels VvA, VvB, VvC, VvD, VvE, VvF, and VvG of FIG. 17) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 18:
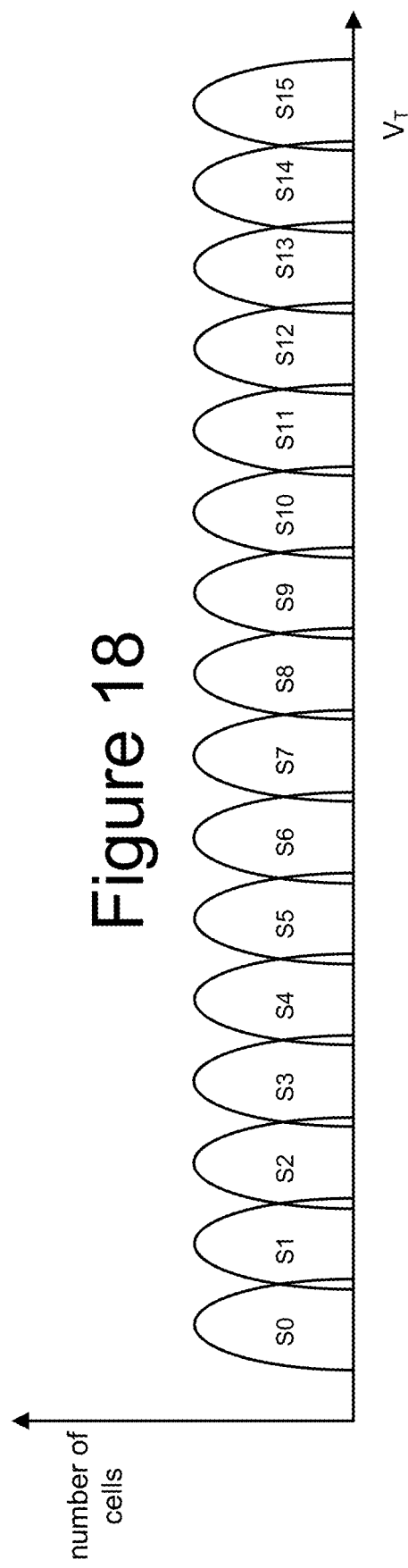
FIG. 18 illustrates example threshold voltage distributions for a population of non-volatile memory cells when each memory cell stores four bits of data.

FIG. 18 depicts threshold voltage distributions when each memory cell stores four bits of data. FIG. 18 depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. When using four bits per memory cell, the memory can be programmed using the full sequence programming discussed above, or multi-pass programming processes (e.g., such as the processes discussed below or others known in the art).

Figure 19A:
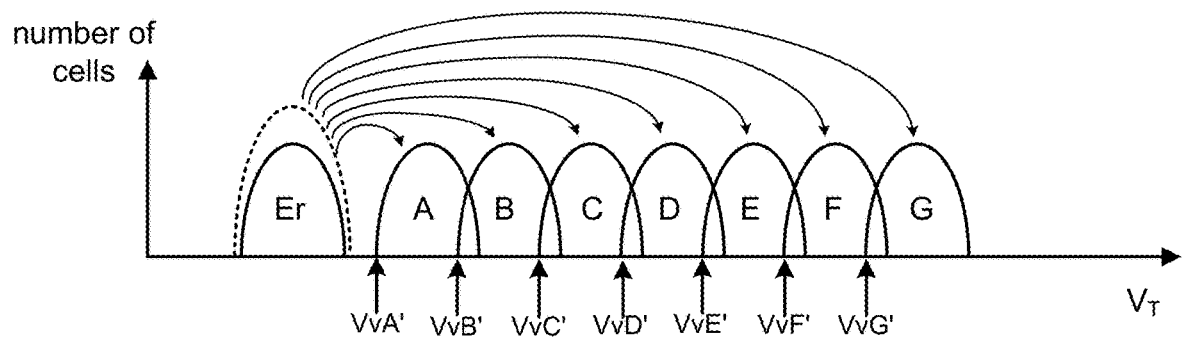
FIGS. 19A and 19B depict threshold voltage distributions for a population of non-volatile memory cells during a process for programming.
Figure 19B:
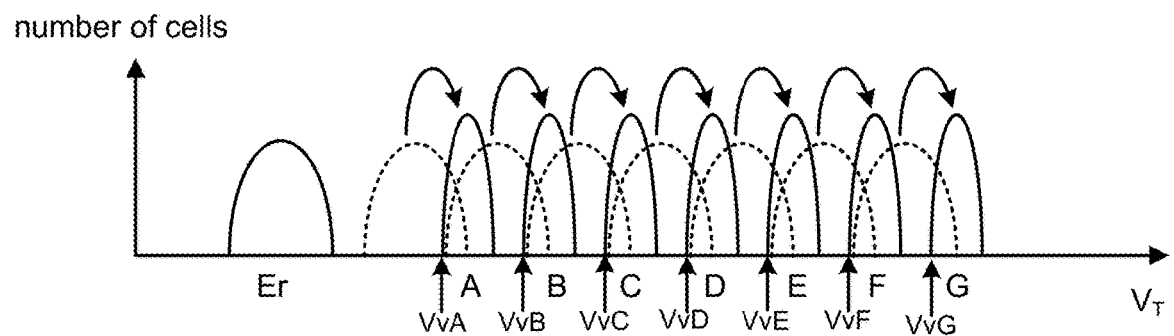

FIGS. 19A and 19B described one example of a multi-pass programming process, referred to a Foggy-Fine Programming. FIG. 19A depicts the first pass of the multi-pass programming process, which includes programming the memory cells from the erased state (Er) to any of the programmed data states A-G, similar to full sequence programming. However, rather than using the standard verify reference voltages (e.g., VvA, VvB, VvC, VvD, VvE, VvF, and VvG), the process of FIG. 19A uses an alternate set of verify reference voltages (e.g., VvA', VvB', VvC', VvD,' VvE', VvF', and VvG') that are each slightly lower than the corresponding standard verify reference voltage. Thus, the threshold voltages of FIG. 19A can be thought of as intermediate threshold voltage distributions (or intermediate data states) that are at lower voltages than the threshold voltages of FIG. 17.

FIG. 19B depicts the second (and last) pass of the multi-pass programming process, which includes programming the memory cells to tighten the threshold distributions. Thus, the memory cells are programmed from the intermediate threshold voltage distributions (or intermediate data states) of FIG. 19A to the final or target threshold voltage distributions (or data states) of FIG. 19B using the standard verify reference voltages (e.g., VvA, VvB, VvC, VvD, VvE, VvF, and VvD). FIG. 19A is referred to as the Foggy pass and FIG. 19B as the Fine Pass. In one embodiment, the Foggy pass of FIG. 19A is performed for a given word line, followed by the Foggy pass for the next word line. The Foggy pass for the next word line could give rise to interference for the given word line, thereby widening the intermediate threshold voltage distributions, which could lead to errors when reading the data. However, the Fine pass of FIG. 19B is subsequently performed after Foggy pass for the next word line, removing or reducing the effects of interference from the next word line. Both passes of the multi-pass programming process of FIGS. 19A and 19B can be implemented using the process of FIG. 16.

The programming processes described by FIGS. 16, 17, 18, 19A, and 19B are performed by control die 304 (e.g., performed by one or more control circuits on one or more control die 304) to program memory cells on memory die 302. In one embodiment, those programming processes are performed at the direction of state machine 312 (or other processor or microcontroller) using the other circuits of control circuitry 310.

Figure 20:
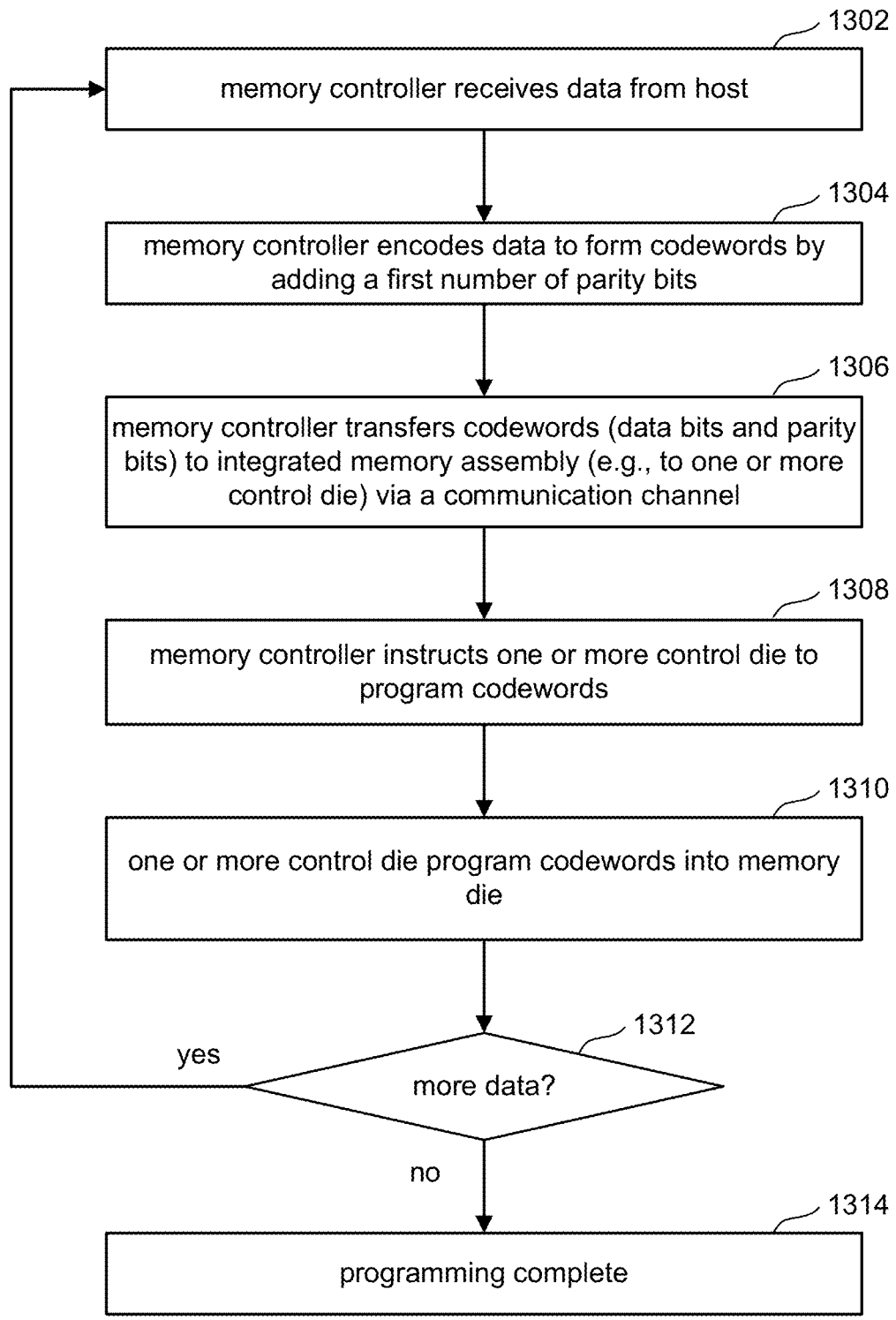
FIG. 20 is a flowchart describing one embodiment of a process for operating a storage system.

FIG. 20 is a flow chart describing one embodiment of a process performed by memory controller 102 to cause data to be programmed into memory cells on memory die 302. In step 1302, memory controller 102 receives data from host 120 via interface 130 (see FIG. 1). The data can be user data, which is data provided by the user of host 120. For example, if host 120 is a digital camera then the data may be all or part of a photograph. In step 1304, memory controller 102 encodes data to form one or more codewords. In this embodiment, memory controller 102 encodes data for ECC purposes, rather than control die 304. In one example, memory controller 102 encodes data by adding parity bits. In one embodiment, memory controller 102 employs a different encoder than control die 304. As such, memory controller 102 will add a different amount of parity bits during the encoding process than control die 304. For example, during step 1304, memory controller (e.g., ECC engine 226/256) adds a first number of parity bits. As will be explained later, when control die 304 encodes data, control die 304 adds a second number of parity bits, where the first number of parity bits is different than the second number of parity bits. On one embodiment, the second number of parity bits is greater than the first number of parity bits.

In step 1306 of FIG. 20, memory controller 102 transfers the codewords (data bits and parity bits) to integrated memory assembly 104 (e.g., to one or more control die 304) via a communication channel (e.g., a Toggle Mode Interface). In step 1308, memory controller 102 instructs the one or more control die 304 to program the codewords transferred in step 1306. In one embodiment, the instruction to perform the programming comprises sending one or more addresses and one or more commands via the communication channel (e.g., a Toggle Mode Interface—see memory controller interface 332). In step 1310, the one or more control die 304 program the codewords into one or more memory die 302. For example, one or more control die 304 perform the programming processes described by FIGS. 16, 17, 18, and/or 19A/B to program memory cells on one or more memory die 302. If there is more data to be programmed (step 1312), then the process of FIG. 20 loops back to step 1302; otherwise, programming is complete (step 1314).

Figure 21:
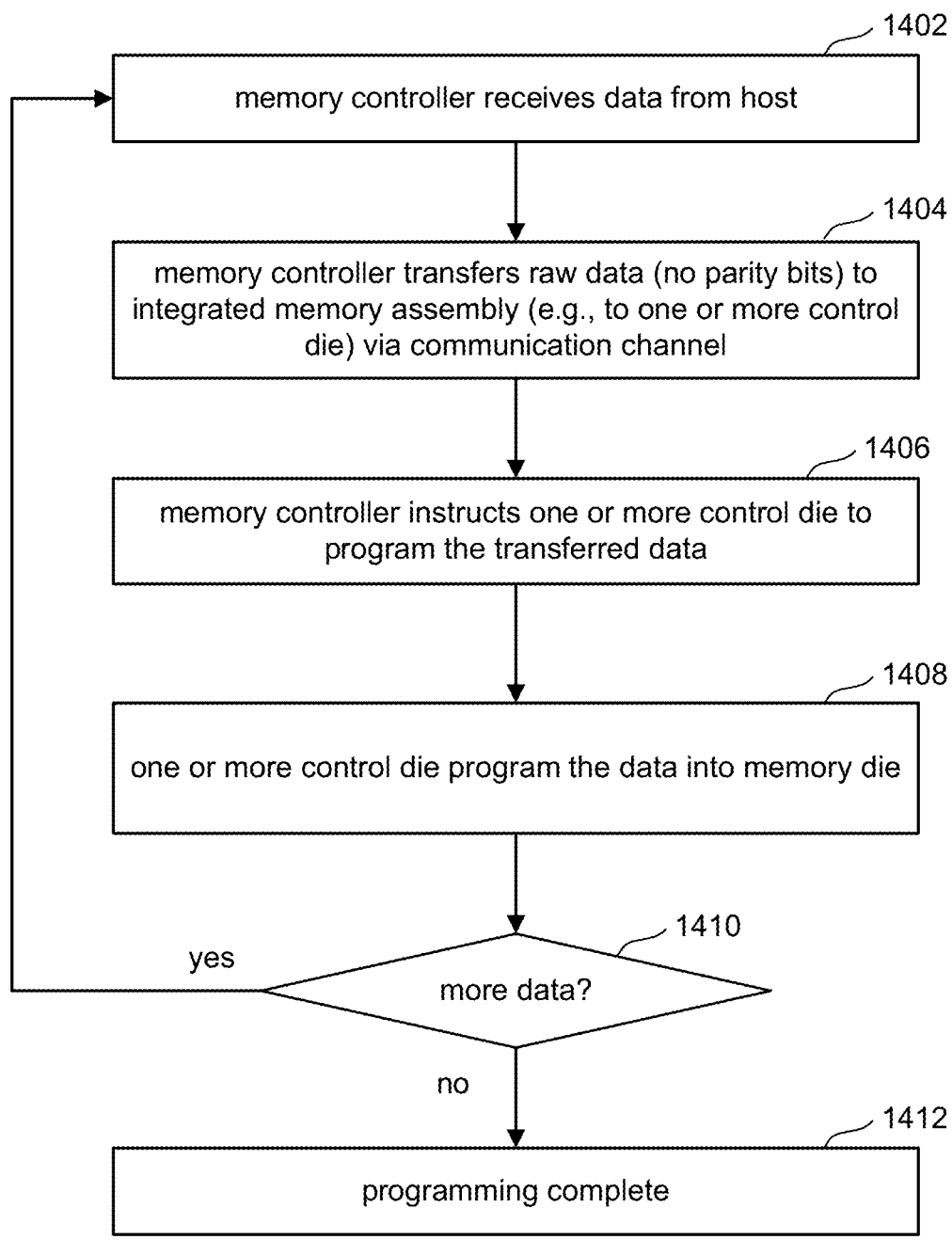
FIG. 21 is a flowchart describing one embodiment of a process for operating a storage system.

FIG. 21 is a flow chart describing another embodiment of a process performed by memory controller 102 to cause data to be programmed into memory cells on memory die 302. In the embodiment of FIG. 21, control die 304 encodes data for ECC purposes, rather than memory controller 102. In step 1402, memory controller 102 receives data from host 120 via interface 130 (see FIG. 1). The data can be user data. In step 1404, memory controller 102 transfers raw data (e.g., data not encoded with ECC information) to integrated memory assembly 104 (e.g., to one or more control die 304) via communication channel (e.g., a Toggle Mode interface). In step 1406, memory controller 102 instructs one or more control die 304 to program the transferred raw data into one or more memory die 302. In one embodiment, the instruction to perform the programming comprises sending one or more addresses and one or more commands via the communication channel (e.g., a Toggle Mode Interface—see memory controller interface 332). In step 1408, the one or more control die 304 program the data into one or more memory die 302. For example, one or more control die 304 perform the programming processes described by FIGS. 16, 17, 18, and/or 19A/B to program memory cells on one or more memory die 302. If there is more data to be programmed (step 1410), then the process of FIG. 21 loops back to step 1402; otherwise, programming is complete (step 1412).

Figure 22:
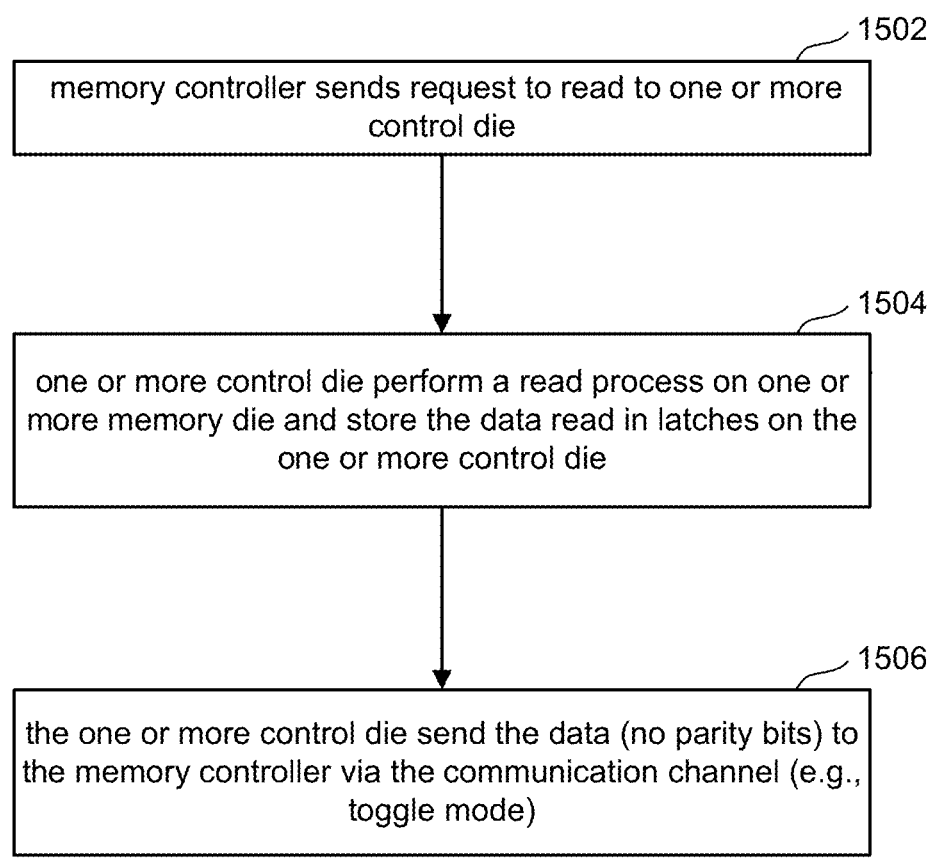
FIG. 22 is a flowchart describing one embodiment of a process for operating a storage system.

FIG. 22 is a flow chart describing one embodiment of a process performed by memory controller 102 to cause data to be read from memory cells on memory die 302. In step 1502, memory controller 102 sends a request to read to one or more control die 304. In one embodiment, the instruction to perform the reading comprises sending one or more addresses and one or more commands via the communication channel (e.g., a Toggle Mode Interface—see memory controller interface 332). In step 1504, one or more control die 304 perform a read process on one or more memory die 302 and store the data read in latches 360 on the one or more control die 302. In step 1506, the one or more control die 304 send the decoded data to memory controller 102 via the communication channel (e.g., a Toggle Mode Interface—see memory controller interface 332). In one embodiment, the one or more control die 304 send the decoded data bits but not the parity bits to memory controller 102 via the communication channel.

As mentioned above, the disclosed memory system uses data shaping to reduce wear on the memory cells. Looking back at FIGS. 17 and 18, in one embodiment the data associated with erased state Er is 111 and the data associated with erased stated S0 is 1111. All of the programmed states (A-G and S1-S15) include a "0." Therefore, reducing the number of zeros in the data being programmed may reduce the need to program a memory cell from the erased state to any programmed state or from the erased state to a programmed state with a higher threshold voltage. Therefore, is one embodiment, the data is shaped to reduce the number of zeros in the data. The shaping is performed according to a mapping rule that can be reversed so that the original data can be recovered. In other embodiment, rather than reducing the number of zeros, the system can reduce the number of ones or predictively and reversibly change the data according to a different strategy in order to more efficiently operate the memory.

In one set of embodiments, the data comprises a first set of bits with each bit of the first set of bits corresponding to a logical value of a set of logical values. The set of logical values includes a first logical value (e.g., 1) and a second logical value (e.g., 0). The control die 304 is configured to shape the data by applying a shaping operation to the first set of bits to generate a second set of bits, where a proportion of bits in the second set of bits having the first logical value is larger for the second set of bits than for the first set of bits. For example, the second set of bits will include more "1" than the first set of bits.

Data to be stored in the non-volatile memory may be considered as a binary string. When the data is being shaped, choosing an integer "m" and partitioning the input data string into substrings of length m will result (with a high probability) in a non-uniform distribution of the $2^m$ substrings of length m in the data. As an example, for m=3, the eight substrings 000, 001, 010, 011, 100, 101, 110, 111 are likely non-uniformly distributed in the input data. For m=2, the four substrings 00, 01, 10, 11 are likely non-uniformly distributed in the input data. Other values of m may also be used.

The input data may be partitioned into substrings of length m, where m is a predefined or dynamically chosen integer, and a substitution mapping may be applied to the sub strings of length m, such that each sub string is mapped/transformed to a sub string of length m (or different length). The substitution may be a permutation of the substrings of length m, and the specific permutation may be defined to satisfy some logical condition. For example, the permutation may be a shaping permutation to reduce a distribution of zeros in the transformed string. A predefined ordering may be applied to the substrings according to a particular logical condition, (e.g., the first substring may be 111 . . . 1, followed by the substrings with one appearance of 0, followed by the substrings with two appearances of 0 in a sub string, etc., until the last sub string may be all 0s). In addition, a dynamic ordering may be defined according to a distribution of the substrings in the input data, such that a most popular substring may be first, followed by all the other substrings according to their popularity. In case of a tie, the order can be decided in any specified way, such as by using a random choice. The two sequences of sub strings (i.e. the sequence according to the predefined ordering and the sequence according to the dynamic ordering) can be linked by a mapping rule such that the permutation will map the ith substring in the second sequence to the ith substring in the first sequence. Other mapping rules can also be used.

In one embodiment, data shaping may include dividing a length n input bit sequence into m bit strings and counting how many strings exist from each type. A one-to-one mapping function/rule from input strings sorted from the most frequent to the least frequent into output strings sorted according to a descending number of 1's in the string (i.e. from the all 1's string to the all 0's string) may be defined. The mapping function/rule may be used to map each input string into an output string. The resulting bit sequence may be output together with the $2^m*m$ bits that define the mapping function that was used for converting the input bit sequence into the output bit sequence.

Figure 23:
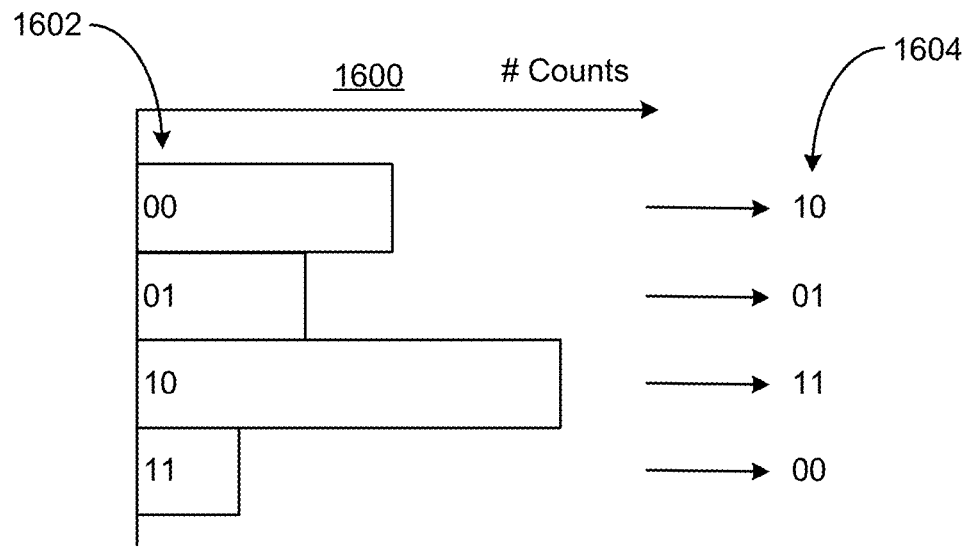
FIG. 23 is a histogram plotting frequency versus data value.

FIG. 23 illustrates an example embodiment of a data shaping 1600 of input substrings 1602 to output substrings 1604 for m=2. A histogram may be generated based on counting how many times each two bit substring appears in an input sequence. The most frequent input substring 10 is mapped/transformed to the output substring 11. The next most frequent input substring 00 is mapped/transformed to 10. The third most frequent input 01 remains 01. The least frequent input substring 11 is mapped to the output substring 00. As a result of this mapping, the number of 1's in the output sequence is larger than the number of 1's in the input sequence.

After the data shaping is applied to the substrings by control die 304, the shaped data may be stored in the memory cells of non-volatile memory 326. In some embodiments, a key to the mapping may also be stored with the shaped data. The key identifies the mapping rule.

The above examples of data shaping are not exhaustive and other data shaping schemes can also be used. More information about data shaping can be found in U.S. Pat. Nos. 8,756,365; 8,799,559; and 9,165,649; all three of which are incorporated herein by reference in their entirety.

As discussed above, in one embodiment the data shaping is designed such that the data to be stored in the memory has more ones than zeros. The mapping function can be designed to achieve different proportions of zeros to ones. Additionally, different input strings may cause different proportions of zeros to ones. The different proportions of zeros to ones are referred to as shaping levels. For example, based on the input string, a system may implement four different shaping levels: (1) 90% zeros, 10% ones; (2) 75% zeros, 25% ones; (3) ⅔ zeros, ⅓ ones; (4) 50% zeros, 50% ones. Other shaping levels can also be used.

Figure 24:
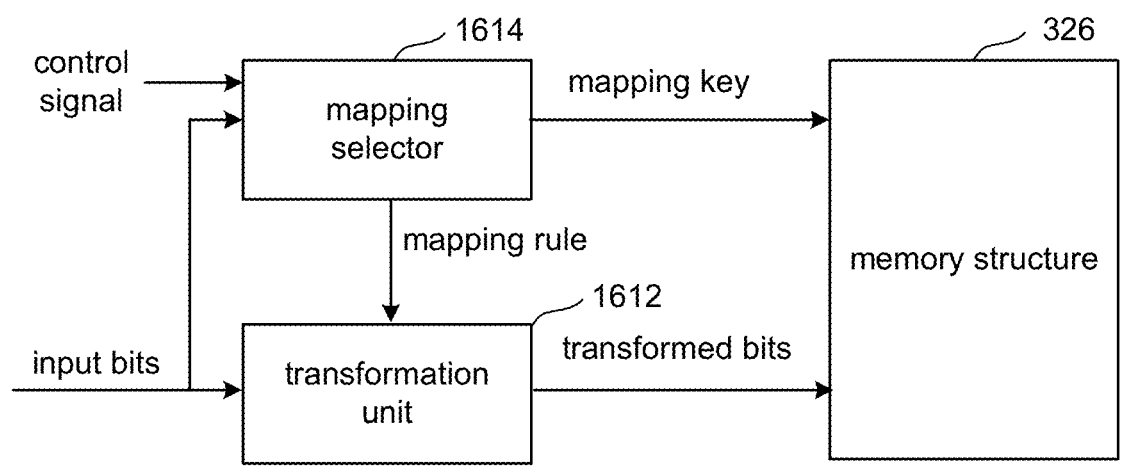
FIG. 24 is a block diagram of components of a data shaping engine.

FIG. 24 depicts one example of the components used to perform the data shaping, and that are part of data shaping circuit 334 (see FIG. 1). The input bits comprise data that is part of a set of information being programmed to memory structure 326 of memory die 302. That input bits are provided to transformation unit 1612 and mapping selector 1614 (both of which can be electrical circuits and/or software). Mapping selector 1614 also receives a control signal from state machine 312. In one embodiment, mapping selector chooses a mapping rule based on a combination of the control signal and input bits. For example, either state machine 312, mapping selector 1614 or another processor can access all of the set of information being programmed to memory structure 326 to determine the frequencies of each input bit sequence (see FIG. 23) and then dynamically determine the mapping rule based on the set of information being programmed to memory structure 326. In one embodiment, state machine 312, mapping selector 1614 or another processor can dynamically determine the value of m in order to obtain a result that minimizes the number of zeros in the output data.

Mapping selector 1614 provides the mapping rule to transformation unit 1612, which maps/transforms input substrings to output substrings, as discussed above and as depicted in FIG. 23. The result of the transformation/mapping by transformation unit 1612, the transformed bits, are programmed into memory structure 326 as described herein. Additionally, mapping selector 1614 provides the mapping key (e.g., an indication of the mapping rule) to be programmed into memory structure 326.

FIGS. 23 and 24 describe a static shaping transformation that includes defining a static transformation and a key, including storing the key in the non-volatile memory. Another set of embodiments implement an adaptive shaping transformation ("AST") that includes defining an adaptive transformation without an additional key. AST is opportunistic and works when the data is compressible, utilizing the inherent redundancy within the data given that it is compressible.

Figure 24A:
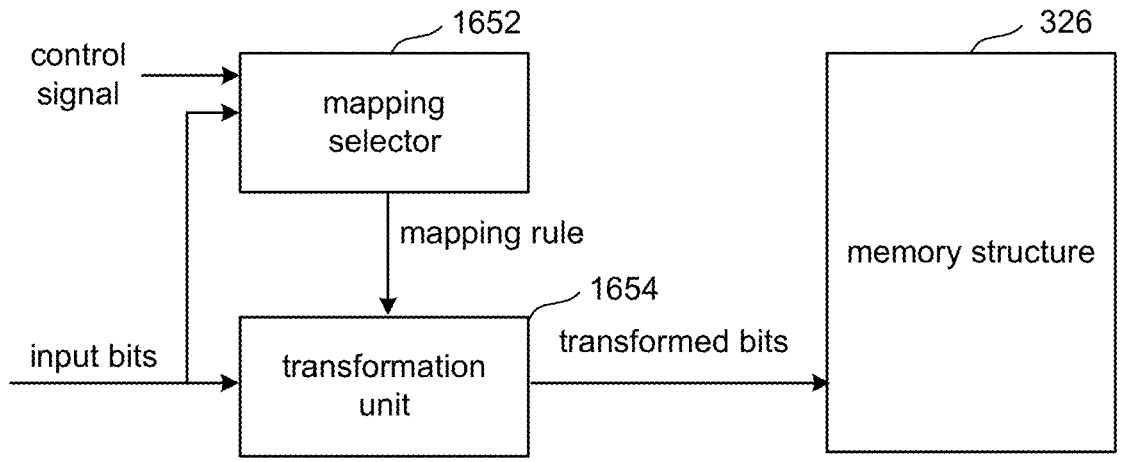
FIG. 24A is a block diagram of components of a data shaping engine.

FIG. 24A illustrates an embodiment of encoding data using AST in a device that includes a mapping selector 1652 and a transformation unit 1654 coupled to memory structure 326. Input bits are received and provided to mapping selector 1652 and transformation unit 1654 Mapping selector 1652 provides a mapping rule to the transformation unit 1654. For example, the mapping selector 1652 may generate and update one or more histograms of sub-sequences in the input bits as the input bits are received and select a mapping of input sub-sequences to output sub-sequences for each successive input sub-sequence. Transformation unit 1654 may apply the mappings received from the mapping selector 1652 for each input sub-sequence to the corresponding sub-sequence of the input bits to generate transformed bits. The transformed bits are stored in the memory structure 326.

AST may be based on a deterministic fixed length transform from n bits into N bits, where N≥n. If no redundancy is to be added, then N=n may be used. AST may be performed without storing any side information (e.g. key) in the memory with the transformed bits. AST is adaptive to changes in characteristics of the input data sequence.

In one embodiment, AST encoding includes: (1) receiving an input bit sequence, (2) transforming the input bit sequence and (3) programming the transformed input bit sequence into the memory. When transforming the input bit sequence, at the j-th encoding step (e.g. j may be initialized to 0 and may be incremented by 1 at each encoding step), map the j-th input bit string of the input bit sequence into an output bit string, such that the mapping function used for converting the j-th input bit string into the j-th output bit string is a function of at least some of the previous bits in the input bit sequence. The output bit string size may be greater than or equal to the input bit string size. Successive encoding steps may be performed until the entire input bit sequence is transformed.

In one embodiment, AST decoding includes: (1) reading the transformed bit sequence from the non-volatile memory; (2) decoding and (3) transferring the decoded bit sequence to the controller or other entity. At the j-th decoding step: map the j-th transformed bit string of the transformed bit sequence into an output bit string, such that the mapping function used for converting the j-th transformed bit string into the j-th output bit string is a function of at least some of the previous bits in the output bit sequence. The output bit string size may be smaller or equal to the transformed bit string size. Processing may continue until the entire transformed bit sequence is decoded. Because selection of mappings in the encoder may be based only on the "history" (e.g. on at least some of the previously processed bits) there may be no need to store any side information—all mapping decisions can be traced back in the decoder by following the same procedure as the encoder.

In one embodiment, the input and output bit string of the encoder (and decoder) are of fixed size m so that at each step of encoding a length m input bit string is mapped into a length m output bit string. The encoder transforms a length n bit sequence into a length n transformed bit sequence (i.e. the encoder preserves a length of the sequence). In another embodiment, an encoder can map a fixed size length m input bit string into a fixed size length M output bit string, where M>m. The encoder may transform a length n bit sequence into a length N transformed bit sequence, where N>n. The encoder may introduce redundancy and in return may induce stronger "shaping" over the output transformed bit sequence.

A mapping function used for converting the j-th input bit string into the j-th output bit string may be chosen based on statistics of the previous bits in the sequence. The statistics of the previous bits may be used for predicting the value of the next input bit string. Based on this prediction a mapping may be chosen that maps the bit strings that are estimated as more probable into output bit strings that satisfy the desired condition (e.g. having a small fraction of 0's). For example, a mapping function may be chosen based on a number of occurrences (i.e. frequency) of each possible string in the previous bits of the sequence such that the more frequent input bit string will be mapped into output bit strings having a smaller fraction of 0's.

As the previous bits ("history") are used for predicting the next input bit string, the prediction can be based on the previous bits that are most indicative for the next input bit string without using all the bits in the "history" with equal weight for sake of the prediction. For example, the "near history" may be more indicative of what is likely to be the next input bit string than the "far history." Several variants of "history" weighting can be used. A mapping may be a function of statistics of previous bits in the input sequence, according to the following variants:

When choosing a mapping, consider conditional statistics, given a context of the last k bits.

Collect statistics on a sliding window of size W—i.e. consider more recent statistics which are based on a window of the most recent W bits.

Give different weight to strings in the window—e.g. give more weight to a recent string than an older string. A weighting function (denoted as g) can be selected—e.g. a flat weighting window $g(j)=1$ (no weighting), a linear weighting window $g(j)=j$, an exponential weighting window $g(j)=cj$ (for some constant c), an adaptive weighting window (weights change during the encoding based on the input sequence).

Figure 24B:
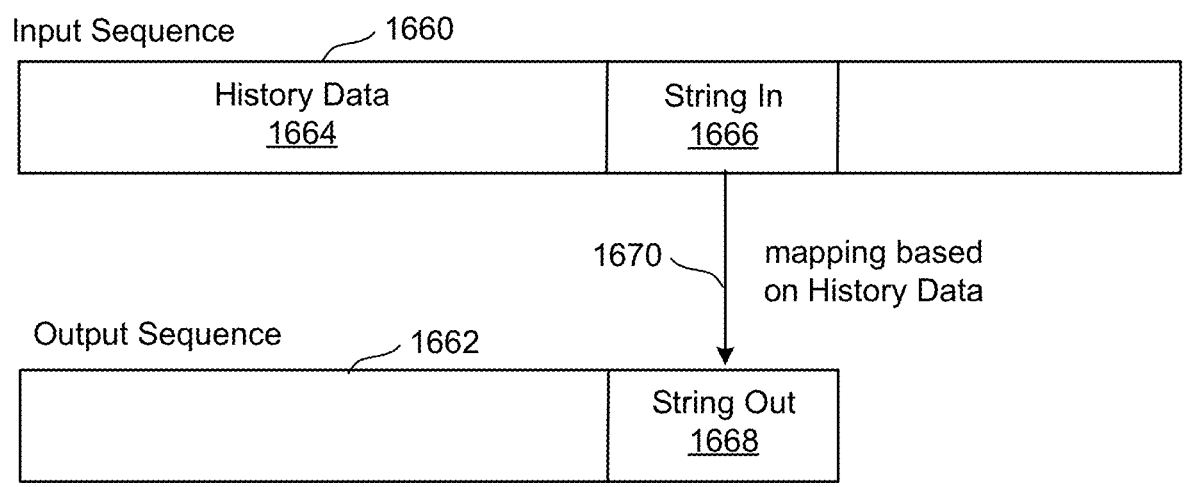
FIG. 24B illustrates an example of the shaping process.

FIG. 24B illustrates the AST shaping process performed by transformation unit 1654. FIG. 24B shows an input sequence 1660 being transformed into an output sequence 1662. Input sequence 1660 of FIG. 24B corresponds to the input bits of FIG. 24A and output sequence 1662 of FIG. 24B corresponds to the transformed bits of FIG. 24A. Transformation unit 1654 is transforming n compressible bits into n shaped bits by converting each input string into a shaped output string using an adaptive mapping. The mapping 1670 used for the current input string is a function of the statistics of previous strings, matching the most frequent "historic" strings to the most shaped strings. FIG. 24B shows that the String-In 1666 is transformed into the String-Out 1668 based on History Data 1664 (e.g., a function of the statistics of History Data 1664), where History Data 1664 contains the previous bits of the input sequence 1664. As all mapping decisions are based on the "history," the mappings can traced back by a de-shaping algorithm that uses the same history (e.g., the data bits read from the memory). As a result, there is no need to store any side information. More details of performing AST are described in U.S. Pat. No. 8,799,559, incorporated herein by reference in its entirety.

Figures 24C, 24D:
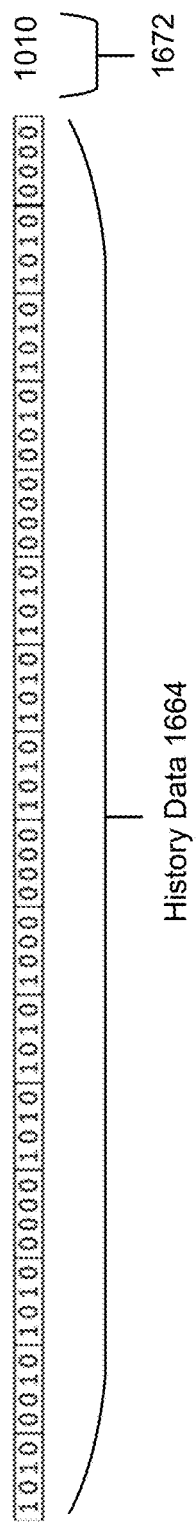
FIG. 24C shows an example of history data.
FIG. 24D is a table built by a mapping selector.

FIGS. 24C and 24D provide an example of how AST works. FIG. 24C shows an example of History Data 1664 comprising sixteen strings, where each string includes 4 bits. Mapping selector 1652 uses the sixteen strings to build the table of FIG. 24D. When the next string is transformed (e.g., the seventeenth string 1672), the table of FIG. 24D is used to transform the seventeenth string 1672 from 1010 to 1111, and the table of FIG. 24D is then updated.

The above-discussion for FIGS. 24A-D represents a direct shaping approach, which includes the shaping performed during a single stage to transform from n (compressible) input bits to n shaped output bits. Another set of embodiments uses an expansion technique that includes two stages. In the first stage, the system uses a lossless compression algorithm (e.g., LZ compression) to compress the input bits. In the second stage, the system expands the compressed data using a shaped code (e.g., Adaptive Reverse Huffman/Run-Length).

Another set of embodiments uses guaranteed shaping based on allocating some of the overhead for the shaping (i.e. adding some shaping bits at the expense of ECC parity bits). Various schemes for shaping data may be used. In some embodiments, a variable length and/or prefix coding scheme and/or Reverse Huffman scheme may be used to induce the non-uniform distribution between programming states. Alternatively or additionally, a trellis shaping technique may be effected in order to encode input data in a manner which increases memory efficiency by inducing a non-uniform distribution between states in the programmed memory cells. Alternatively or additionally, a reverse enumerative source coding scheme may be employed in order to encode input data in a manner which increases memory efficiency by inducing a non-uniform distribution between states in the programmed memory cells.

Figures 24E, 24F:
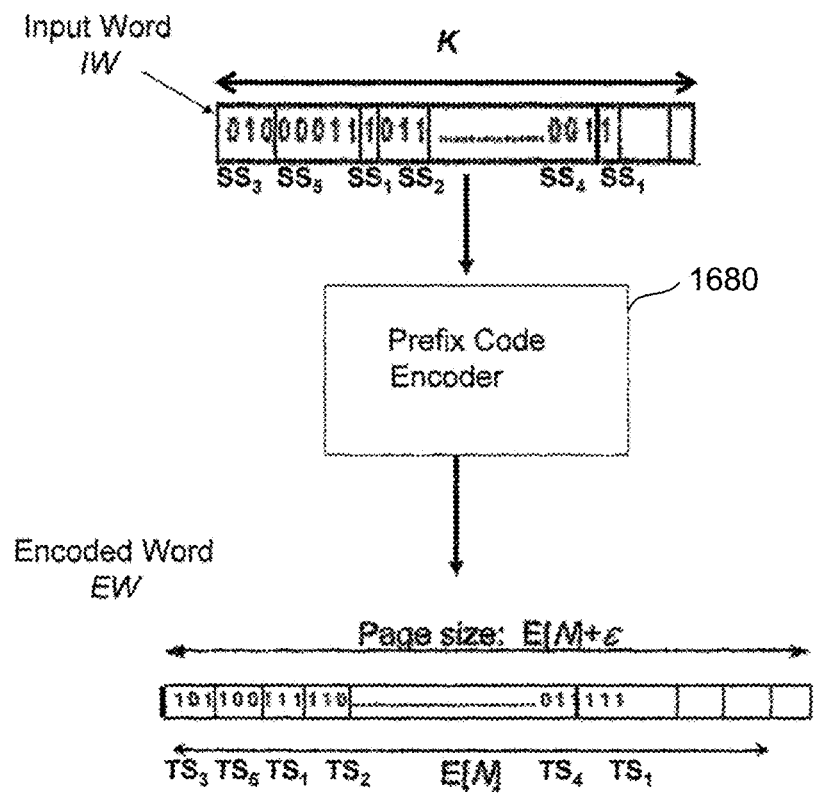
FIG. 24E provides an example of shaping.
FIG. 24F shows a Prefix Code Encoder performing mapping.

One example embodiment of guaranteed shaping, the data shaping is implemented using a variable length code which maps variable length information sequences into fixed length coded sequences utilizing Reverse Huffman coding. In some embodiments, the variable length code is a prefix code. This simplifies the encoding and decoding procedures that can be done using a binary tree search. it has been found that usage of a Huffman prefix code [D. H. Huffman, "A Method For The Construction Of Minimum Redundancy Codes," in Proceedings of IRE, vol. 40, pp. 1098-1101, 1932] can provide optimal tradeoff between overhead and endurance gain. FIG. 24E depicts a table that implements one example of such a scheme as a code map $CM_{RH}$ (RH is an abbreviation for Reverse Huffman) of size s (in this non-limiting example, s=8) where predefined source sequences SS are mapped into target sequences TS. That is, each source sequence $SS_i$ is mapped to a respective target sequence $TS_i$ (i.e. $CM_{RH}=\{SS_1 \rightarrow TS_1, SS_2 \rightarrow TS_2, \ldots SS_S \rightarrow TS_S\}$).

For the non-limiting codemap $CM_{RH}$ of FIG. 24E, variable length "source sequences" of information bits whose length ranges between one bit (i.e. for $SS_1$) and five bits (e.g. for $SS_5$) are mapped into length three-bit "target" sequences of coded bits.

Reference is made to FIG. 24F, where an input word IW of length K is encoded using $CM_{RH}$ of FIG. 24E into encoded word EW of length N. Since $CM_{RH}$ is variable length mapping, the encoded word EW has variable length. In the example of FIG. 24F, input word IW is divided or parsed into "source sequences" —i.e. the source sequences $\{SS_1, SS_2 \ldots SS_8\}$ have the property that input word IW is equal to a concatenation of M source sequences (M is a positive integer) concat($SS_{I1}, SS_{I2}, \ldots SS_{IM}$), where I1, I2 . . . are all positive integers less than or equal to the size s of $CM_{RH}$ (in this example, s=8).

Thus, it is possible to take advantage of this property by (i) "dividing" or "parsing" the input word into the plurality input sequences ($SS_{I1}$, $SS_{I2}$ ... $SS_{IM}$); (ii) individually mapping each input sequence SS into a respective target sequence TS according to the s mappings (in this case 8 mappings) defined in the table of FIG. 24F; (iii) forming the encoded word EW from the concatenation of all of the target sequences, i.e. TW=concat($TS_{I1}$, $TS_{I2}$ ... $TS_{I1}$). FIG. 24F shows Prefix Code Encoder 1680 performing the mapping.

Thus, in the example of FIG. 24F the input word IW is equal to concat($SS_3$, $SS_5$, $SS_1$, $SS_2$ ... ), $I1=3$, $I_2=5$, $I_3=1$, $I_4=2$, ... and the encoded word EW is equal to concat($TS_3$, $TS_5$, $TS_1$, $TS_2$ ... ). It is noted that the length N of the encoded word EW depends upon the content of the input word IW—i.e. for different input words of length K the encoded word EW may have different lengths. More details of the guaranteed shaping discussed above can be found in U.S. Pat. No. 8,756,365, incorporated herein by reference in its entirety.

Although multiple examples of data shaping are provided above, the technology disclosed herein is not limited to any particular type of data shaping and can be used with many different types of data shaping.

FIG. 25 is a flow chart describing one embodiment of a process for programming that includes data shaping. In one example implementation, the process of FIG. 25 is performed by one or more control circuits on one or more control die 304. The process of FIG. 25 is one example implementation of step 1310 of FIG. 20 and/or one example implementation of step 1408 of FIG. 21. In step 1702, the one or more control circuits on one or more control die 304 receive a request to program data on one or more memory die 302. The request is received at the control die 304 from memory controller 102 via the interface to the memory controller (e.g. interface 332). In step 1704, the one or more control circuits on one or more control die 304 receive the data to be programmed from memory controller 102 via the interface to the memory controller (e.g. interface 332). In one embodiment, the one or more control die 304 store the data to be programmed in latches 360 (see FIG. 5) so that the data can be accessed by the one or more control die 304. In step 1706, the one or more control die 304 encode the data to include error correction information. For example, parity bits are added to the data bits. In step 1708, the one or more control die 304 shape the data to create shaped data, as discussed above. In one embodiment, steps 1706 and 1708 are performed entirely on the one or more control die 304 without any participation by the memory controller 102. In some embodiments, the data is encoded prior to shaping while in other embodiments the data is encoded after shaping.

In step 1710, one or more control die 304 program the encoded and shaped data to a set of non-volatile memory cells on the memory die 302. Step 1710 can include performing the programming processes of FIGS. 16, 17, and/or 19A/B. As discussed above, the control die 304 includes voltage generators and decoders for the non-volatile memory array on the memory die 302 so that the voltage generators are configured to generate voltages that the control die 302 applies to the word lines of the non-volatile memory array on memory die (via the pairs of pathways) to program the encoded and shaped data. In one embodiment, the one or more control circuits on the control die 302 are configured to program the encoded and shaped data to a set of non-volatile memory cells on the first semiconductor die by transmitting each bit of the encoded and shaped data to the first semiconductor die via a different pathway pair the plurality of pathways.

FIG. 26 is a flow chart describing another embodiment of a process for programming that includes data shaping. In one example implementation, the process of FIG. 26 is performed by one or more control circuits on one or more control die 304. The process of FIG. 26 is one example implementation of step 1310 of FIG. 20 and/or one example implementation of step 1408 of FIG. 21. The process of FIG. 26 is also one example implementation of the process of FIG. 25.

In step 1802 of FIG. 26, the one or more control circuits on one or more control die 304 receive a request to program data on one or more memory die 302. The request is received at the control die 304 from memory controller 102 via the interface to the memory controller (e.g. interface 332). In step 1804, the one or more control circuits on the one or more control die 304 receive the data to be programmed from memory controller 102 via the interface to the memory controller (e.g. interface 332). In one embodiment, the one or more control die 304 store the data to be programmed in latches 360 (see FIG. 5) so that the data can be accessed by the one or more control die 304. The data received from the memory controller in step 1804 includes user data, without including error correction data and without shaping.

In the embodiment of FIG. 26, the encoding of data is performed by encoder 380 of ECC engine 330 on control die 304. As discussed above, when the encoding is performed on the control die more parity bits can be used because the wide interface between the control die and the memory die can transfer the extra parity bits without degradation in performance or extra consumption of power, as compared to extra transfer on the communication pathway between the memory controller and the control die (e.g., the Toggle Mode bus). Thus, while memory controller 102 is configured to encode user data by adding a first number of parity bits, encoder 380 of ECC engine 330 on control die 304 is configured to encode the data by adding a second number of parity bits, where the second number of parity bits is greater than the first number of parity bits. In some embodiments, the number of parity bits added by encoder 380 of ECC engine 330 on control die 304 is dynamically selectable, meaning that it can be selected in advance or at run time (on the fly). Step 1806 of FIG. 26 includes the one or more control circuits of the one or more control die 304 dynamically selecting a number of parity bits for the encoding process. In some embodiments, the selection is made in advance rather than on the fly. There are many different methods for selecting how many parity bits to add. In one embodiment, the number of parity bits added is chosen based on how strong of an error correction capability is desired, with more parity bits providing a stronger ability to correct more errors. In another embodiment, the number of parity bits added is based on a number of program operations previously performed by the memory die because as a group of memory cells experience more program operations (e.g., more program/erase cycles), the memory cells may degrade in performance and the need for error correction may increase. In another embodiment, the number of parity bits added is chosen based on a number of pathway pairs between the control die 304 and the memory die 302, since the more pathways pairs that exist the more capacity for extra parity bits without slowing down the programming process. Other basis for choosing the number of parity bits is the percentage of the memory structure 326 that is currently storing data, the type of host (secure versus non-secure), type of data (secure versus non-secure or long term versus short terms storage), and/or the optimal number of parity bits to maximize efficiency of data shaping.

In step 1808 of FIG. 26, the one or more control die 304 encode the data to include error correction information and form a codeword that includes the number of parity bits selected in step 1806. In step 1810, the one or more control die dynamically choose a mapping rule from a plurality of mapping rules based on a set of information being programmed to the memory die. For example, the codeword created in step 1808 is one of many codewords being programmed as part of a large transfer of data. All (or a subset) of the data of the large transfer of data can be used to determine the mapping rule, as discussed above. In step 1812, the one or more control die perform data shaping, as discussed above, to shape the codeword to create a shaped codeword. The codeword created in step 1808 comprises a first set of bits. Each bit of the first set of bits corresponds to a logical value of a set of logical values. The set of logical values includes a first logical value and a second logical value. The shaping of the codeword in step 1812 includes applying a shaping operation (applying the chosen mapping rule) to the first set of bits to generate a second set of bits, where a proportion of bits in the second set of bits having the first logical value is larger for the second set of bits than for the first set of bits (e.g., the shaped codeword has a greater percentage of 1s than the codeword before the shaping). In one embodiment, steps 1806-1812 are performed entirely on the one or more control die 304 without any participation by the memory controller 102. In step 1814, the one or more control die program the shaped codeword in the one or more memory die 302. Step 1814 can include performing the programming processes of FIGS. 16, 17, and/or 19A/B.

FIG. 27 is a flow chart describing another embodiment of a process for programming that includes data shaping. In one example implementation, the process of FIG. 27 is performed by one or more control circuits on one or more control die 304. The process of FIG. 27 is one example implementation of step 1310 of FIG. 20 and/or one example implementation of step 1408 of FIG. 21. The process of FIG. 27 is also one example implementation of the process of FIG. 25.

In step 1902 of FIG. 27, the one or more control circuits on one or more control die 304 receive a request to program data on one or more memory die 302. The request is received at the control die 304 from memory controller 102 via the interface to the memory controller (e.g. interface 332). In step 1904, the one or more control circuits on one or more control die 304 receive the data to be programmed from memory controller 102 via the interface to the memory controller (e.g. interface 332). In one embodiment, the one or more control die 304 store the data to be programmed in latches 360 (see FIG. 5) so that the data can be accessed by the one or more control die 304. The data received from the memory controller in step 1904 includes user data, without including error correction data and without shaping. In step 1906, the one or more control circuits on one or more control die 304 dynamically choose a mapping rule from a plurality of mapping rules based on a set of information being programmed to the memory die. Step 1906 of FIG. 27 is analogous to step 1810 of FIG. 26.

In step 1908, the one or more control circuits on one or more control die 304 shape the data the data received in step 1904 to create shaped data. The data received in step 1904 comprises a first set of bits. Each bit of the first set of bits corresponds to a logical value of a set of logical values. The set of logical values includes a first logical value and a second logical value. The data is shaped by applying a shaping operation (applying the chosen mapping rule) to the first set of bits to generate a second set of bits, where a proportion of bits in the second set of bits having the first logical value is larger for the second set of bits than for the first set of bits (e.g., the shaped data has a greater percentage of 1s than the data before the shaping).

In step 1910, the one or more control circuits of the one or more control die 304 dynamically select a number of parity bits for the encoding process (e.g., second number of parity bits greater than first number of parity bits—as discussed above). Step 1910 of FIG. 27 is analogous to step 1806 of FIG. 26. In step 1912, the one or more control circuits of the one or more control die 304 encode the data by encoding the shaped data to include error correction information and form a codeword. The codeword includes data bits and the selected number of parity bits. In step 1914, the one or more control circuits of the one or more control die 304 rotate bits of the codeword to change position of the parity bits. Rotating the position of the parity bits distributes (and, thereby, improves) the wear on the memory cells as the embodiment of FIG. 27 performs the shaping prior to adding the parity so that the parity bits are not shaped. If there was not rotation, the same memory cells would continue to always receive unshaped data and they would wear out faster than other memory cells. By rotating the parity bits, all of the memory cells should wear at the same rate. In one embodiment, the amount of rotation needs to be stored in the memory structure 326 or on the control die 304 so that the control die knows how to rotate the codeword back to original position when reading the codeword from the memory structure 326. In step 1916, the one or more control circuits of the one or more control die 304 program the encoded and shaped data by programming the shaped codeword. Step 1916 can include performing the programming processes of FIGS. 16, 17, and/or 19A/B. In one embodiment, steps 1906-1914 are performed entirely on the one or more control die 304 without any participation by the memory controller 102

Figure 28:
FIG. 28 depicts a codeword.
Figure 29A:
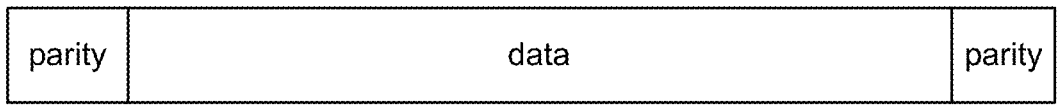
FIGS. 29A-C depict codewords.
Figure 29B:
Figure 29C:
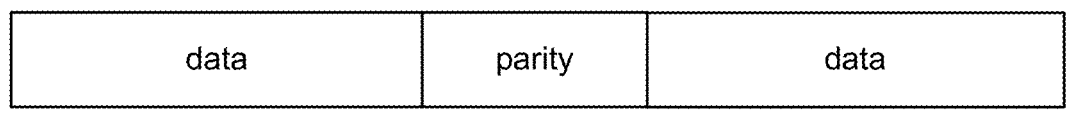

FIGS. 28 and 29A-C provide examples of rotating the bits of the codeword to change position of the parity bits, as performed in step 1914 of FIG. 27. FIG. 28 shows a codeword prior to the rotation of step 1914. The codeword includes data bits (data) and parity bits (parity) at an initial position. FIGS. 29A-C show three different examples of how the codeword can be rotated; however, the rotation of the codeword is not limited to these three examples. FIG. 29A shows the same codeword as FIG. 28, but rotated to a first position such that a portion of the parity bits have been rotated to a different side of the codeword. FIG. 29B shows the same codeword as FIG. 28, but rotated to a second position. FIG. 29C shows the same codeword as FIG. 28, but rotated to a third position. In each of FIGS. 29A-C, rotating the bits of the codeword change the position of the parity bits.

Figure 30:
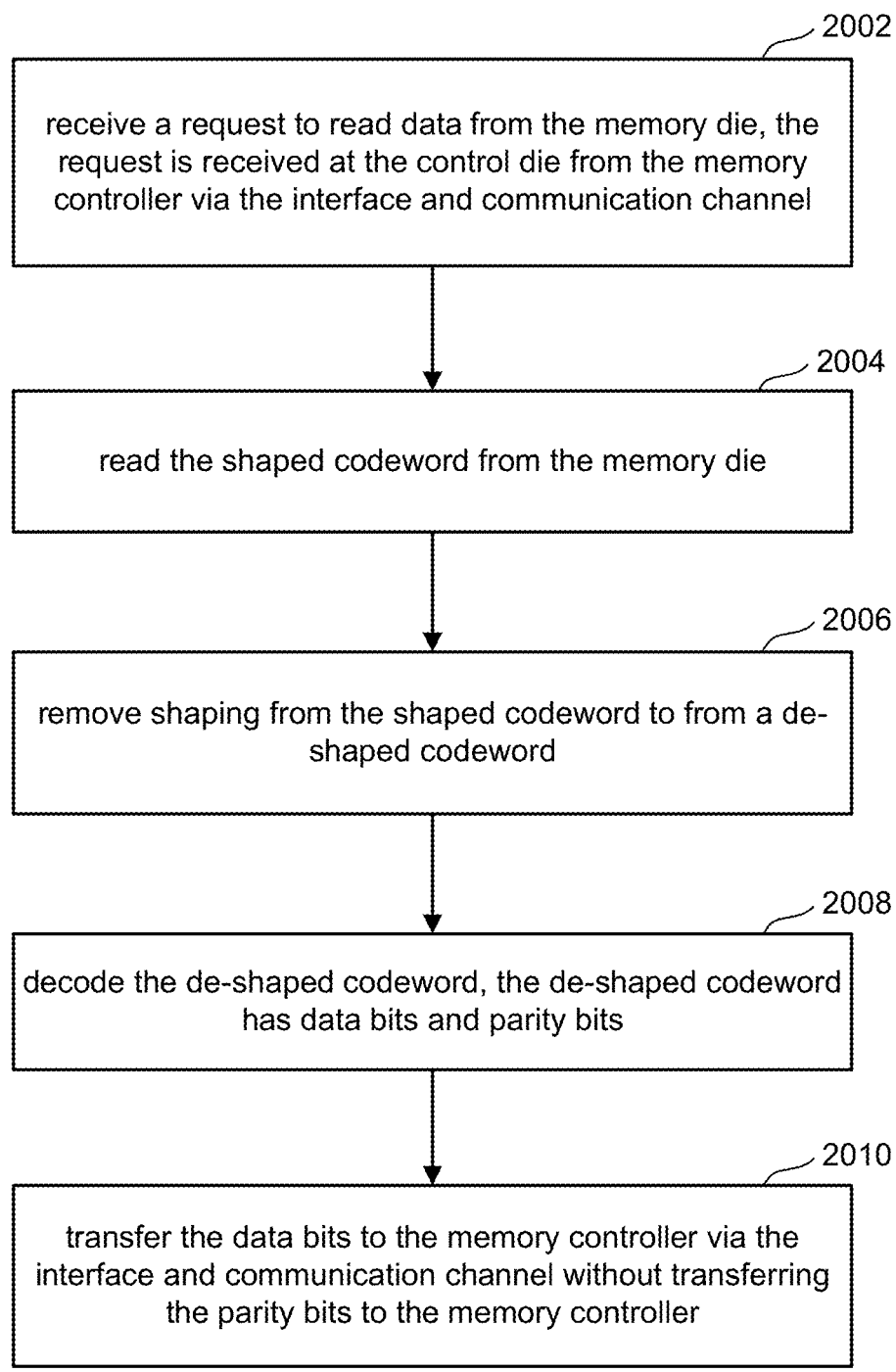
FIG. 30 is a flowchart describing one embodiment of a process for performing a read process.

FIG. 30 is a flow chart describing one embodiment of a process for reading data from non-volatile memory structure 326. In one example implementation, the process of FIG. 30 is performed by one or more control circuits on one or more control die 304. The process of FIG. 30 is one example implementation of step 1504 of FIG. 22. In step 2002, the one or more control circuits on one or more control die 304 receive a request to read data from the memory die. The request is received at control die 304 from the memory controller 102 via interface 332 and communication channel 336 (e.g., Toggle Mode). In step 2004, the one or more control circuits on one or more control die 304 read the shaped codeword from the memory die. In step 2006, the one or more control circuits on one or more control die 304 remove shaping from the shaped codeword to form a de-shaped codeword. In step 2008, the one or more control circuits on the one or more control die 304 decode the de-shaped codeword. The de-shaped codeword has data bits and parity bits. In step 2010, one or more control circuits on the one or more control die 304 transfer the data bits to the memory controller 102 via the interface 332 and communication channel 336 without transferring the parity bits to memory controller 102. In one embodiment, the control die 304 includes the sense amplifiers for reading data from the non-volatile memory cells of memory structure 326 on memory die 302.

Figure 31:
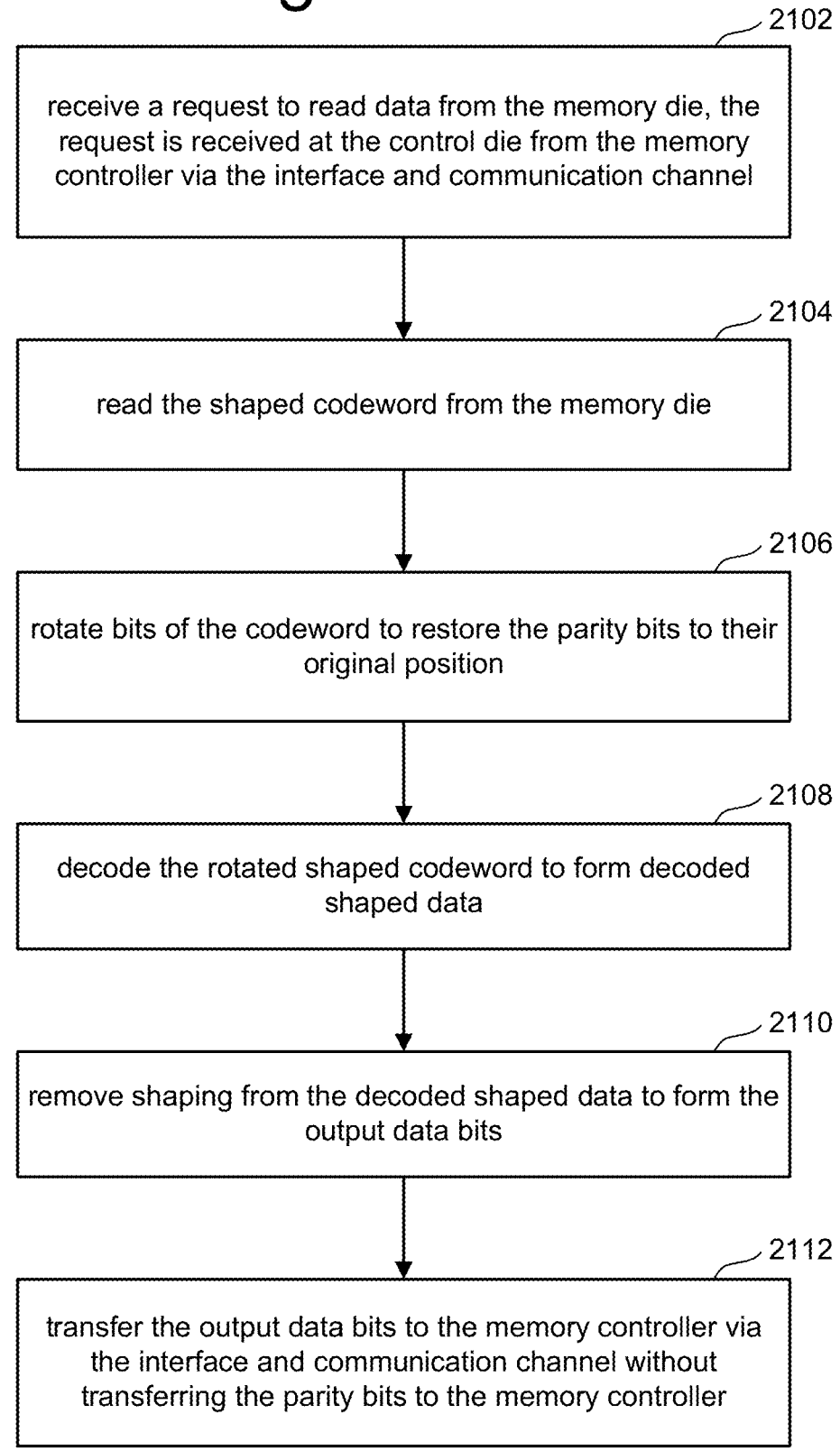
FIG. 31 is a flowchart describing one embodiment of a process for performing a read process.

FIG. 31 is a flow chart describing one embodiment of a process for reading data from non-volatile memory structure 326. In one example implementation, the process of FIG. 31 is performed by one or more control circuits on one or more control die 304. The process of FIG. 31 is one example implementation of step 1504 of FIG. 22. In step 2102, the one or more control circuits on one or more control die 304 receive a request to read data from the memory die. The request is received at control die 304 from the memory controller 102 via interface 332 and communication channel 336 (e.g., Toggle Mode). In step 2104, the one or more control circuits on one or more control die 304 read the shaped codeword from the memory die. In step 2106, the one or more control circuits on one or more control die 304 rotates the codeword read in order to restore the parity bits to their original position. For example, step 1914 of FIG. 27 rotated the bits of the codeword from their original position to a new position (see e.g., FIGS. 28, 29A, 29B and 29C). Step 2106 includes rotating the bits back to the position before step 1914. In step 2108, the one or more control circuits on one or more control die 304 decode the rotated shaped codeword to form decoded shaped data. In step 2110, the one or more control circuits on the one or more control die 304 remove shaping from the decoded shaped codeword to form the output data bits. In step 2012, one or more control circuits on the one or more control die 304 transfer the output data bits to the memory controller 102 via the interface 332 and communication channel 336 without transferring the parity bits to memory controller 102. In one embodiment, the control die 304 includes the sense amplifiers for reading data from the non-volatile memory cells of memory structure 326 on memory die 302.

As discussed above, in one set of embodiments, the data shaping is designed such that the data to be stored in the memory has more zeros than ones. The mapping function can be designed to achieve different proportions of zeros to ones. Additionally, different input strings may cause different proportions of zeros to ones. The different proportions of zeros to ones are referred to as shaping levels. For example, based on the input string, a system may implement four different shaping levels: (1) 90% zeros, 10% ones; (2) 75% zeros, 25% ones; (3) ⅔ zeros, ⅓ ones; (4) 50% zeros, 50% ones. Other shaping levels can also be used.

One property of a chunk of data is its entropy, which is a measure of how well (or how much) the chunk of data can be compressed or shaped. More specifically, entropy refers to the amount of disorder or uncertainty in data. In one example embodiment, entropy is expressed as a number between 0 and 1, where 0 represents data with the most certainty (e.g., easier to guess what the next data will be) and 1 represent data with no certainty (completely random data).

In one example embodiment, if there is a set of k different values, then entropy can be calculated as follows:

$$\text{entropy}(\text{Set}) = -\sum_{i=1}^{k} P(value_i) \cdot \log_2(P(value_i))$$

where $P(value_i)$ is the probability of getting the ith value when randomly selecting one from the set.

So, for example, for the set R={h,h,h,1,1,1,1,1}:

$$\text{entropy}(R) = -\left[\left(\frac{3}{8}\right)\log_2\left(\frac{3}{8}\right) + \left(\frac{5}{8}\right)\log^2\left(\frac{5}{8}\right)\right]$$

When a mapping function for data shaping is applied to different data chunks with different entropy values, the output of the data shaping may be at different shaping levels. It is typical that over an entire population of data stored in a memory system (such as all data stored in an SSD) that there will be data chunks with different entropy values. Data chunks with different entropy values will cause non-uniformity of shaping levels across the memory.

To take advantage of data shaping and increase programming throughput (and reduce power needed for programming), it is proposed in one set of embodiments to divide the non-volatile memory into several partitions. Each of the partitions is assigned to a shaping level such that all of the data chunks stored in that partition are shaped at the same shaping level. Each data chunk received at the control die 304 will be shaped by the control die 304 based on its entropy to one of a predefined number of shaping levels and stored in the partitions assigned to that shaping level. In some embodiments, this may be done based on wear leveling considerations, for example, data with higher shaping level will be directed to a block which is more worn out, in order to balance the wear level of all the blocks. The partitions can be logical partitions or physical partitions. Examples of physical partitions include a physical memory block, a portion of a physical memory block, multiple a physical memory blocks, or other physical portions of one or more planes.

Figure 32:
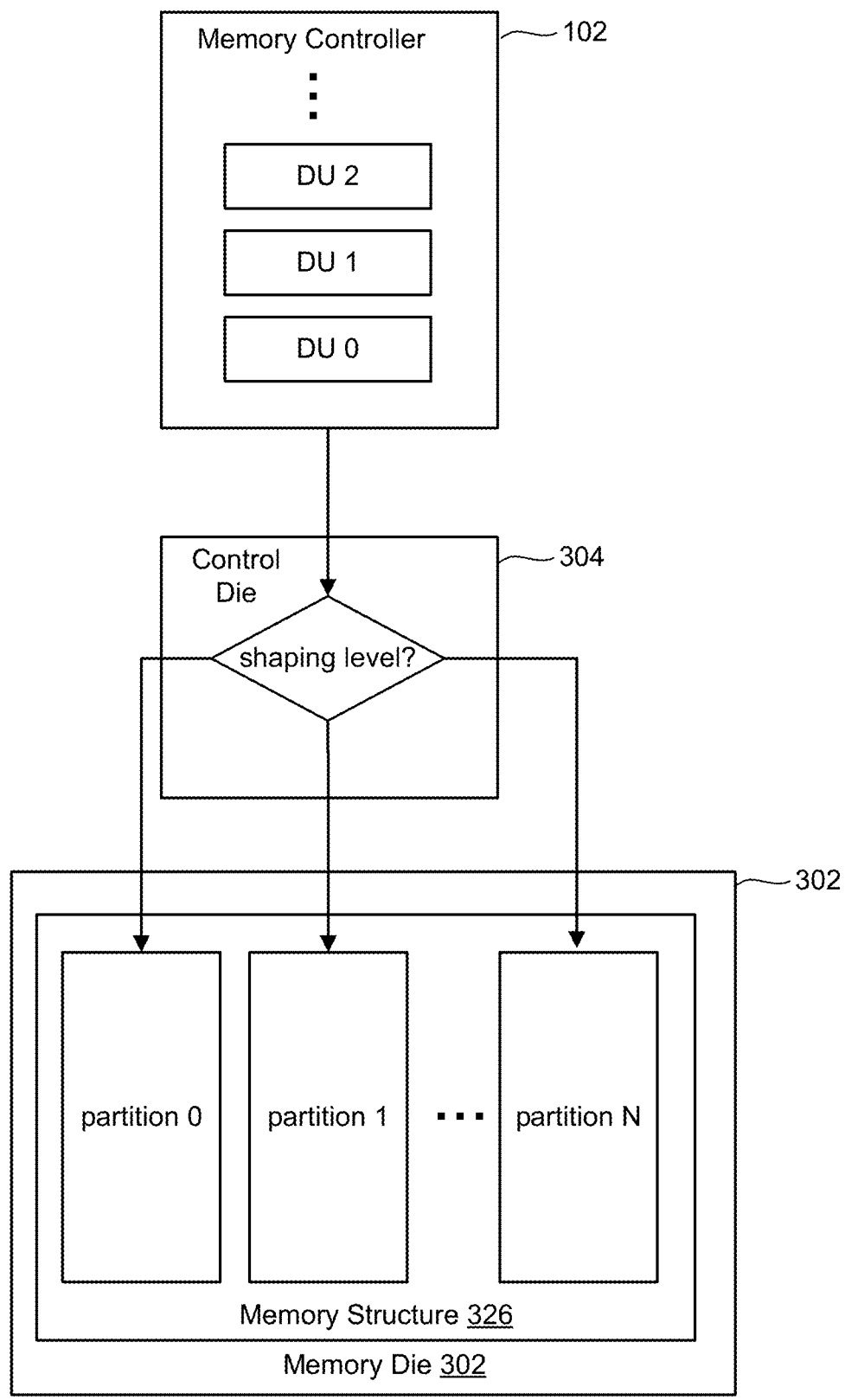
FIG. 32 is a block diagram depicting a portion of the memory system.

FIG. 32 is a block diagram of a portion of the memory system described above. In FIG. 32, non-volatile memory structure 326 comprises non-volatile memory cells organized into multiple physical partitions (partition 0, partition 1, . . . , partition N). The partitions can be portions of a memory array, planes, portions of a plane of memory, portions of multiple memory arrays or portions of multiple memory dies, etc. A partition can include one or multiple blocks. Each partition is assigned to a different shaping level. Control die 304 is connected to the non-volatile storage and configured to write shaped data to a partition of the multiple physical partitions that is assigned to a same shaping level as the shaped data.

FIG. 32 shows memory controller 102 accessing a set of units of data (DU 0, DU 1, DU 2, . . . ). Each unit of data is a chunk of data that will be written to the memory structure 320. The technology described herein is not limited to any particular size of data. The unit of data to be written to memory structure 320 is transmitted to control die 304. Based on the shaping level, control die 304 will program the unit of data into the appropriate partition (e.g., partition 0, partition 1, . . . , partition N) assigned to the same shaping level as the unit of data. Some memory system will only have two partitions, while other memory systems can have many partitions. In one embodiment, each partitions is assigned to a different shaping level. In other embodiments, more than one partition can be assigned to a shaping level. In one embodiment, the system will have two partitions, each storing data at aa different shaping level. For example, one partition may store data at a first shaping level that includes 90% zeros and 10% ones while a second partition stores data at a second shaping level that includes 50% zeros and 50% ones.

Figure 33:
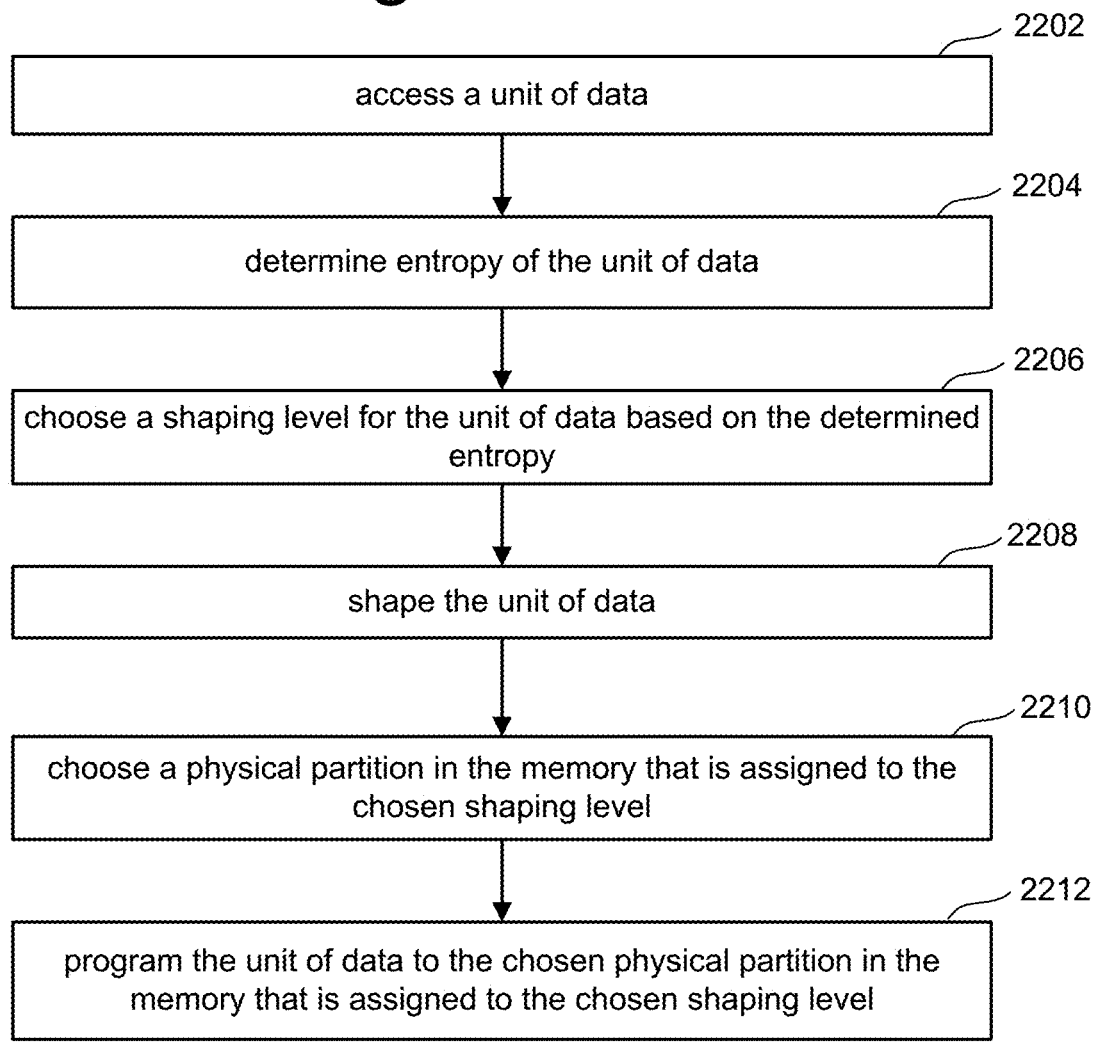
FIG. 33 is a flowchart describing one embodiment of a process for performing data shaping using different partitions assigned to different levels of shaping.

FIG. 33 is a flow chart describing one embodiment for operating the structure of FIG. 32 to perform writing (programming) using the proposed technology for data shaping with corresponding partitions. The process of FIG. 33 can be performed by a host, a controller, a control die 304 and/or one or more control circuits on the memory die. In one embodiments, all of the steps of FIG. 33 are performed by a control die 304. The process of FIG. 33 is an example implementation that can be performed by control die 304 as part of the shaping and programming of FIGS. 25, 26 and 27.

In step 2202 of FIG. 33, control die 304 accesses a unit of data. For example, the unit of data may be received from the memory controller or otherwise accessed from a local storage unit (e.g. latch) on the control die 304. In step 2204, the entropy for the accessed unit of data is determined. For example, the equation set forth above (or a different method) can be used by the host, the controller, the control die or another entity to calculate entropy. In step 2206, a shaping level is chosen for the unit of data based on the determined entropy. In some examples, the entropy determined is an indication of the maximum shaping that can be accomplished, and then the system uses that information to choose a shaping level from a set of predetermined shaping levels. As discussed above, one embodiment includes predetermining a set of shaping levels and dividing the non-volatile memory into a set of partitions with each partition assigned to a different shaping level. So there may not be a predetermined shaping level for every possible entropy; therefore, the system will choose the best fit. In the example above with two shaping levels (90/10 and 50/50), any data that can achieve 90/10 will be assigned to 90/10, with the remaining data assigned to 50/50. If data is assigned to a shaping level 90/10, then in some embodiments that data is shaped to exactly 90/10 while in other embodiments that data is shaped to 90/10 or better. The shaping level can be chosen by the host, the controller or the control die. In step 2208, the data is shaped to achieve the shaping level chosen in step 2206. The data shaping can be performed by the control die 304. Steps 2202-2208 represent example implementations of step 1708 of FIG. 25, step 1812 of FIG. 26 and step 1908 of FIG. 27.

In step 2210 of FIG. 33, a partition is chosen for storing the shaped and transformed data. In one embodiment, there is one partition for each predetermined shaping level so step 2210 comprises identifying the partition assigned to the shaping level chosen in step 2206. In other embodiments, more than one partition can be assigned to a shaping level; therefore, step 2210 comprises choosing one of those partitions. The choosing of step 2210 is performed by control die 304. In step 221, the control die 304 programs/writes the shaped data into the chosen partition (assigned to the chosen shaping level) in the non-volatile memory. Steps 2210-2212 represent example implementations of step 1710 of FIG. 25, step 1814 of FIG. 26 and step 1916 of FIG. 27.

In the above discussion regarding directing data to a specific memory partition/block according to its entropy/shaping level, in some embodiments the memory partitions/blocks are preassigned to a shaping level. In another set of embodiments, memory partitions/blocks are assigned to a shaping level dynamically (e.g., in order to perform wear leveling or other strategy). For example, the control die (or memory controller or other entity) can continuously track the wear or health of each memory block/partition and direct data with higher shaping level into memory blocks/partitions which are more worn out (less healthier) and data with low shaping level into memory blocks/partitions which are less worn out (heathier). This dynamic assignment of blocks/partitions to shaping levels can change continuously in order to keep the wear level of all blocks roughly the same (such that overall memory life is prolonged).

Figure 34:
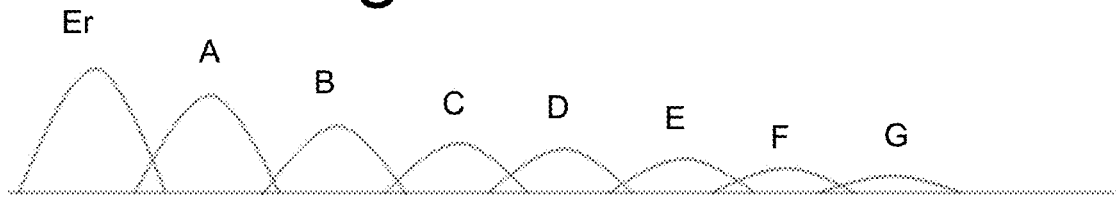
FIG. 34 illustrates example threshold voltage distributions for a population of non-volatile memory cells when each memory cell stores three bits of data.

In some of the above examples of data shaping, the goal was to minimize zeros or minimize/maximize another attribute. This is particularly useful for shaping SLC data—single bit of data per memory cell. However, in some embodiments, shaping MLC data (multiple bits of data per memory cell) may be different and/or more involved than simply inducing a high fraction of 1's and a low fraction of 0's. For example, the objective may be to induce a distribution of threshold voltages or memory cells assigned to data states having decreasing probability with increasing data state (e.g., as depicted in FIG. 34). FIG. 34 shows eight threshold voltage distributions that correspond to the eight data states of FIG. 17. The first threshold voltage distribution (data state) Er represents memory cells that are erased. The other seven threshold voltage distributions (data states) A-G represent memory cells that are programmed and, therefore, are also called programmed data states. Each threshold voltage distribution (data state) corresponds to predetermined values for the set of data bits. Data shaping can be accomplished by selecting the appropriate mapping from m-bit tuples to data states such that the erased data state Er includes the most amount of memory cells, followed by data state A having the second most amount of memory cells, followed by data state B having the third most amount of data memory cells, etc. Programming a population of memory cells to the threshold voltage distributions of FIG. 34 will reduce wear on the memory cells because less programming is performed than a uniform distribution of memory cells among data states Er-G (as depicted in FIG. 17).

Data shaping can also be incorporated as part of on-chip-copy operation. Data may be first programmed as SLC data, wherein the shaping scheme attempts to induce the high fraction of 1's (Er state) and a low fraction of 0's (programmed data state). Then, a folding operation is performed in the background by the control die 304 to copy the SLC data, combine the SLC data with other SLC data to form combined MLC data, shape the combined MLC data to form shaped MLC data and program that shaped MLC data into the non-volatile memory structure 326. This folding operation is preferably done using an on-chip-copy operation, without transferring all (or any of) the data into the memory controller. As part of this on-chip-copy operation the data will be read (accessed) from SLC memory cells on the memory die into the control die, decoded to correct one or more errors, de-shaped (remove shaping), reshaped for MLC data, and re-encoded for ECC (all done within the control die 304). Then the data is programmed as MLC data to on the memory die. In one embodiment, this process depends on the m=2/3/4 pages of data that were read from SLC (after counting the number m-bit tuples of each type). This is not known in advance, as when the control die receives a page of data from the host and writes it to SLC the control die does not know the other m-1 pages that will end up with this page when it is later folded to MLC data. Hence, the MLC shaping of FIG. 34 can only be done as part of the folding operation once all the m pages are available, so having the shaping function within the control die 304 is an enabler for doing such on-chip folding operation with shaping, without the need to transfer all the data to the memory controller.

FIG. 35 is a flow chart describing one embodiment of a process performed by one or more integrated memory assemblies 104 to implement an on-chip-copy operation without sending the data being copied to memory controller 102 and without memory controller 102 being involved in the operations performed during the on-chip-copy. In one embodiment, the process of FIG. 35 is performed by one or more control circuits on one or more control die 304 after the one or more control die 304 have programmed multiple code words (e.g. multiple pages) of shaped SLC data to one or more memory die using one or more of the processes described above for shaping and programming data.

In step 2302 of FIG. 35, one or more control die 304 of one or more integrated memory assemblies receive a request to copy data on one or more memory die 302. The request, which is for an on-chip-copy operation, is received at the one or more control die 304 from an off die circuit (e.g., memory controller 102) via an interface to the off die circuit, such as the communication channel discussed above (e.g., a Toggle Mode Interface—see memory controller interface 332). In step 2304, the one or more control die 304 read and transfer one or more codewords from the one or more memory die 302 in response to the request. The one or more codewords are stored in a first set of non-volatile memory cells on the one or more memory die 302. In one embodiment, the one or more codewords are stored on the one or more memory die 302 as single bit per memory cell data. In another embodiment, the one or more codewords are stored on the one or more memory die 302 as multiple bit per memory cell data. The first set of non-volatile memory cells can all be part of the same block or across multiple blocks. The first set of non-volatile memory cells can all be on the same memory die or across multiple memory die. The one or more control die 304 store the one or multiple codewords transferred from the one or more memory die 302 in step 1704 in latches on the one or more control die 304. All of the codewords can be stored on one control die 304 or across multiple control die 304.

In step 2306, the one or more control die 304 perform a decoding process for the one or more codewords stored in the latches on the one or more control die using a low power, lower resolution LDPC decoding process. In one embodiment, step 2306 is performed entirely on the one or more control die 304. In step 2308, the one or more control die 304 identify one or more errors in the one or multiple codewords stored in the latches. The errors in the codewords are identified as part of the decoding process, as discussed above. In one embodiment, step 2308 is performed entirely on the one or more control die 304.

In step 2310, the one or more control die 304 correct one or more identified errors in the one or multiple codewords stored in the latches on the one or more control die 302. In one embodiment, the correcting of errors comprises changing a subset of data bits in the latches and/or changing a subset of the parity bits in the latches. In one embodiment, corrected codewords are codewords that have been decoded and had identified errors fixed. If no errors were found, the result is still a corrected codeword. In one embodiment, step 2310 is performed entirely on the one or more control die 304. In step 2312, the one or more control die 304 remove shaping from the corrected codewords. In one embodiment, step 2312 is performed entirely on the one or more control die 304. In step 2314, the one or more control die 304 combine codewords for SLC data to form MLC data. For example, three codewords for SLC data can be combined to form one codeword of three bits per memory cell MLC data. In another example, three pages of SLC data are combined to form one page of three bits per memory cell MLC data. In another example, three blocks of SLC data are combined to form one block of three bits per memory cell MLC data. The MLC data can also be two bits per memory cell or more than three bits per memory cell. In step 2316, the one or more control die 304 re-shape the data. That is, the MLC data that resulted from combining the SLC data into MLC data is subjected to data shaping, as described above. In one embodiment, the objective of the data shaping in step 2316 is to induce a distribution of threshold voltages or memory cells assigned to data states having decreasing probability with increasing data state, such as depicted in FIG. 34. In one embodiment, step 2316 is performed entirely on the one or more control die 304. In step 2318, the one or more control die 304 encode the re-shaped MLC data (e.g., apply ECC) to form codewords for storage in the memory.

In step 2320, the one or more control die 304 program the one or multiple codewords formed in step 2318 to a second set of non-volatile memory cells on the one or more memory die of one or more integrated memory assemblies. The system can use any of the programming processes discussed herein or known in the art. The second set of non-volatile memory cells are different than the first set of one or more memory cells such that the codewords are copied from one location on the one or more memory die 304 to a different location on the one or more memory die. In another embodiment, the codewords can be copied from a first location to the same location (thereby merely correcting the errors in the codewords). In one embodiment, the one or more control die 304 program the one or multiple codewords to the second set of non-volatile memory cells as single bit per memory cell data. In another embodiment, the one or more control die 304 program the one or multiple codewords to the second set of non-volatile memory cells as multiple bit per memory cell data such that all or a subset of the memory cells of the second set of non-volatile memory cells stores data from the multiple codewords. For example, in one embodiment each codewords stores a page of data and three codewords can be stored in the same memory cells as three bits per memory cell data with each memory cell storing one bit for each of the three codewords. In one embodiment, step 2320 is performed entirely by one or more control die 304 and one or more memory die 302, and not by any memory controller. In one embodiment, all steps of the process depicted in FIG. 35 are performed without transferring any of the codewords or data to memory controller 102. In one embodiment, a memory die 302 is paired with a corresponding control die 304 and all of the steps of the process depicted in FIG. 25 are performed by and on a pair of one control die 304 and its corresponding memory die 302.

A data shaping process has been disclosed that includes adding error correction information (e.g., parity bits) and performing the data shaping at the integrated memory assembly rather than at the memory controller. This technology takes advantage of having the control die at the memory die (both are part of the integrated memory assembly) to encode more parity bits and more efficiently shape the data.

One embodiment comprises an apparatus that includes a first semiconductor die and a second semiconductor die. The first semiconductor die includes non-volatile memory cells and a first plurality of pathways. The second semiconductor die includes one or more control circuits, an interface to an off die circuit and a second plurality of pathways. The one or more control circuits are configured to transfer signals to the first semiconductor die through pathway pairs of the first plurality of pathways and the second plurality of pathways. The interface to the off die circuit is separate from and different than the pathway pairs. The one or more control circuits on the second semiconductor die are configured to: receive a request to program data on the first semiconductor die, the request is received from the off die circuit via the interface to the off die circuit; receive the data to be programmed from the off die circuit via the interface to the off die circuit; on the second semiconductor die, encode the data to include error correction information; on the second semiconductor die, shape the data to create shaped data; and program the encoded and shaped data to a set of non-volatile memory cells on the first semiconductor die. In some embodiments, the data is encoded prior to shaping while in other embodiments the data is encoded after shaping.

In one example implementation, the one or more control circuits are configured to: read the shaped codeword from the first semiconductor; remove shaping from the shaped codeword to from a de-shaped codeword; decode the de-shaped codeword, the de-shaped codeword has data bits and parity bits; and transfer the data bits to the off die circuit without transferring the parity bits to the off die circuit. Additionally, the apparatus further comprises a memory controller separate from the first semiconductor die and the second semiconductor die. The memory controller is the off die circuit. The memory controller is connected to the second semiconductor die by a communication channel. The memory controller is configured to decode codewords at a first resolution and first power level. The one or more control circuits on the second semiconductor die are configured to decode codewords at a second resolution that is lower than the first resolution and at a second power level that is lower than the first power level.

In one example implementation, the one or more control circuits are configured to program the encoded and shaped data to the set of non-volatile memory cells on the first semiconductor die as SLC data; the one or more control circuits are configured to program additional data as additional encoded and shaped data to non-volatile memory cells on the first semiconductor die as SLC data; and the one or more control circuits are further configured to: access, decode, correct one or more errors and remove shaping from the encoded and shaped data that is stored on the first semiconductor die as SLC data, access, decode, correct one or more errors and remove shaping from the additional encoded and shaped data that is stored on the first semiconductor die as SLC data, combine the data and additional data to form combined MLC data, shape the combined MLC data to form shaped MLC data, and program the shaped MLC data such on the first semiconductor die.

One embodiment includes a process, comprising: at a control die, accessing data to be programmed into a memory die that is physically attached to the control die; selecting a number of parity bits; at the control die, encoding the data to include error correction information and form a codeword that includes the number of parity bits, the codeword comprises a first set of bits, each bit of the first set of bits corresponds to a logical value of a set of logical values, the set of logical values includes a first logical value and a second logical value; at the control die, shaping the codeword to create a shaped codeword by applying a shaping operation to the first set of bits to generate a second set of bits, where a proportion of bits in the second set of bits having the first logical value is larger for the second set of bits than for the first set of bits; and programming the shaped codeword on the memory die.

One embodiment includes an apparatus comprising a memory controller configured to communicate with a host and an integrated memory assembly in communication with the memory controller. The integrated memory assembly comprises a memory die and a control die bonded to the memory die. The memory die includes non-volatile memory cells. The memory controller is configured to encode data by adding a first number of parity bits. The control die is configured to encode data by adding a second number of parity bits. The second number of parity bits is greater than the first number of parity bits. The memory controller is configured to transfer first data to the control die. The memory controller is configured to request that the first data be programmed on the memory die. The control die is configured to: encode the first data to add error correction information and form a codeword, the codeword comprises a first set of bits, each bit of the first set of bits corresponds to a logical value of a set of logical values, the set of logical values includes a first logical value and a second logical value; shape the codeword to create a shaped codeword by applying a shaping operation to the first set of bits to generate a second set of bits, where a proportion of bits in the second set of bits having the first logical value is larger for the second set of bits than for the first set of bits; and program the shaped codeword on the memory die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

For purposed of this document, the terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the disclosed technology and its practical application, to thereby enable others skilled in the art to best utilize it in various embodiments and with various modifications as are suited to the particular use contemplated. It is intended that the scope be defined by the claims appended hereto.

We claim:

1. An apparatus, comprising:
a first semiconductor die comprising non-volatile memory cells and a first plurality of pathways; and
a second semiconductor die directly bonded to the first semiconductor die, the second semiconductor die comprising one or more control circuits, an interface to a memory controller and a second plurality of pathways, the one or more control circuits are configured to transfer signals to the first semiconductor die through pathway pairs of the first plurality of pathways and the second plurality of pathways, the interface to the memory controller is separate from and different than the pathway pairs, the pathway pairs provide a wider interface than the interface to the memory controller, the one or more control circuits on the second semiconductor die are configured to:
receive a request to program data on the first semiconductor die, the request is received from the memory controller via the interface to the memory controller,
receive the data to be programmed from the memory controller via the interface to the memory controller,
on the second semiconductor die, encode the data to include error correction information,
on the second semiconductor die, shape the data to create shaped data, and
program the encoded and shaped data to a set of non-volatile memory cells on the first semiconductor die.

2. The apparatus of claim 1, wherein:
the data comprises a first set of bits, each bit of the first set of bits corresponds to a logical value of a set of logical values, the set of logical values includes a first logical value and a second logical value; and
the one or more control circuits are configured to shape the data by applying a shaping operation to the first set of bits to generate a second set of bits, where a proportion of bits in the second set of bits having the first logical value is larger for the second set of bits than for the first set of bits.

3. The apparatus of claim 1, wherein:
the data is part of a set of information being programmed to the first semiconductor die;
the data comprises a first set of bits; and
the one or more control circuits are configured to shape the data by dynamically selecting a mapping rule based on the set of information being programmed and applying the selected mapping rule to the first set of bits to map the first set of bits to a second set of bits.

4. The apparatus of claim 1, wherein:
the one or more control circuits are configured to encode the data by encoding the shaped data to include error correction information and form a codeword, the codeword includes data bits and parity bits;
the one or more control circuits are configured to rotate bits of the codeword to change position of the parity bits; and
the one or more control circuits are configured to program the encoded and shaped data by programming the codeword after the bits are rotated.

5. The apparatus of claim 1, wherein:
the one or more control circuits are configured to encode the data to include error correction information and form a codeword;
the one or more control circuits are configured to shape the data by shaping the codeword to form a shaped codeword; and
the one or more control circuits are configured to program the encoded and shaped data by programming the shaped codeword.

6. The apparatus of claim 1, wherein:
the one or more control circuits are further configured to select a number of parity bits, the one or more control circuits are configured to encode the data to include error correction information by adding the number of parity bits to the data to form a codeword.

7. The apparatus of claim 1, wherein:
the one or more control circuits are further configured to dynamically select a number of parity bits based on a number of program operations previously performed by the first semiconductor die, the one or more control circuits are configured to encode the data to include error correction information by adding the number of parity bits to the data to form a codeword.

8. The apparatus of claim 1, wherein:
the one or more control circuits are further configured to select a number of parity bits based on a number of pathway pairs, the one or more control circuits are configured to encode the data to include error correction information by adding the number of parity bits to the data to form a codeword.

9. The apparatus of claim 1, wherein:
the data to be programmed that is received from the memory controller via the interface to the memory controller includes user data, without including error correction data and without shaping.

10. The apparatus of claim 1, wherein:
the first semiconductor die includes a non-volatile memory array; and
the second semiconductor die includes sense amplifiers for reading data from the non-volatile memory array on the first semiconductor die.

11. The apparatus of claim 10, wherein:
the non-volatile memory array includes word lines;
the second semiconductor die includes address decoders for the non-volatile memory array on the first semiconductor die; and
the second semiconductor die includes signal generators configured to generate voltages applied to the word lines of the non-volatile memory array on the first semiconductor die to program the encoded and shaped data.

12. The apparatus of claim 1, wherein:
the one or more control circuits are configured to program the encoded and shaped data to a set of non-volatile memory cells on the first semiconductor die by transmitting each bit of the encoded and shaped data to the first semiconductor die via a different pathway pair the plurality of pathways.

13. The apparatus of claim 1, wherein the one or more control circuits are configured to:
read the shaped codeword from the first semiconductor die;
remove shaping from the shaped codeword to from a de-shaped codeword;
decode the de-shaped codeword, the de-shaped codeword includes data bits and parity bits; and
transfer the data bits to the memory controller without transferring the parity bits to the memory controller.

14. The apparatus of claim 1, wherein the one or more control circuits are configured to:

read the shaped codeword from the first semiconductor die;
rotate bits of the shaped codeword to restore parity bits of the codeword to their original position;
decode the rotated shaped codeword to form decoded shaped data;
remove shaping from the decoded shaped data to from output data bits; and
transfer the output data bits to the memory controller without transferring the parity bits to the memory controller.

15. The apparatus of claim 1, wherein:
the non-volatile memory cells are organized into multiple partitions, each partition is assigned to a different shaping level;
the one or more control circuits on the second semiconductor die are configured to choose a shaping level for the data;
the one or more control circuits on the second semiconductor die are configured to program the encoded and shaped data to a partition of the multiple partitions that is assigned to the chosen shaping level; and
the partition of the multiple partitions that is assigned to the chosen shaping level includes the set of non-volatile memory cells on the first semiconductor die.

16. The apparatus of claim 1, wherein:
the one or more control circuits are configured to program the encoded and shaped data to the set of non-volatile memory cells on the first semiconductor die as SLC data;
the one or more control circuits are configured to program additional data as additional encoded and shaped data to non-volatile memory cells on the first semiconductor die as SLC data; and
the one or more control circuits are further configured to:
access, decode, correct one or more errors and remove shaping from the encoded and shaped data that is stored on the first semiconductor die as SLC data,
access, decode, correct one or more errors and remove shaping from the additional encoded and shaped data that is stored on the first semiconductor die as SLC data,
combine the data and additional data to form combined MLC data,
shape the combined MLC data to form shaped MLC data, and
program the shaped MLC data on the first semiconductor die.

17. A method, comprising:
a memory controller receiving data from a host that is separate from the memory controller;
the memory controller transferring the data to an integrated assembly comprising a control die bonded to a memory die;
receiving the data at the control die from the memory controller;
at the control die, selecting a number of parity bits;
at the control die, encoding the data to include error correction information and form a codeword that includes the selected number of parity bits, the codeword comprises a first set of bits, each bit of the first set of bits corresponds to a logical value of a set of logical values, the set of logical values includes a first logical value and a second logical value;
at the control die, shaping the codeword to create a shaped codeword by applying a shaping operation to the first set of bits to generate a second set of bits, where a proportion of bits in the second set of bits having the first logical value is larger for the second set of bits than for the first set of bits; and
programming the shaped codeword on the memory die.

18. The process of claim 17, further comprising:
choosing a mapping rule from a plurality of mapping rules based on a set of information being programmed to the memory die, the shaping operation comprises applying the mapping rule to the codeword to generate the second set of bits.

19. The process of claim 17, wherein:
the data received at the control die from the memory controller includes user data without including parity bits.

20. A non-volatile storage apparatus, comprising:
a memory controller configured to communicate with a host, the memory controller is separate from the host; and
an integrated memory assembly connected to the memory controller, the integrated memory assembly comprises a memory die and a control die directly bonded to the memory die, the memory die includes non-volatile memory cells;
the memory controller is configured to encode data by adding a first number of parity bits, the control die is configured to encode data by adding a second number of parity bits, the second number of parity bits is greater than the first number of parity bits;
the memory controller is configured to transfer first data to the control die;
the memory controller is configured to request that the first data be programmed on the memory die,
the control die is configured to:
encode the first data to add error correction information and form a codeword, the codeword comprises a first set of bits, each bit of the first set of bits corresponds to a logical value of a set of logical values, the set of logical values includes a first logical value and a second logical value,
shape the codeword to create a shaped codeword by applying a shaping operation to the first set of bits to generate a second set of bits, where a proportion of bits in the second set of bits having the first logical value is larger for the second set of bits than for the first set of bits, and
program the shaped codeword on the memory die.

21. The non-volatile storage apparatus of claim 20, wherein:
the first set of bits comprises data bits and parity bits; and
the first data that is transferred from the memory controller to the control die includes the data bits without including the parity bits.

22. The non-volatile storage apparatus of claim 20, wherein:
the non-volatile memory cells comprise a non-volatile memory array;
the non-volatile memory array includes word lines and bit lines;
the control die includes sense amplifiers for reading data from the non-volatile memory array on the memory die, the sense amplifiers are connected to the bit lines; and
the control die includes a signal generator configured to generate a voltage applied to one or more of the word lines to program the shaped codeword.

23. The apparatus of claim 1, wherein:
the first semiconductor die includes a first set of bond pads;
the second semiconductor die includes a second set of bond pads bonded to the first set of bond pads to directly bond the second semiconductor die to the first semiconductor die,
the first plurality of pathways include the first set of bond pads; and
the one or more control circuits are configured to transfer the encoded and shaped data to the first semiconductor die for programming into the set of non-volatile memory cells on the first semiconductor die through pathway pairs of the first plurality of pathways and the second plurality of pathways via the first set of bond pads and the second set of bond pads such that each bit of the encoded and shaped data is transferred via a different bond pad of the second set of bond pads.

* * * * *